(12) United States Patent
Kim et al.

(10) Patent No.: US 10,642,391 B2
(45) Date of Patent: *May 5, 2020

(54) TOUCH PANEL AND DISPLAY DEVICE

(71) Applicant: LG ELECTRONICS INC., Seoul (KR)

(72) Inventors: Minchul Kim, Seoul (KR); Yangwook Hur, Seoul (KR); Junghoon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 29 days.

This patent is subject to a terminal disclaimer.

(21) Appl. No.: 15/737,727

(22) PCT Filed: Jun. 16, 2016

(86) PCT No.: PCT/KR2016/006385
§ 371 (c)(1),
(2) Date: Dec. 18, 2017

(87) PCT Pub. No.: WO2016/204525
PCT Pub. Date: Dec. 22, 2016

(65) Prior Publication Data
US 2018/0196561 A1    Jul. 12, 2018

(30) Foreign Application Priority Data

Jun. 19, 2015  (KR) .................. 10-2015-0087752
Nov. 5, 2015   (KR) .................. 10-2015-0155266

(51) Int. Cl.
*G06F 3/041*    (2006.01)
*G06F 3/044*    (2006.01)
(Continued)

(52) U.S. Cl.
CPC ............ *G06F 3/0412* (2013.01); *G06F 3/044* (2013.01); *G02F 1/13338* (2013.01);
(Continued)

(58) Field of Classification Search
CPC ........ G06F 3/0412; G06F 3/044; G06F 3/045; G06F 3/0418; G06F 1/1626
(Continued)

(56) References Cited

U.S. PATENT DOCUMENTS 4,208,648 A *  6/1980  Naumann ............... B23Q 41/02
                                                  178/18.01
5,799,533 A *  9/1998  Seki ..................... A61B 5/1036
                                                       338/99
(Continued)

FOREIGN PATENT DOCUMENTS

KR      101372534       3/2014
KR      20140082367     7/2014
(Continued)

OTHER PUBLICATIONS

PCT International Application No. PCT/KR2016/006385, International Search Report dated Sep. 30, 2016, 3 pages.

*Primary Examiner* — Fred Tzeng
(74) *Attorney, Agent, or Firm* — Lee, Hong, Degerman, Kang & Waimey

(57) ABSTRACT

A touch panel and a display device are disclosed. The touch panel includes a base layer, a first electrode formed on a surface of the base layer and including a first sensor unit including a first conductor, and a second electrode formed on another surface of the base layer and including a second sensor unit including a second conductor. A shape of the first conductor is different from a shape of the second conductor.

23 Claims, 38 Drawing Sheets

(51) Int. Cl.
*G02F 1/1333* (2006.01)
*H01L 27/32* (2006.01)

(52) U.S. Cl.
CPC ............. *G06F 2203/04103* (2013.01); *G06F 2203/04112* (2013.01); *H01L 27/323* (2013.01)

(58) Field of Classification Search
USPC ........................................................ 345/173
See application file for complete search history.

(56) References Cited

U.S. PATENT DOCUMENTS

| | | | | |
|---|---|---|---|---|
| 6,157,072 | A * | 12/2000 | Nakayama | H01L 27/14601 257/443 |
| 6,452,479 | B1 * | 9/2002 | Sandbach | G06F 3/045 338/101 |
| 6,964,205 | B2 * | 11/2005 | Papakostas | G01L 1/20 73/862.046 |
| 7,926,366 | B2 * | 4/2011 | Yang | G01D 5/25 29/595 |
| 9,600,096 | B2 * | 3/2017 | Katsurahira | G06F 3/0418 |
| 9,784,626 | B2 * | 10/2017 | Chen | G01L 17/005 |
| 2006/0048572 | A1 * | 3/2006 | Isogai | G01N 27/223 73/335.04 |
| 2007/0132724 | A1 * | 6/2007 | Muranaka | G06F 1/1626 345/156 |
| 2014/0028340 | A1 * | 1/2014 | Graf | B81C 1/00333 324/756.01 |
| 2015/0317009 | A1 * | 11/2015 | Hara | G01D 9/10 345/173 |

FOREIGN PATENT DOCUMENTS

| | | |
|---|---|---|
| KR | 20140092683 | 7/2014 |
| KR | 101517458 | 5/2015 |
| WO | 2013137562 | 2/2013 |

* cited by examiner

FIG. 26
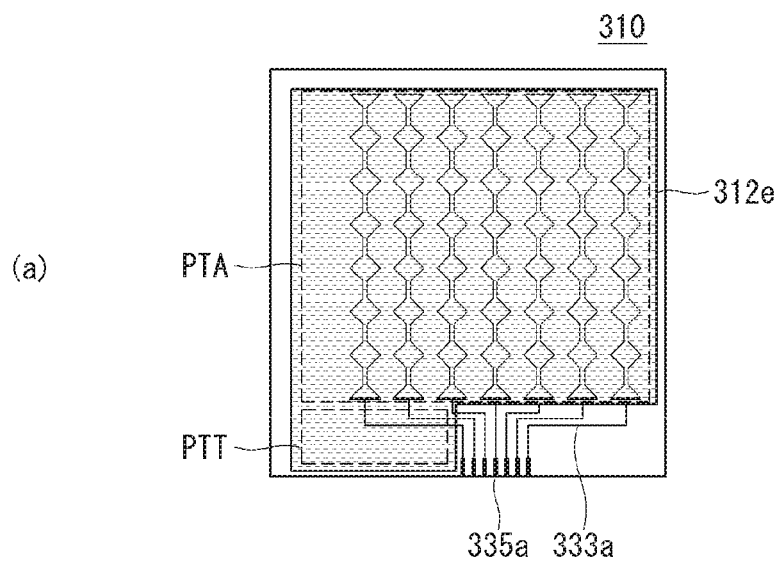
(a)
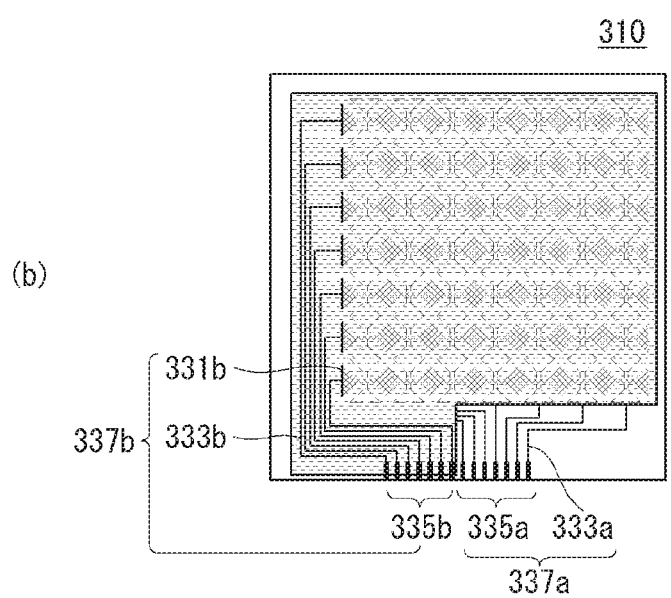
(b)

FIG. 30
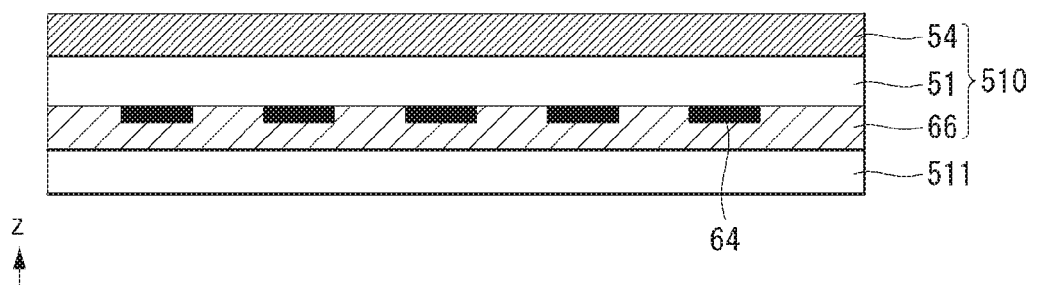
(a)
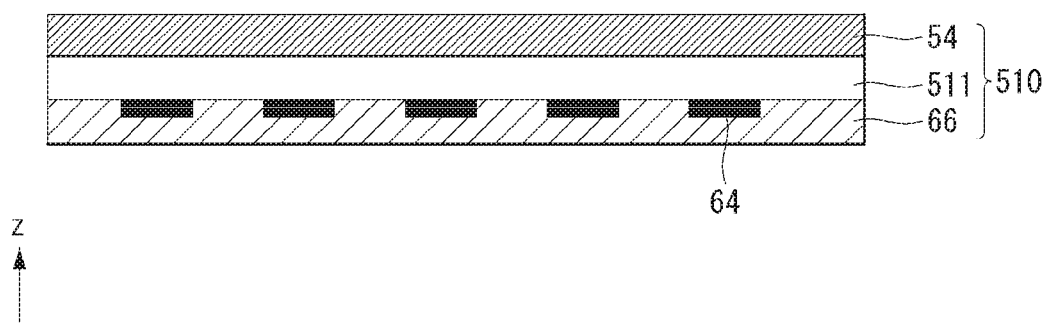
(b)

(a1)　　　　(b1)

(a2)　　　　(b2)

FIG. 33
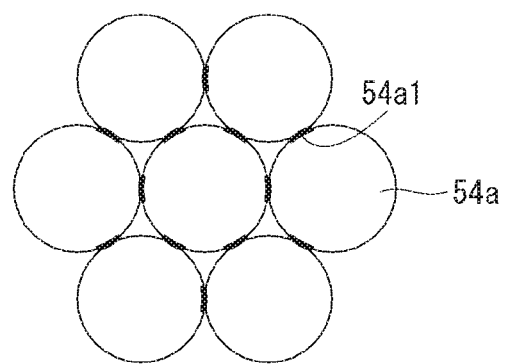
FIG. 34
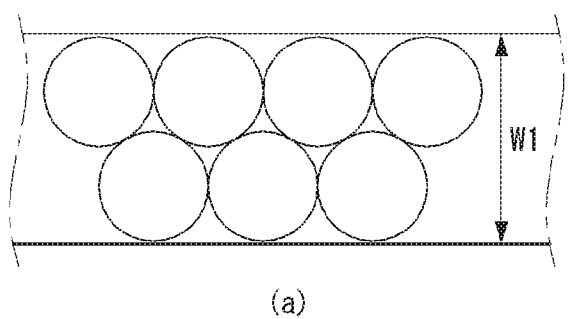
(a)
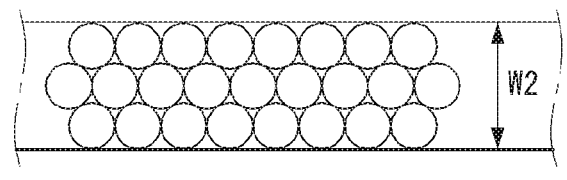
(b)

FIG. 35
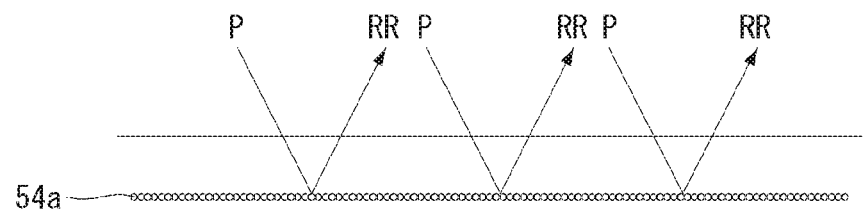
(a)
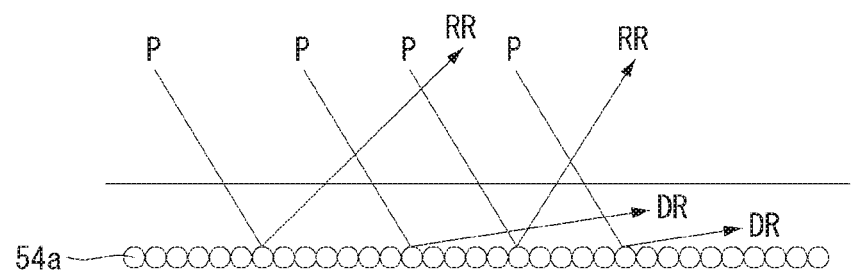
(b)
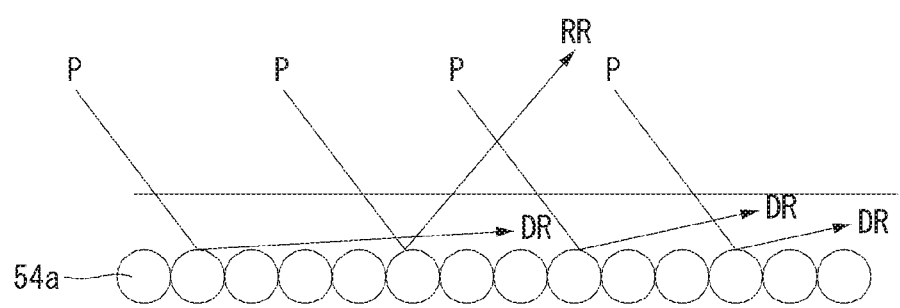
(c)

FIG. 37
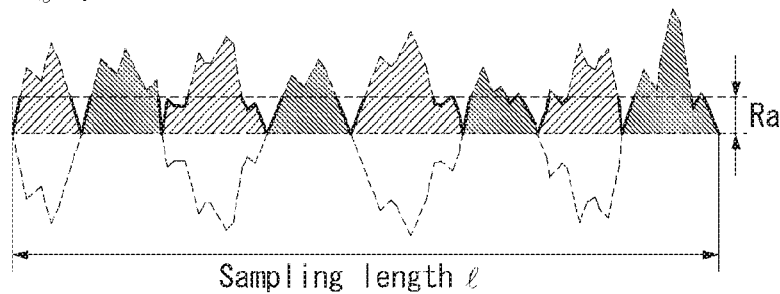
(a)
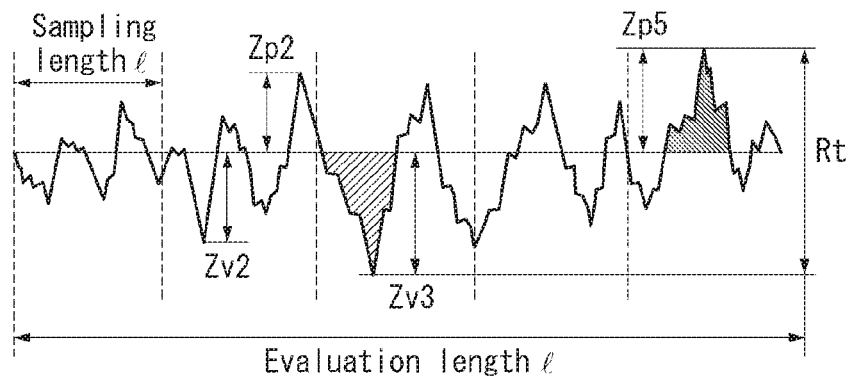
(b)

FIG. 38
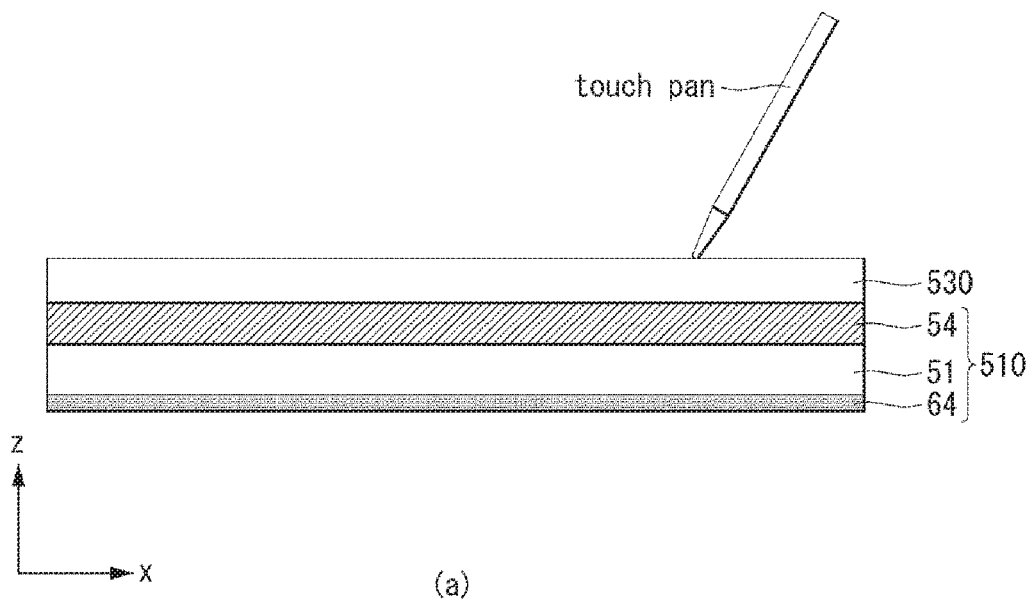
(a)
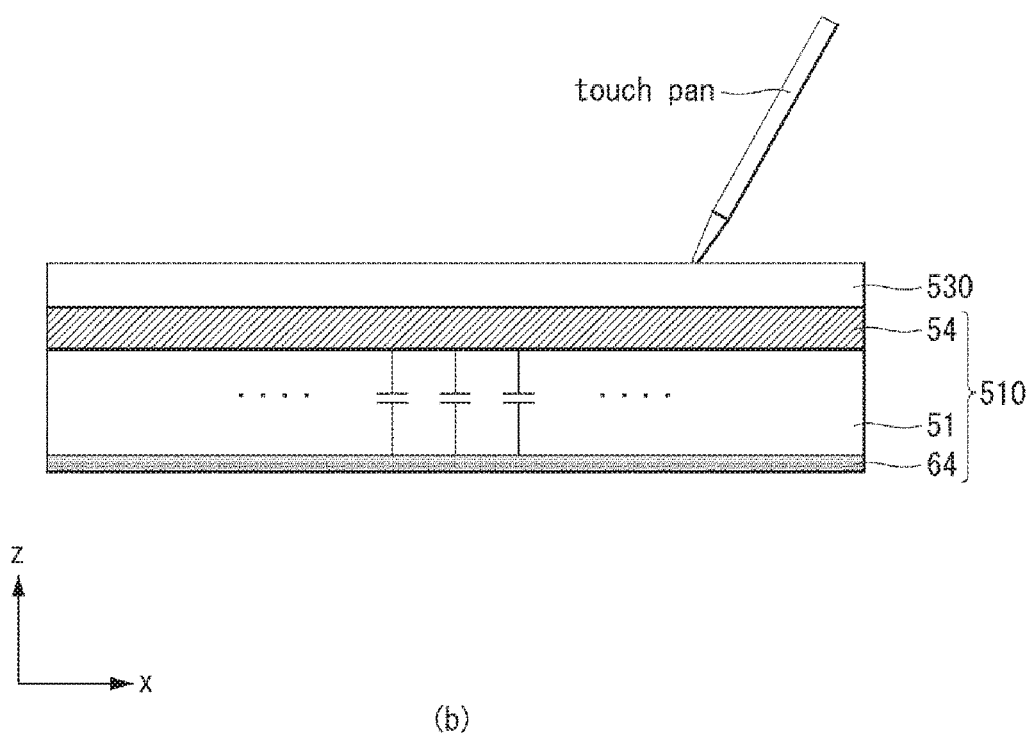
(b)

TOUCH PANEL AND DISPLAY DEVICE

CROSS-REFERENCE TO RELATED APPLICATIONS

This application is the National Stage filing under 35 U.S.C. 371 of International Application No. PCT/KR2016/006385, filed on Jun. 16, 2016, which claims the benefit of earlier filing date and right of priority to Korean Application Nos. 10-2015-0087752, filed on Jun. 19, 2015, and 10-2015-0155266, filed on Nov. 5, 2015, the contents of which are all hereby incorporated by reference herein in their entirety.

TECHNICAL FIELD

The present disclosure relates to a touch panel and a display device, and more particularly to a touch panel having an improved structure and a display device.

BACKGROUND ART

A touch panel has been recently applied to various electronic devices such as a display device for convenience of users. The touch panel may include a first conductive film including a first electrode for touch sensing, a second conductive film including a second electrode for touch sensing, a cover glass substrate positioned at an uppermost layer on front surfaces of the first and second conductive films and forming an external surface, and an adhesive layer for attaching them.

When the first conductive film including the first electrode and the second conductive film including the second electrode are separately formed at the touch panel, the touch panel may have a complicated laminated structure and may become thick and heavy. Moreover, the manufacturing cost of the touch panel may increase, and thus the price competitiveness of the touch panel may deteriorate.

DISCLOSURE

Technical Problem

An object of the present disclosure is to provide a touch panel having a simple structure capable of being manufactured at the low cost and a display device.

Another object of the present disclosure is to provide a touch panel having a simple structure capable of being manufactured more efficiently and a display device.

Technical Solution

In one aspect of the present disclosure, there is provided a touch panel including a base layer, a first electrode formed on a surface of the base layer and including a first sensor unit including a first conductor, and a second electrode formed on another surface of the base layer and including a second sensor unit including a second conductor, wherein a shape of the first conductor is different from a shape of the second conductor.

A resistance of the first sensor unit may be greater than a resistance of the second sensor unit. A first area ratio may be greater than a second area ratio. The first area ratio is a ratio of an area inside an outer edge of the first sensor unit to an area on which the first sensor unit is formed, and the second area ratio is a ratio of an area inside an outer edge of the second sensor unit to an area on which the second sensor unit is formed.

A filling density of the first conductor in the first sensor unit may be smaller than a filling density of the second conductor in the second sensor unit.

The first conductor may include a transparent conductive metal oxide. The transparent conductive metal oxide may include a nano metal and have a plurality of spherical particles or a network structure.

The second conductor may include a transparent conductive metal oxide. The transparent conductive metal oxide may include a nano metal and have a plurality of spherical particles or a network structure.

At least one of the first conductor or the second conductor may have a width of 10 to 35 nm and a length of 20 to 40 μm.

At least one of the first conductor or the second conductor may have a diameter of 100 to 300 nm.

As the diameter of the first conductor or the second conductor decreases, a contact area on which adjacent conductors among a plurality of conductors contact one another may increase. The first conductor or the second conductor has the plurality of conductors.

As the contact area increases, electrical conductivity of the first electrode or the second electrode may increase.

As the contact area increases, linewidth of the first electrode or the second electrode may decrease.

As the linewidth of the first electrode or the linewidth of the second electrode decreases, a thickness of the base layer may increase.

The first sensor unit may be entirely formed inside the outer edge of the first sensor unit. The second sensor unit may include a plurality of electrode parts intersecting each other, and at least one opening may be formed inside the outer edge of the second sensor unit.

An intersection between the plurality of electrode parts of the second sensor unit may be 1 to 100,000 number/mm².

A thickness of the first sensor unit may be 200 nm or less, and a thickness of the second sensor unit may be 0.5 to 2 μm.

A surface roughness of the first sensor unit may be less than a surface roughness of the second sensor unit.

A specular reflectance of the first sensor unit may be less than a specular reflectance of the second sensor unit.

A transmittance of the first sensor unit may be 88 to 92%, and a transmittance of the second sensor unit may be 87 to 91%.

The touch panel may further include an overcoat layer covering the first electrode and an insulating layer covering the second electrode. A dielectric constant of the insulating layer may be less than a dielectric constant of the overcoat layer.

The touch panel may further include a plurality of traces connected to the first electrode and the second electrode, the plurality of traces providing a signal transmission path. One of the first electrode or the second electrode and the plurality of traces may be formed through a process. One of the first electrode or the second electrode may include the same materials as at least one of the plurality of traces.

The one of the first electrode or the second electrode formed through the process may be formed in a mesh shape.

The plurality of traces may include a nano metal. The transparent conductive metal oxide may include a nano metal and have a plurality of spherical particles or a network structure.

As a diameter of the spherical particle decreases, a contact area on which adjacent spherical particles contact one another may increase.

As the contact area increases, a linewidth of the plurality of traces may decrease.

In another aspect of the present disclosure, there is provided a display device including a display panel and a touch panel integrated with the display panel, wherein the touch panel includes a base film, a first electrode formed on a surface of the base film, the first electrode including a first sensor unit, wherein the first sensor unit includes a first conductor, and a second electrode formed on another surface of the base film, the second electrode including a second sensor unit, wherein the second sensor unit includes a second conductor different from the first conductor, wherein at least one of the first or second sensor units has an irregular pattern.

The touch panel may be positioned in front of the display panel or inside the display panel.

A resistance of the first sensor unit may be greater than a resistance of the second sensor unit. A first area ratio may be greater than a second area ratio. The first area ratio is a ratio of an area inside an outer edge of the first sensor unit to an area on which the first sensor is formed, and the second area ratio is a ratio of an area inside an outer edge of the second sensor unit to an area on which the second sensor is formed.

The display device may further include a plurality of traces connected to the first electrode and the second electrode, the plurality of traces providing a signal transmission path. One of the first electrode or the second electrode and the plurality of traces may be formed through a process.

Advantageous Effects

Embodiments of the disclosure form a first electrode including a first sensor unit on one surface of a base film and form a second electrode including a second sensor unit on the other surface of the base film, and thus can reduce the number of base films or the number of conductive films and remove an adhesive layer for attaching the base films or the conductive films.

Hence, embodiments of the disclosure can minimize a thickness of a touch panel, reduce the manufacturing cost of the touch panel, and simplify the manufacturing process of the touch panel. In this instance, the first sensor unit and the second sensor unit have different structures, different shapes, and the like, thereby preventing problems caused when the first and second sensor units have the same structure, the same shape, and the like, and improving characteristics of the touch panel.

Embodiments of the disclosure can manufacture more efficiently the touch panel.

The touch panel according to embodiments of the disclosure includes the first sensor unit which includes a first conductor of nanomaterials having silver nano-spherical particles, and thus can transmit light and have a low resistance and excellent electrical characteristics.

The first sensor unit of the touch panel according to embodiments of the disclosure includes silver nano-spherical particles of nanomaterials and thus can decrease a silver content of a photosensitive silver paste. Hence, the first sensor unit can increase a binder content of the photosensitive silver paste by a decrease in the silver content and have flexible characteristics. Embodiments of the disclosure can easily apply the first sensor unit having the flexible characteristics to flexible display devices and stably supply and demand materials.

In the touch panel according to embodiments of the disclosure, the first and second electrodes can be formed in an irregular shape such as a triangle, a rectangle, a parallelogram, and a pentagon. The first and second electrodes have the irregular shape as described above, and thus can previously prevent moiré phenomenon generated when a regular shape is repeated.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

Figure 5:
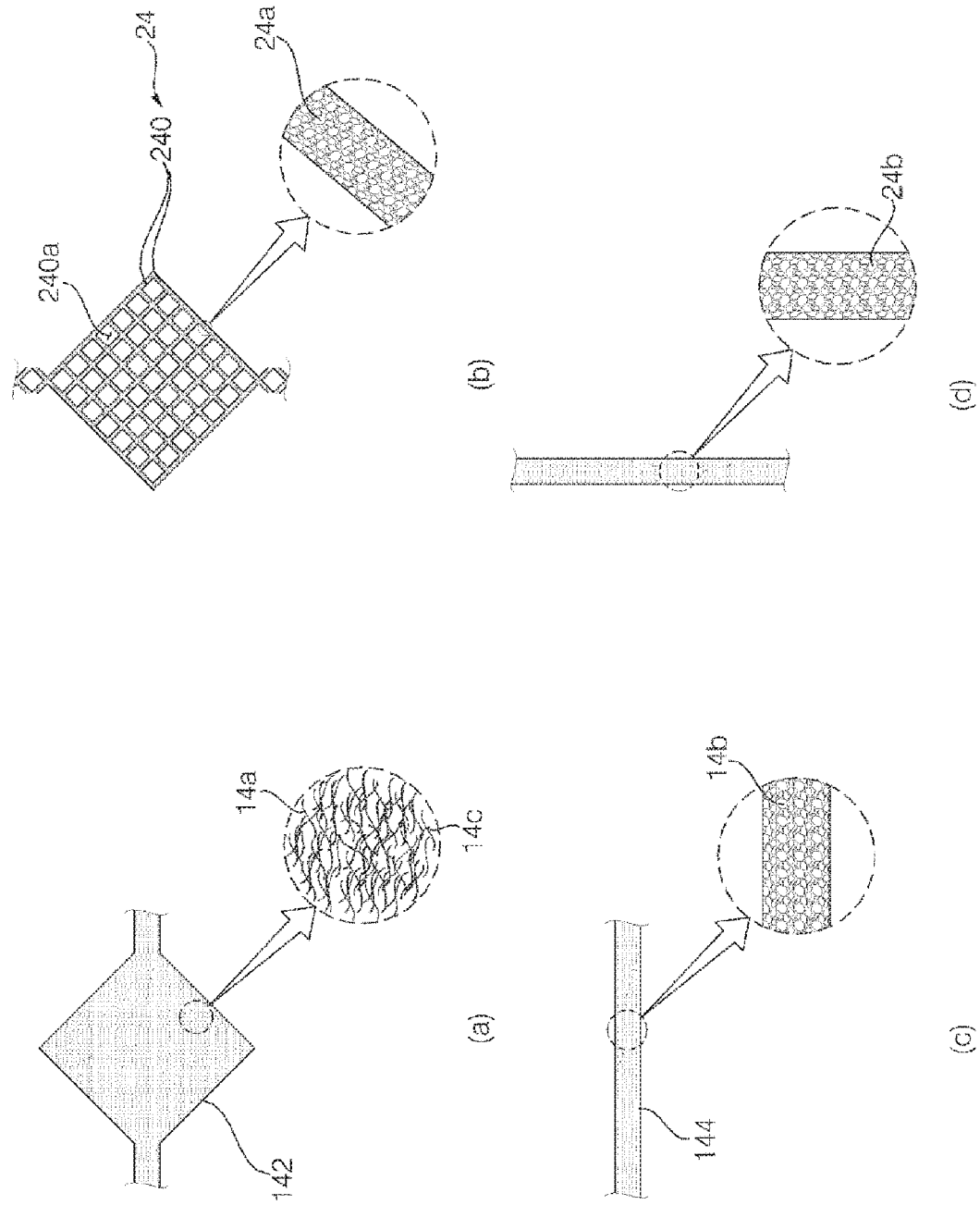

(a) to (d) of FIG. 5 schematically illustrate a first sensor unit, a second sensor unit, a first wiring portion, and a second wiring portion according to an embodiment of the disclosure, respectively.

Figure 6:
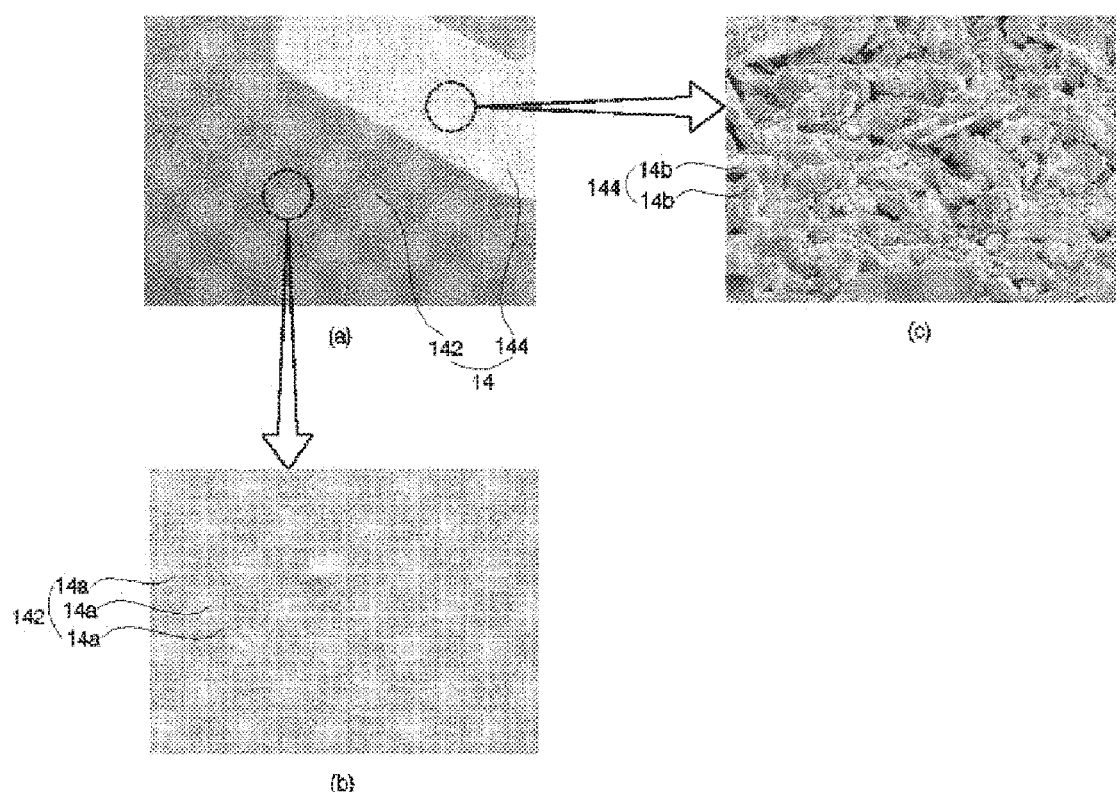

FIG. 6 is a photograph of a portion of a first electrode applicable to an embodiment of the disclosure.

Figure 7:
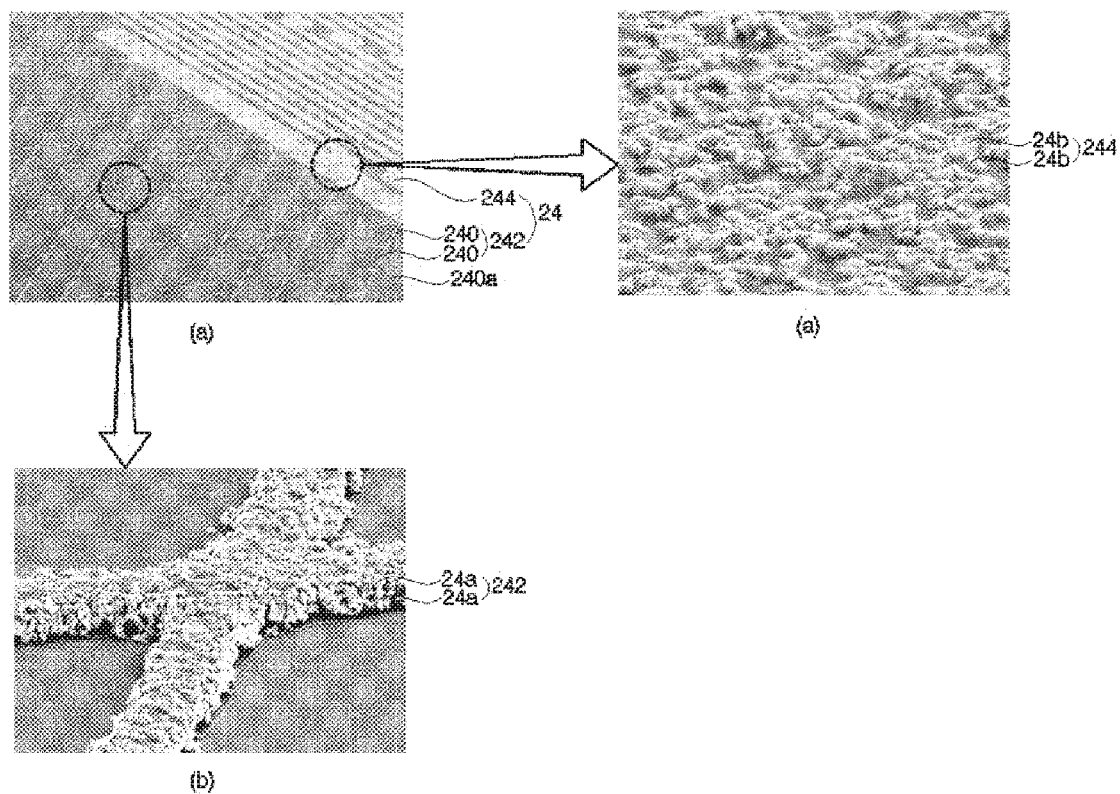

FIG. 7 is a photograph of a portion of a second electrode applicable to an embodiment of the disclosure.

Figure 8:
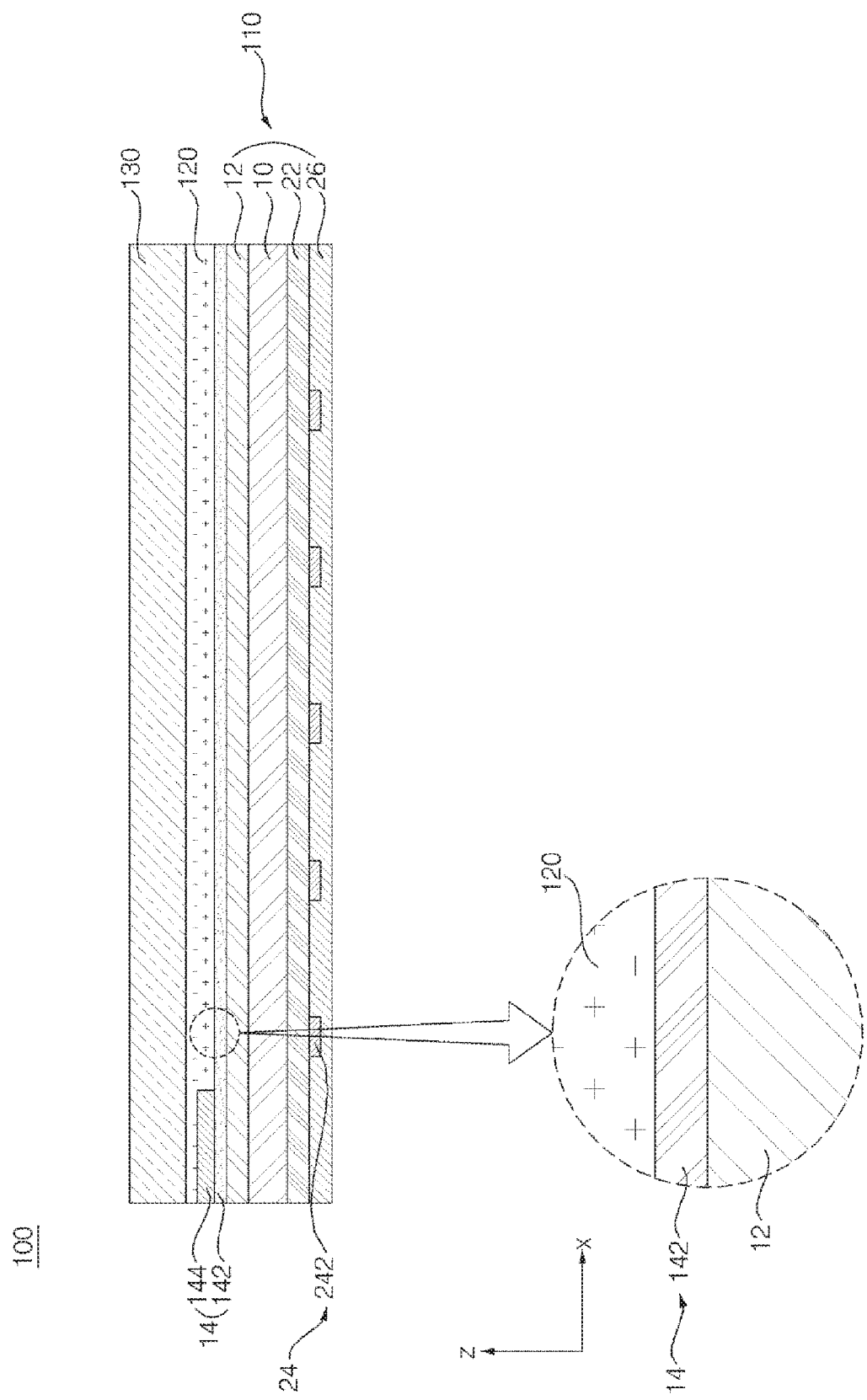

FIG. 8 is a cross-sectional view of a touch panel according to another embodiment of the disclosure.

Figure 9:
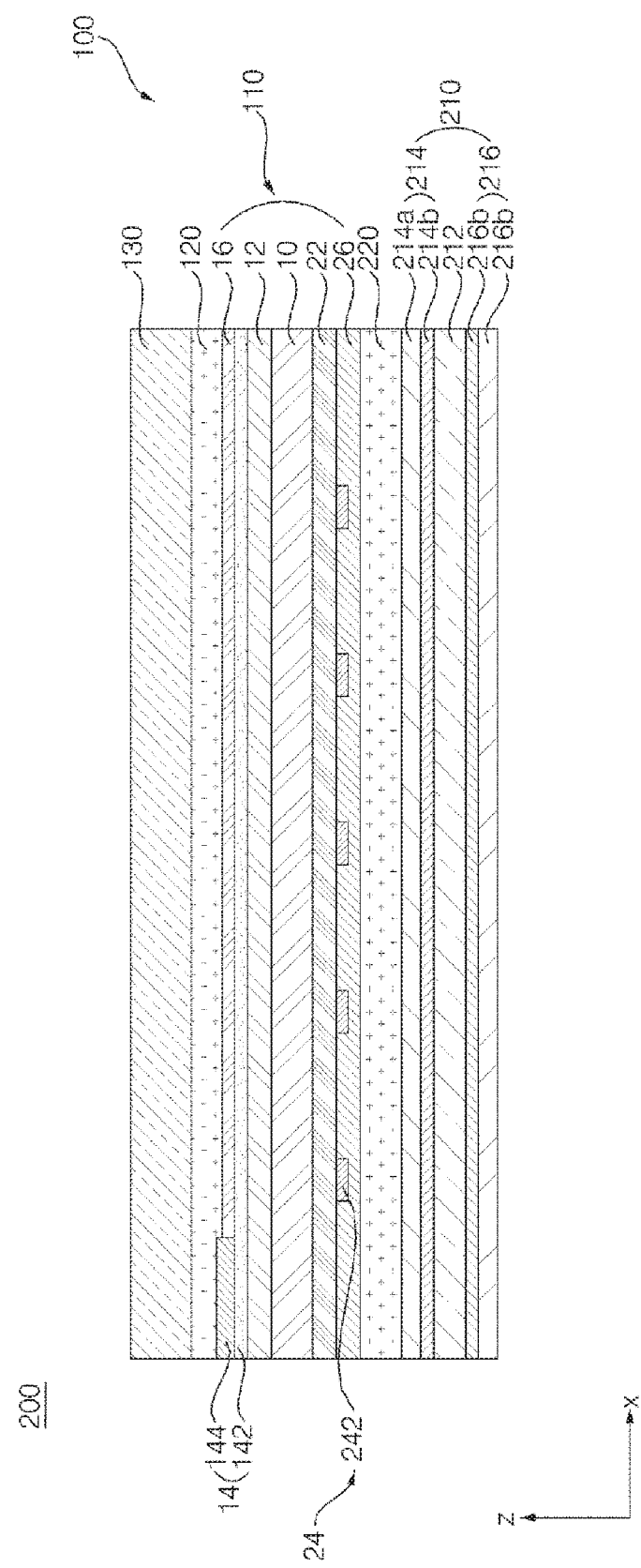

FIG. 9 is a cross-sectional view of a display device according to an embodiment of the disclosure.

Figure 10:
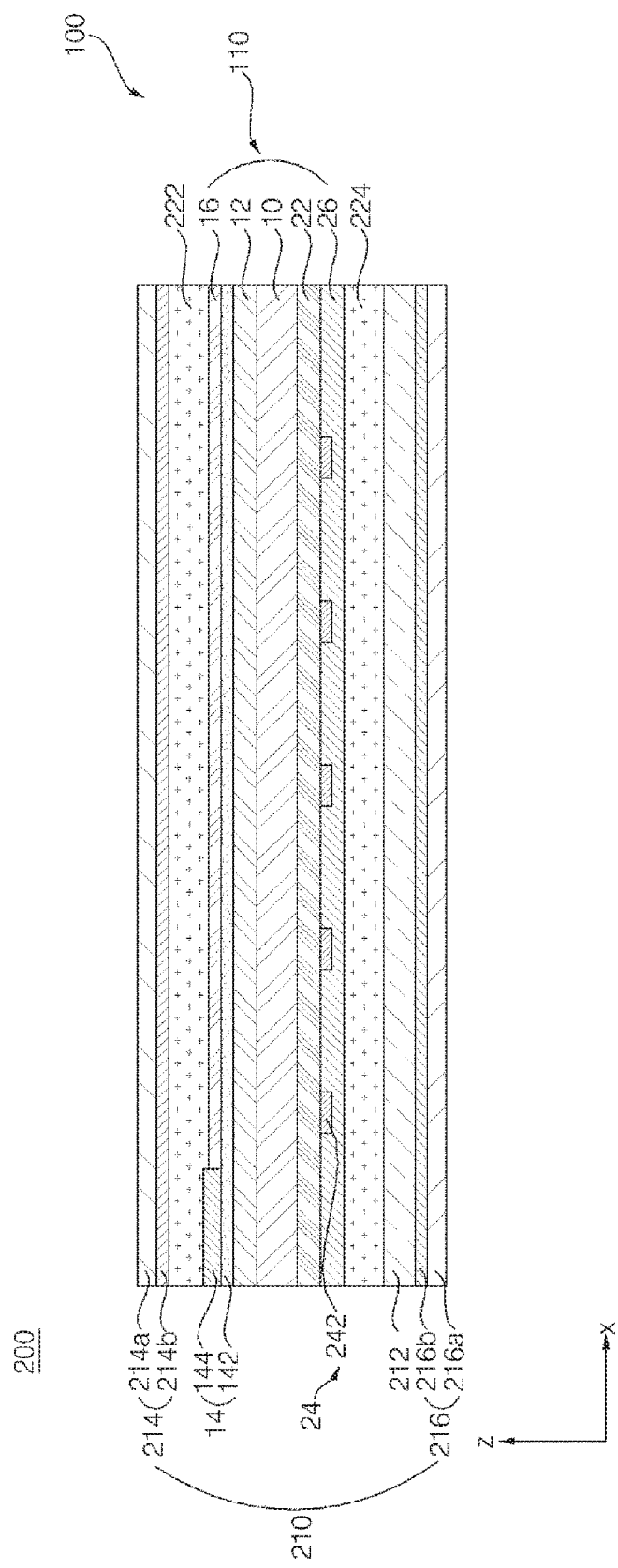

FIG. 10 is a cross-sectional view of a display device according to another embodiment of the disclosure.

Figure 11:
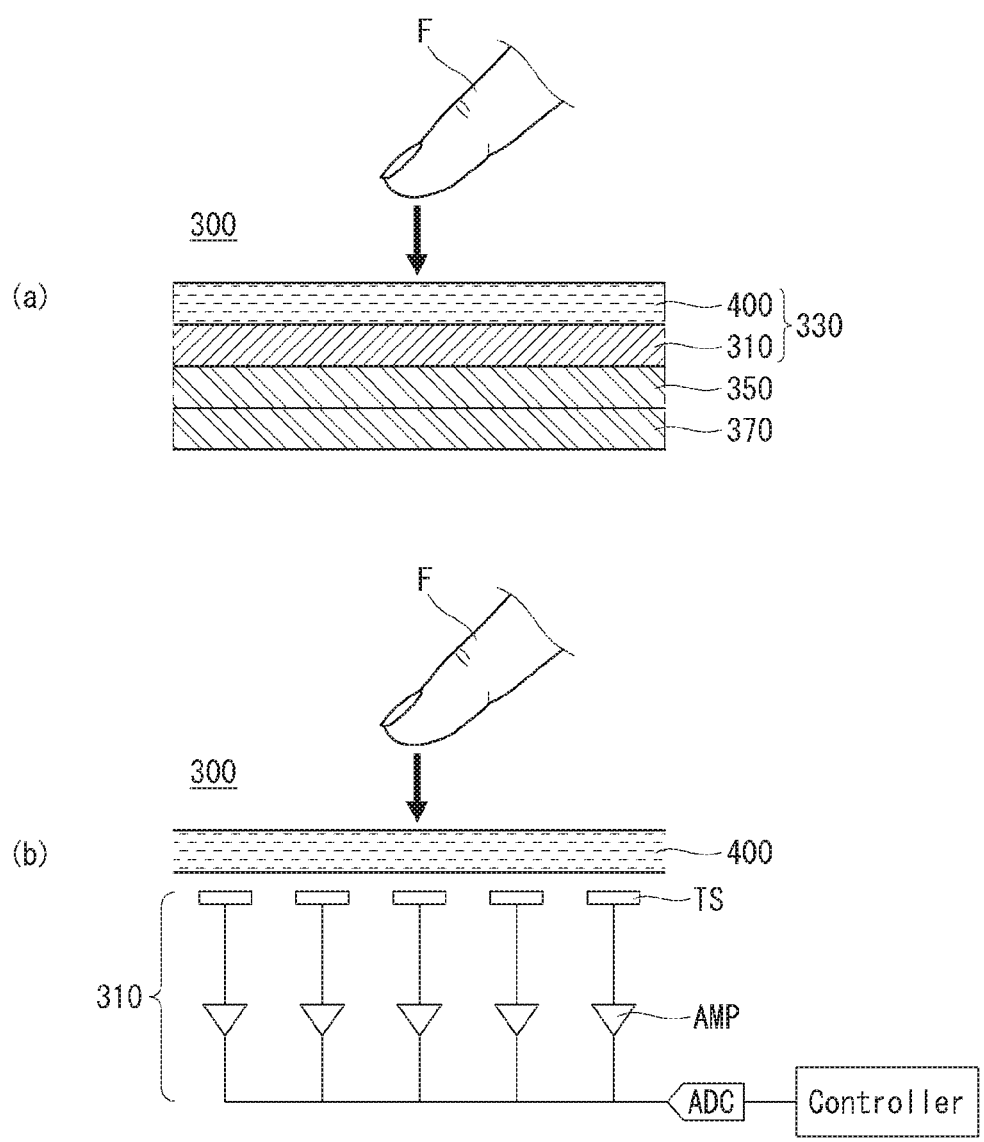

FIG. 11 illustrates a touch sensor according to an embodiment of the disclosure and a display device including the touch sensor.

Figure 12:
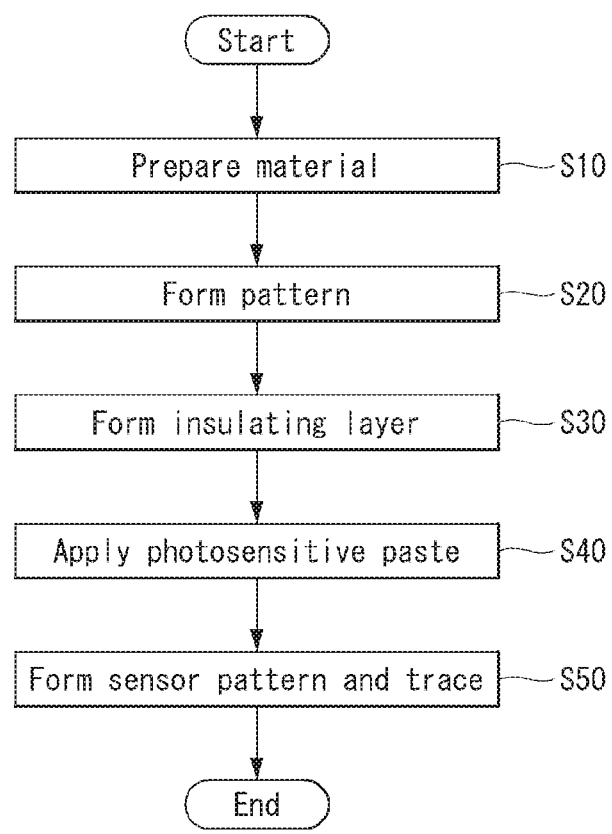

FIG. 12 is a flow chart illustrating a method of manufacturing a touch sensor shown in FIG. 11.

FIGS. 13 to 21 illustrate a method of manufacturing a touch sensor shown in FIG. 12.

Figure 22:
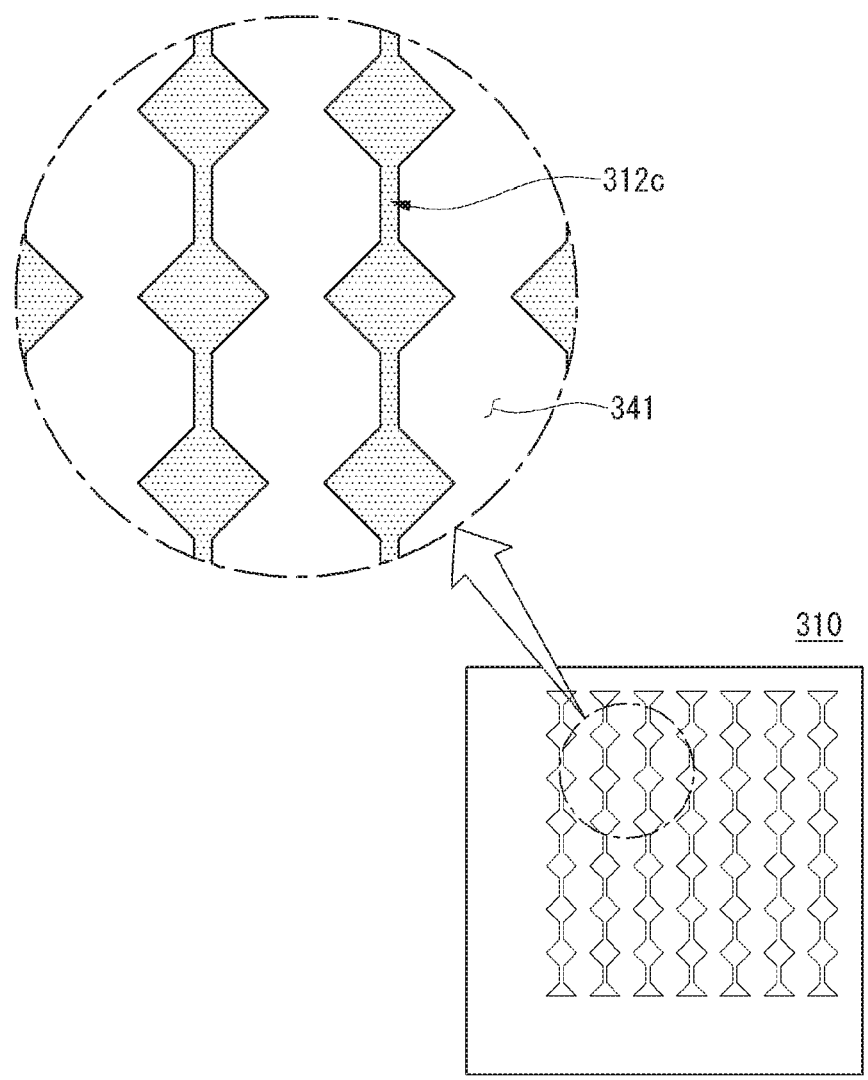
Figure 23:
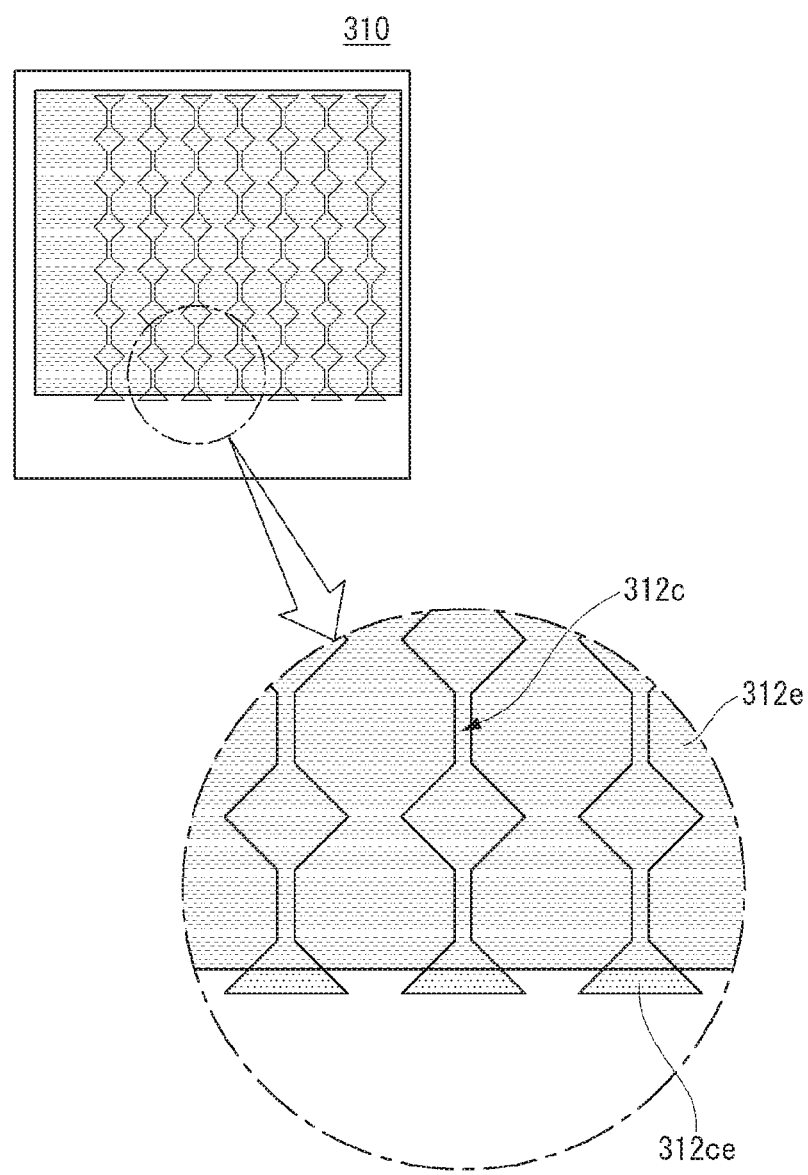
Figure 24:
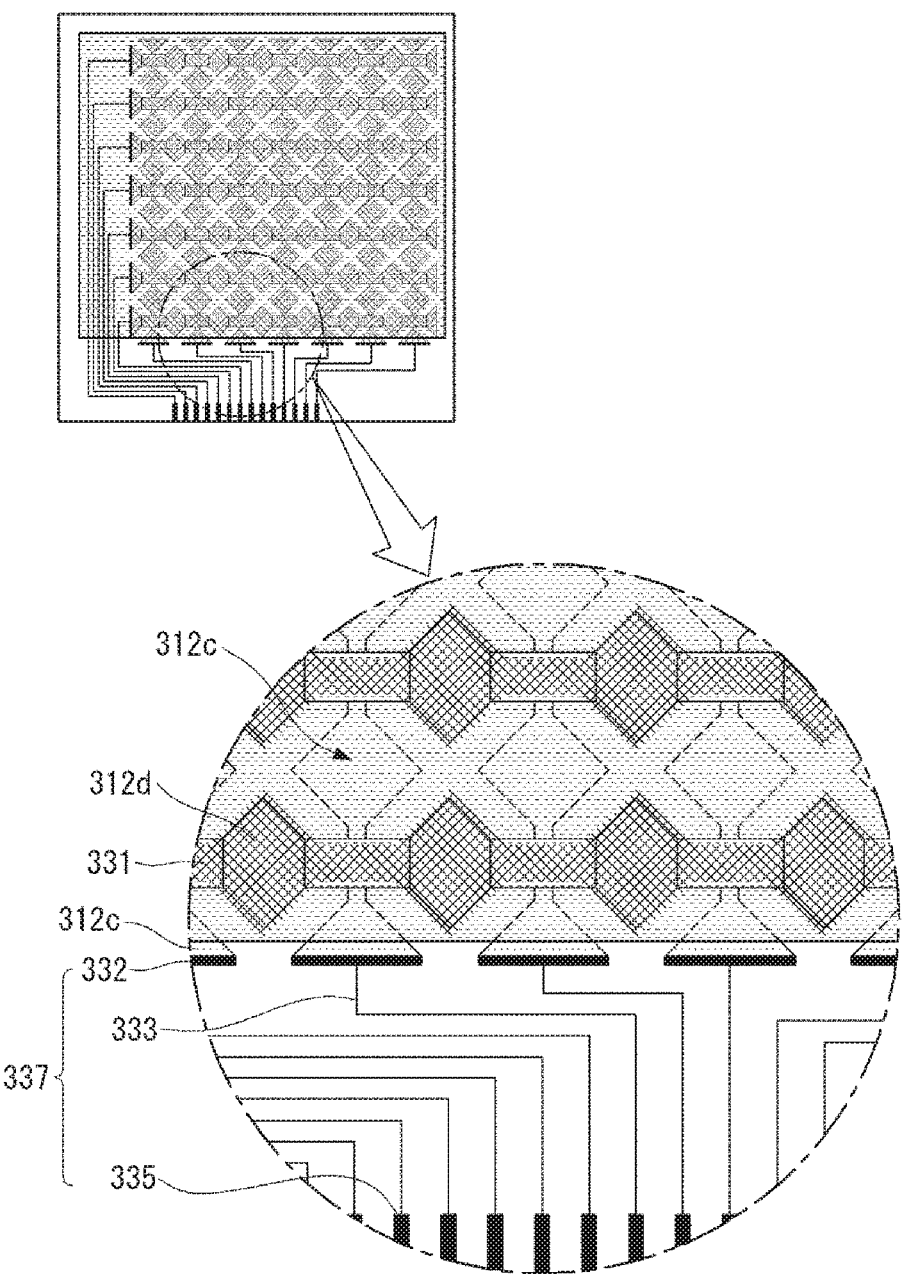

FIGS. 22 to 24 illustrate a method of manufacturing a touch sensor according to another embodiment of the disclosure.

Figure 25:
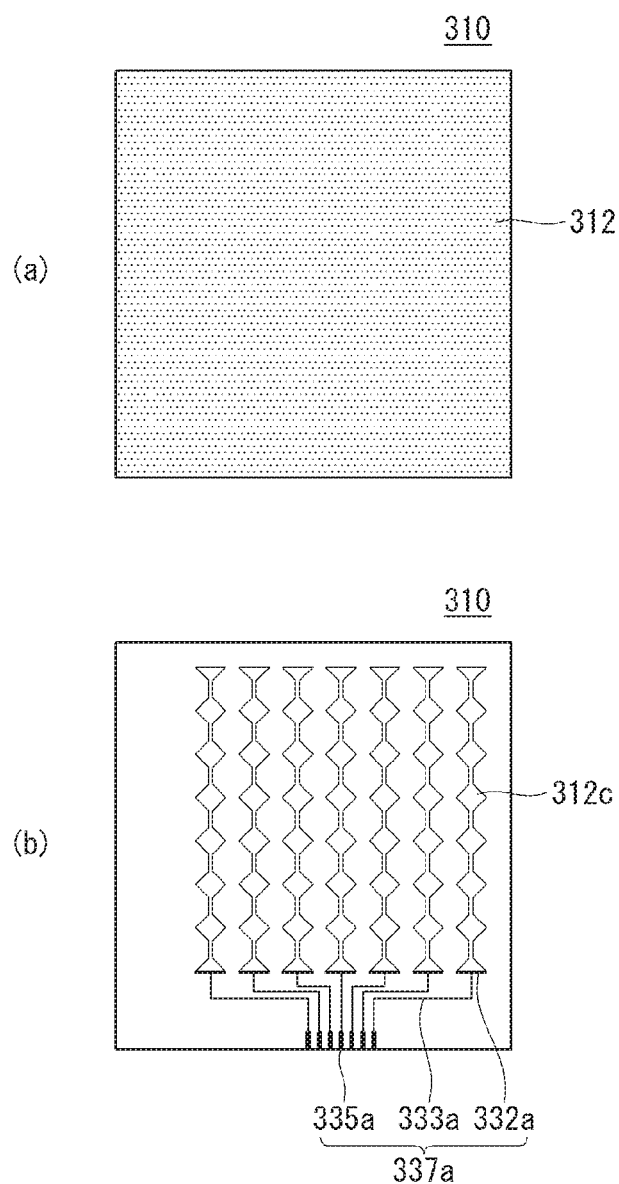

FIGS. 25 and 26 illustrate a method of manufacturing a touch sensor according to yet another embodiment of the disclosure.

Figure 27:
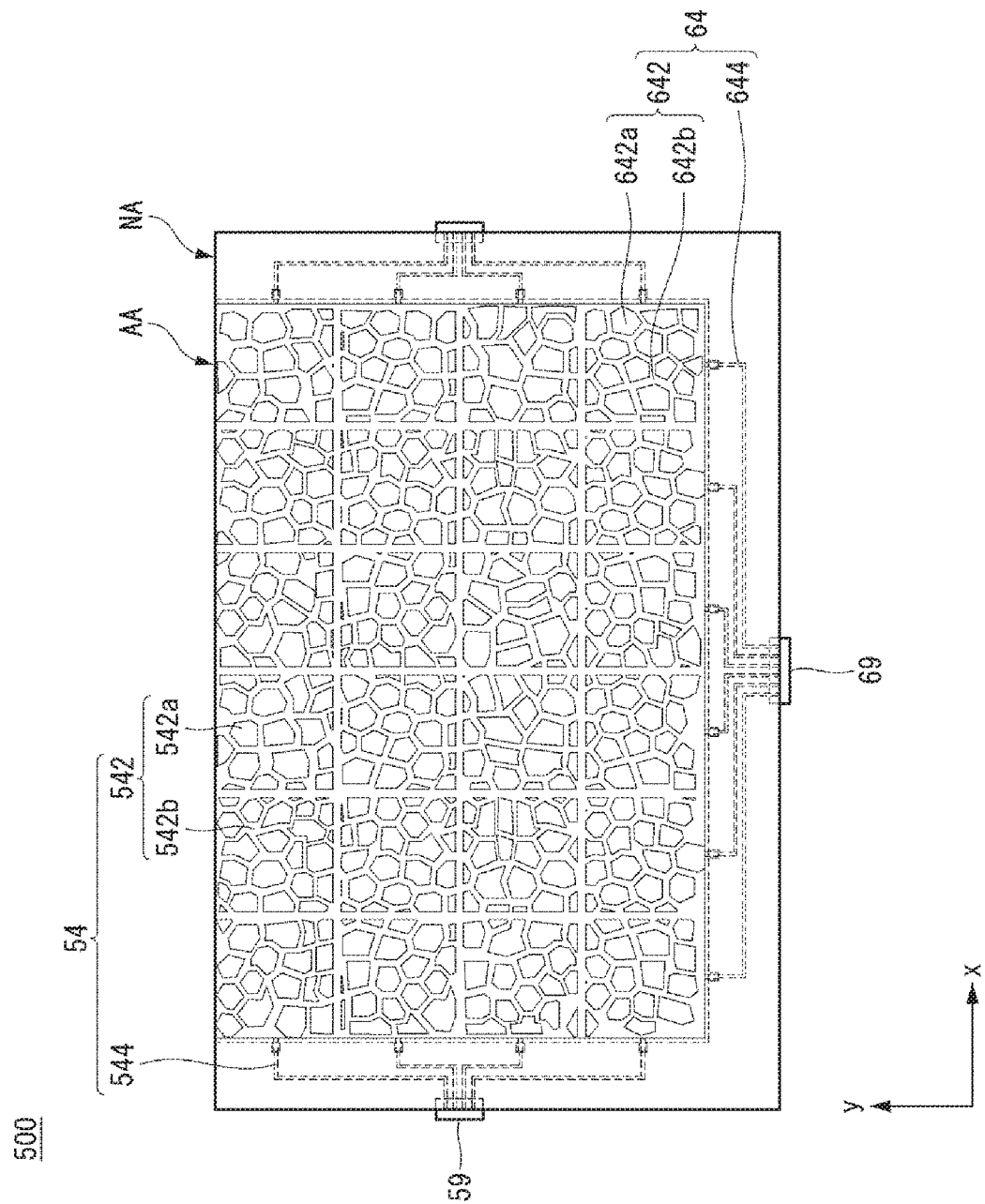

FIG. 27 is a plan view of a touch panel according to another embodiment of the disclosure.

Figure 28:
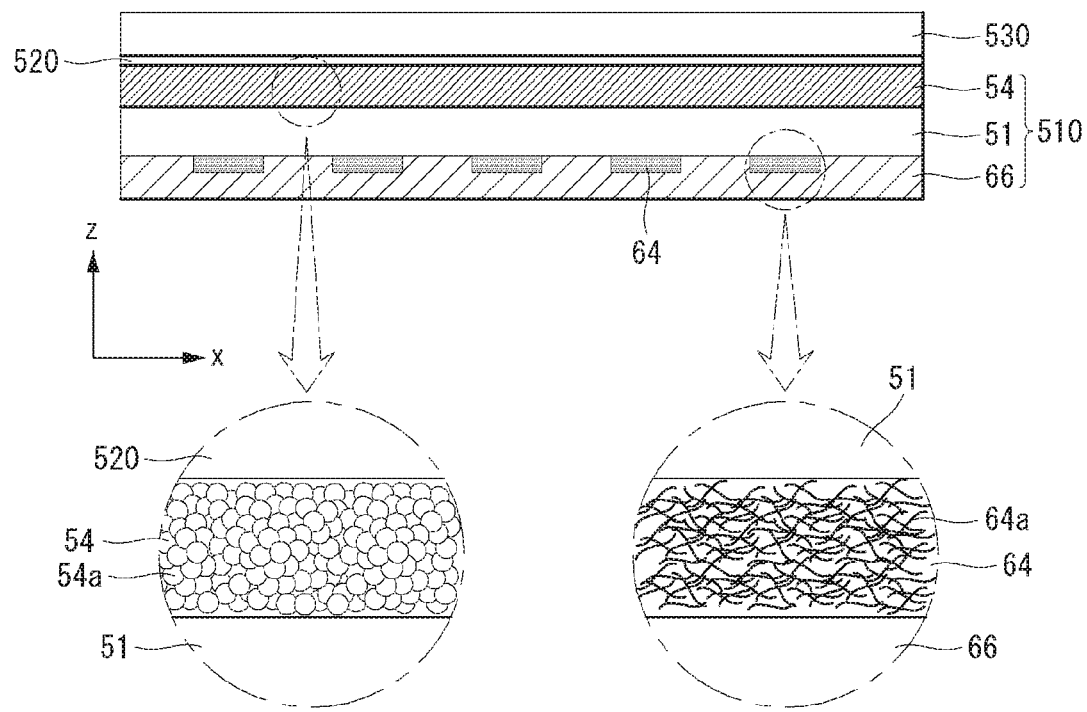

FIG. 28 is a schematic cross-sectional view taken along line I-I of FIG. 27.

Figure 29:
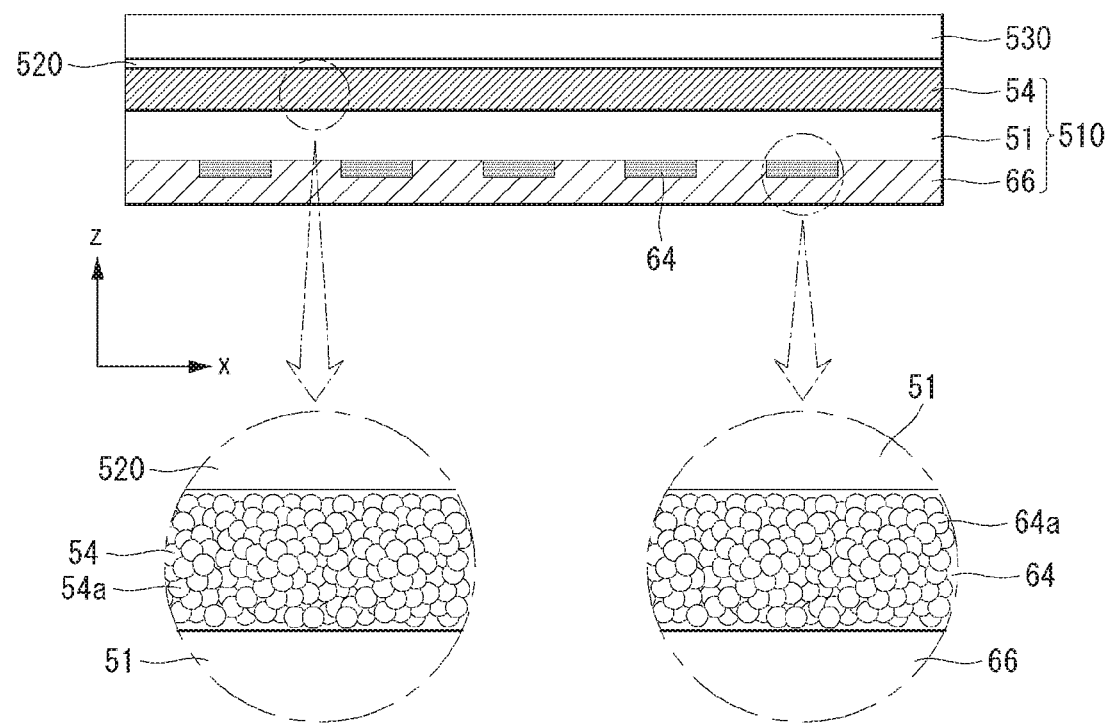

FIG. 29 is another example of a schematic cross-sectional view taken along line I-I of FIG. 27.

FIG. 30 illustrates various examples of a conductive film according to an embodiment of the disclosure.

Figure 31:
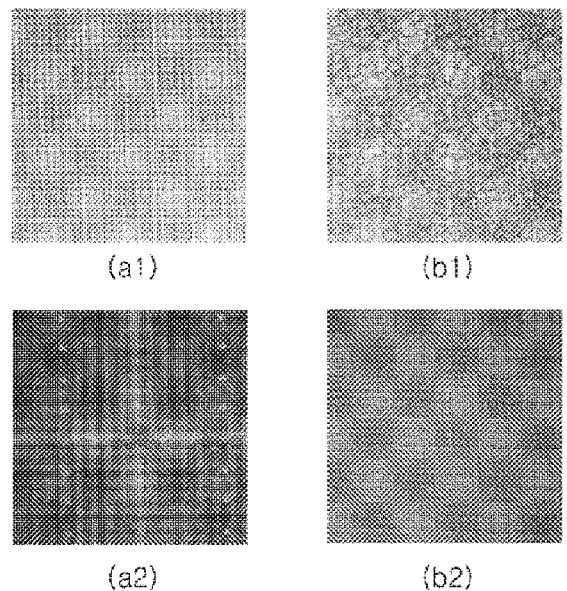

FIG. 31 illustrates a moiré shape varying depending on a shape of a first electrode and a shape of a second electrode in accordance with an embodiment of the disclosure.

Figure 32:
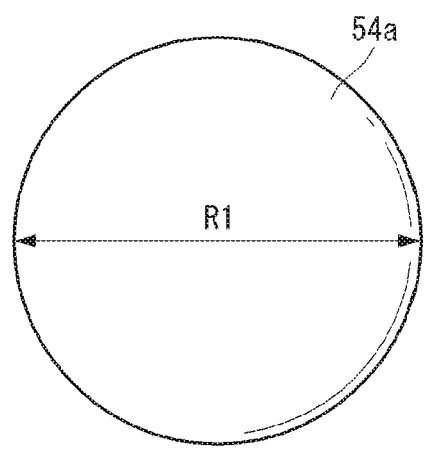

FIG. 32 illustrates a first conductor according to an embodiment of the disclosure.

FIG. 33 illustrates that a plurality of first conductors according to an embodiment of the disclosure contacts one another.

FIG. 34 illustrates a linewidth formed by first conductors according to an embodiment of the disclosure.

FIG. 35 illustrates that light is reflected depending on a particle size of a first conductor according to an embodiment of the disclosure.

Figure 36:
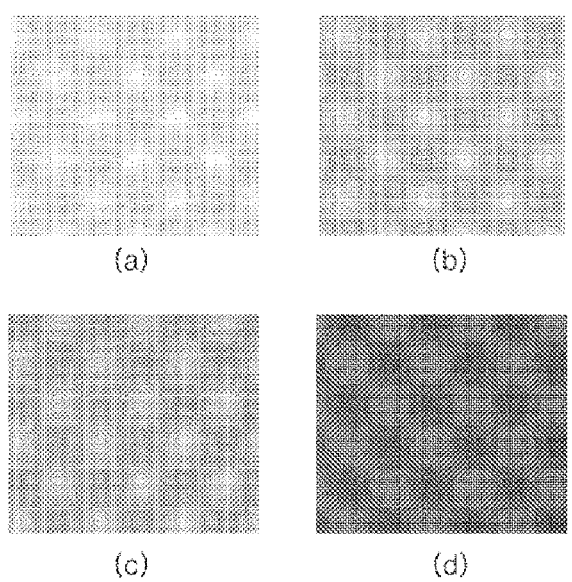

FIG. 36 illustrates a reflectance and a color depending on blackening processing according to an embodiment of the disclosure.

FIG. 37 illustrates a surface roughness after forming an APS pattern in accordance with an embodiment of the disclosure.

FIG. 38 illustrates a base layer according to an embodiment of the disclosure.

Figure 39:
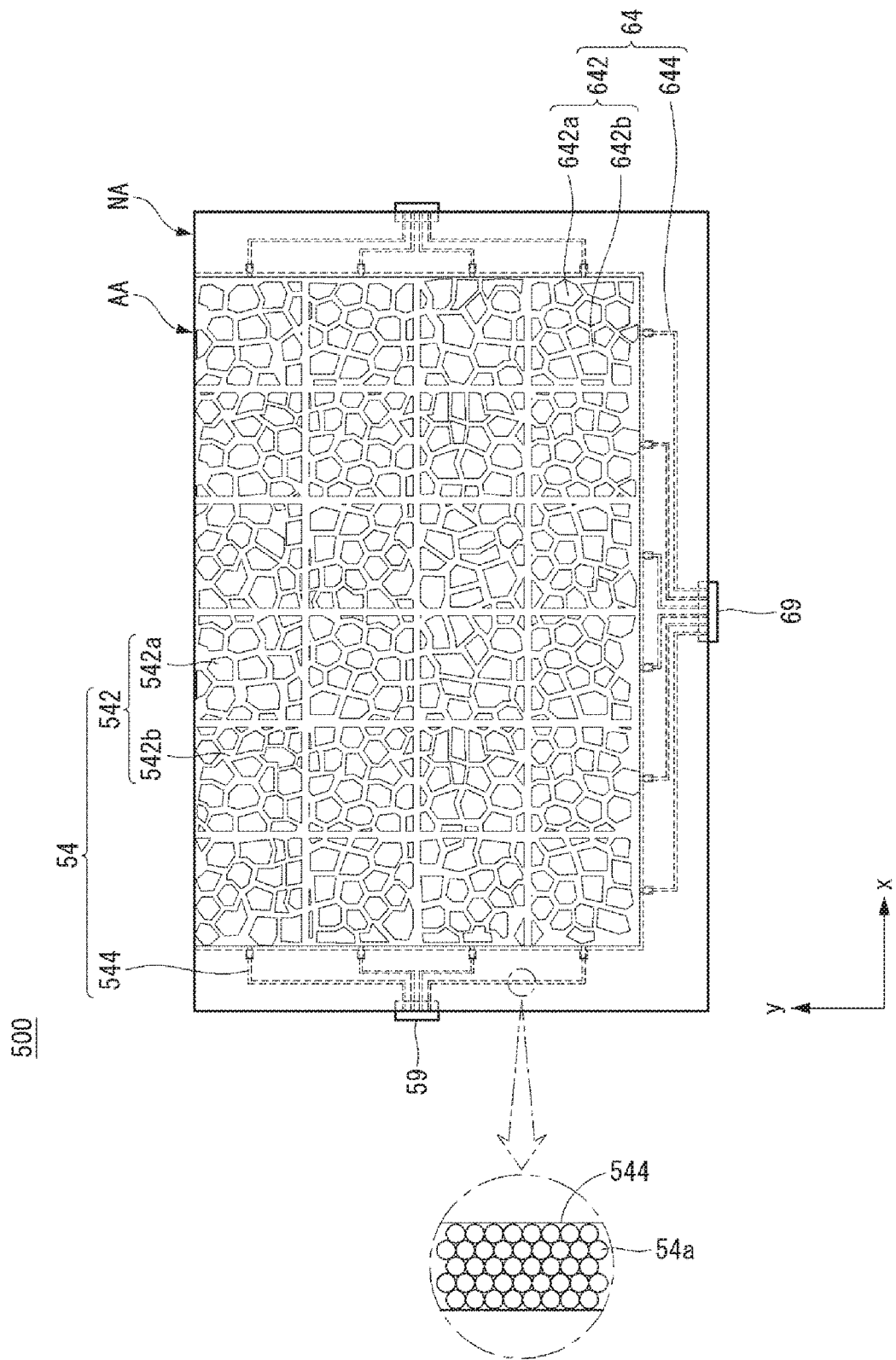

FIG. 39 illustrates a first wiring portion and a second wiring portion according to an embodiment of the disclosure.

Figure 40:
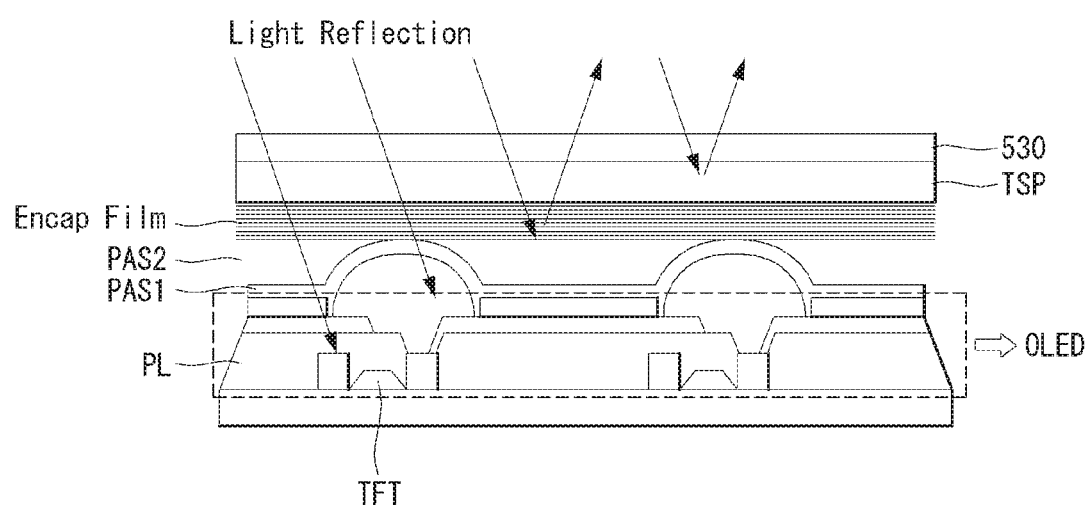

FIG. 40 is a cross-sectional view illustrating configuration of an organic light emitting diode (OLED) display including a touch panel according to an embodiment of the disclosure.

Figure 41:
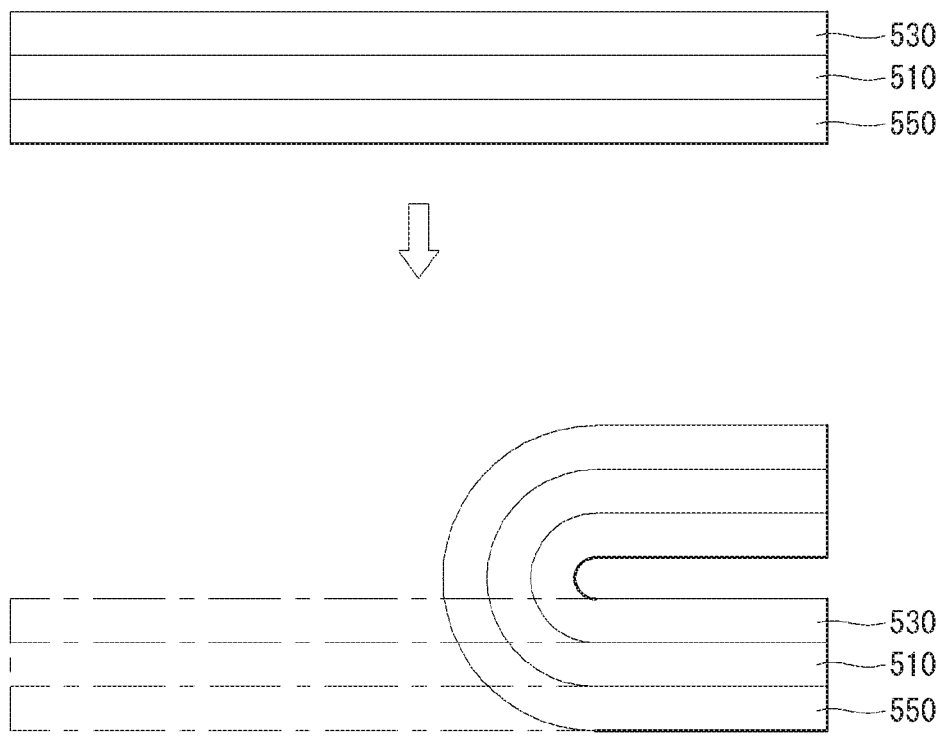

FIG. 41 illustrates an OLED display including a touch panel that flexibly operates in accordance with an embodiment of the disclosure.

MODE FOR INVENTION

Reference will now be made in detail to embodiments of the disclosure, examples of which are illustrated in the accompanying drawings. The present disclosure may, however, be embodied in many different forms and should not be construed as limited to the embodiments set forth herein.

It will be noted that a detailed description of known arts will be omitted if it is determined that the detailed description of the known arts can obscure the embodiments of the disclosure. Wherever possible, the same reference numbers will be used throughout the drawings to refer to the same or like parts. In the drawings, the thickness, width, etc, are enlarged or reduced to make the description more clear. However, the present disclosure is not limited thereto.

Where there is a description that any part includes another part throughout the specification, any part does not exclude another part and may further include another part, unless specifically stated otherwise. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a conductive film for touch panel that is used to form a touch panel of a simple structure and can reduce the manufacturing cost of the touch panel, a touch panel including the conductive film, and a display device including the touch panel will be described in detail with reference to the accompanying drawings.

Figure 1:
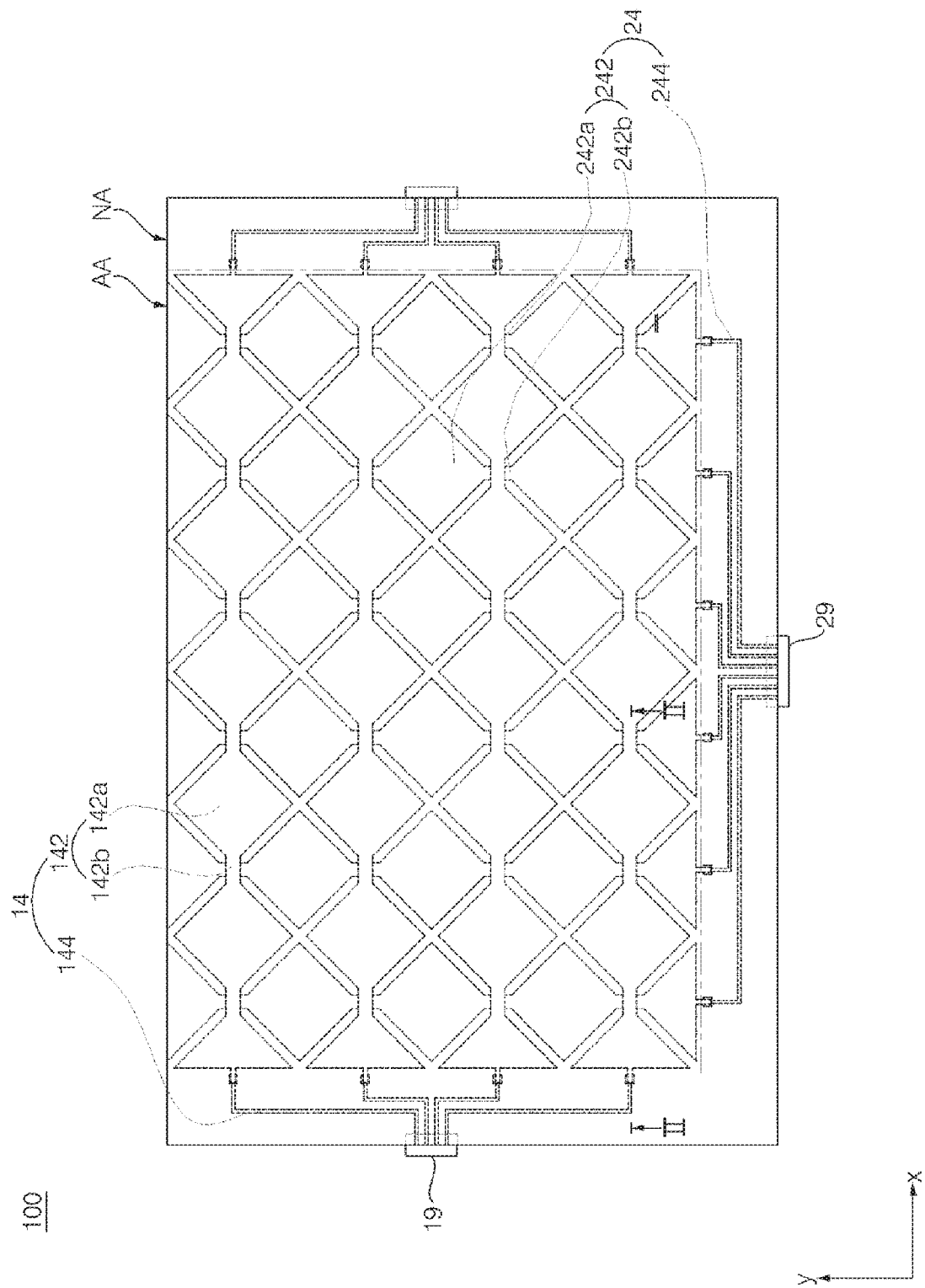
FIG. 1 is a plan view of a touch panel according to an embodiment of the disclosure.
Figure 2:
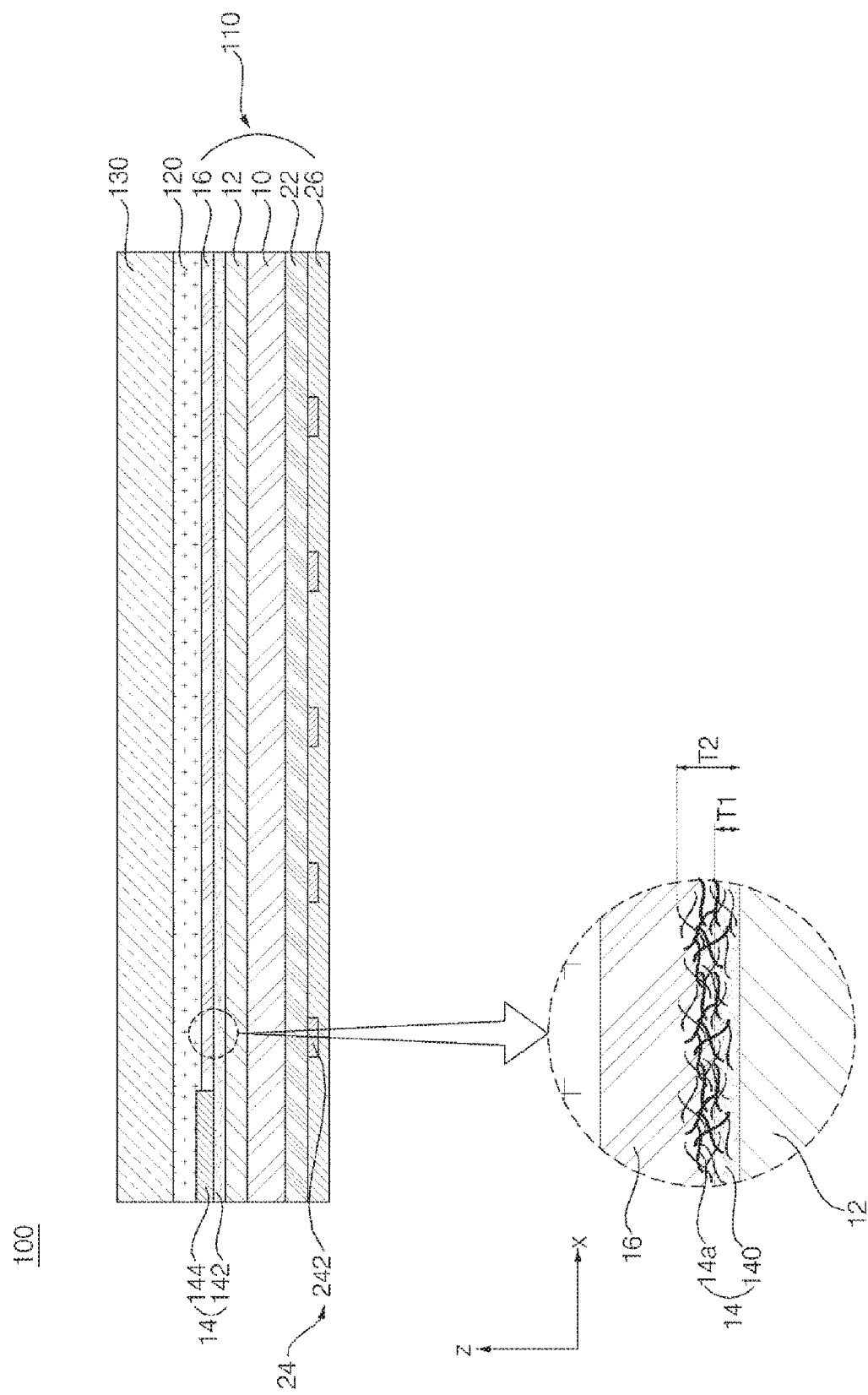
FIG. 2 is a schematic cross-sectional view taken along line II-II of FIG. 1.

FIG. 1 is a plan view of a touch panel according to an embodiment of the disclosure. FIG. 2 is a schematic cross-sectional view taken along line II-II of FIG. 1. For clarity and simplicity, first and second electrodes are mainly shown in FIG. 1.

Referring to FIGS. 1 and 2, a touch panel 100 according to an embodiment of the disclosure may be defined as an effective area AA and a non-effective area NA positioned outside the effective area AA. Sensor units 142 and 242 of first and second electrodes 14 and 24 are positioned in the effective area AA, and the effective area AA is an area where a touch operation of an input device such as a user's hand and a stylus pen is sensed. In the non-effective area NA, flexible printed circuit boards (FPCBs) 19 and 29, wiring portions 144 and 244 of the first and second electrodes 14 and 24 connected to the FPCBs 19 and 29, and the like are positioned. The FPCBs 19 and 29 are connected to an external circuit (for example, a touch control unit (not shown) for controlling the touch panel 100 of a display device), in order to transfer information sensed in the effective area AA. Further, a bezel (not shown) or a black printed layer (not shown), to which various layers, parts, etc. constituting the touch panel 100 are physically fixed and which covers various components positioned in the non-effective area NA, may be positioned in the non-effective area NA. In embodiments of the disclosure, the non-effective area NA is formed to surround the periphery of the effective area AA. However, embodiments are not limited thereto, and the non-effective area NA may be variously changed. For example, the non-effective area NA may be omitted when viewed from the front or the plane.

The touch panel 100 according to the embodiment of the disclosure includes a conductive film 110. The first sensor unit 142 (additionally, the first wiring portion 144) of the first electrode 14 is formed on one surface of the conductive film 110, and the second sensor unit 242 (additionally, the second wiring portion 244) of the second electrode 24 is formed on the other surface of the conductive film 110. In this instance, the embodiment of the disclosure can improve characteristics of the touch panel 100 while simplifying a structure of the touch panel 100 or the conductive film 110 by changing resistances of the first and second sensor units 142 and 242, formation areas of the first and second sensor units 142 and 242, filling densities of conductors 14a and 24a inside the first and second sensor units 142 and 242, and the like. This will be described in detail later. The touch panel 100 may further include a cover substrate 130 and a transparent adhesive layer 120 for attaching the cover substrate 130 to the conductive film 110. However, the cover substrate 130 and the transparent adhesive layer 120 are not necessarily and may be variously changed.

The cover substrate 130 may be made of a material capable of protecting the touch panel 100 from an external impact and transmitting light through the touch panel 100. For example, the cover substrate 130 may include glass, plastic, and the like. However, embodiments are not limited thereto, and other materials may be used for the cover substrate 130.

The transparent adhesive layer 120 may be positioned between the cover substrate 130 and the conductive film 110 and may bring the cover substrate 130 into contact with the conductive film 110. Because the touch panel 100 can be formed using the transparent adhesive layer 120 of a single-layered structure as described above, a laminated structure of the touch panel 100 can be simplified.

The transparent adhesive layer 120 may be made of a material (for example, optically clear adhesive (OCA)) having adhesive characteristics capable of attaching layers positioned on both sides of the transparent adhesive layer 120 and transparency. The optically clear adhesive may be formed of a material having an excellent adhesive strength and excellent in moisture resistance, heat-resistant foamability, processability, and the like so as to prevent deterioration of the first and/or second electrodes 14 and 24. The transparent adhesive layer 120 may be formed of various materials known as the optically clear adhesive.

The conductive film 110 includes a base film 10, the first electrode 14 formed on one surface of the base film 10, and the second electrode 24 formed on the other surface of the base film 10. The conductive film 110 may further include a first hard coat layer 12 positioned between the base film 10 and the first electrode 14, an overcoat layer 16 covering the base film 10 (more precisely, the first hard coat layer 12) and the first electrode 14 in the effective area AA, a second hard coat layer 22 positioned between the base film 10 and the second electrode 24, and an insulating layer 26 covering the base film 10 (more precisely, the second hard coat layer 22) and the second electrode 24.

The first hard coat layer 12 is formed on one surface of the base film 10. The embodiment of the disclosure forms the first hard coat layer 12 between the base film 10 and the first electrode 14, thereby improving various characteristics of the first electrode 14. The first hard coat layer 12 will be described in detail later after the first electrode 14 and the overcoat layer 16 are described.

The first electrode 14 may include the first sensor unit 142 positioned in the effective area AA and the first wiring portion 144 electrically connected to the first sensor unit 142 in the non-effective area NA. The second electrode 24 may include the second sensor unit 242 positioned in the effective area AA and the second wiring portion 244 electrically connected to the second sensor unit 242 in the non-effective area NA.

The base film 10 may be a film, a sheet, or the like, which is made of a material having transparency and insulation while maintaining a mechanical strength of the conductive film 110. The base film 10 may include at least one of polyethylene, polypropylene, polyethylene terephthalate, polyethylene-2,6-naphthalate, polypropylene terephthalate, polyimide, polyamide-imide, polyether sulfone, polyether ether ketone, polycarbonate, polyarylate, cellulose propionate, polyvinyl chloride, polyvinylidene chloride, polyvinyl alcohol, polyether imide, polyphenylene sulfide, polyphenylene oxide, polystyrene, and the like. For example, the base film 10 may be made of polyethylene terephthalate. However, embodiments are not limited thereto, and other materials may be used for the base film 10.

The first sensor unit 142 includes first sensor portions 142a and a first connection portion 142b connecting the first sensor portions 142a. The first sensor portion 142a has a width greater than the first connection portion 142b and is a portion substantially determining whether or not the user touches the touch panel 100 with an input device such as a finger. The figures illustrated the rhombic first sensor portions 142a. Hence, the rhombic first sensor portions 142a occupy a wide area of the effective area AA together with second sensor portions 242a of the second sensor unit 242, thereby efficiently sensing a touch operation. However, embodiments are not limited thereto, and the first sensor portion 142a may have various shapes including a triangle, a polygon such as a quadrangle, a circle or an oval, etc. The number of intersections between a plurality of electrode parts 240 of the second sensor unit 242 may be 3 to 50 number/mm$^2$. However, embodiments are not limited thereto, and the number of intersections may be variously changed.

The first connection portion 142b connects the plurality of first sensor portions 142a in a first direction (a horizontal direction or an x-axis direction in the drawings). Hence, the first sensor unit 142 may be extended in the first direction in the effective area AA.

In the embodiment of the disclosure, the first sensor unit 142 includes a transparent conductive material having conductivity and transparency. For example, the first sensor unit 142 may include the first conductor 14a made of metal nanomaterials having a network structure. The metal nanomaterials may be referred to as a nano metal. Examples of the nanomaterials may include metal nanowires such as silver (Ag) nanowires, copper nanowires, and platinum nanowires. In particular, the Ag nanowires may be used. In embodiments of the disclosure, the network structure may refer to a structure in which adjacent conductors of nanomaterials such as nanowires are tangled with each other having contact points between them to form an irregular net structure, an irregular mesh structure, and the like, and are electrically connected to each other through the contact points. This will be described in detail later with reference to FIGS. 3 and 4.

Figure 3:
FIG. 3 is a photograph of a first conductor of a first sensor unit of a touch panel according to an embodiment of the disclosure.
Figure 4:
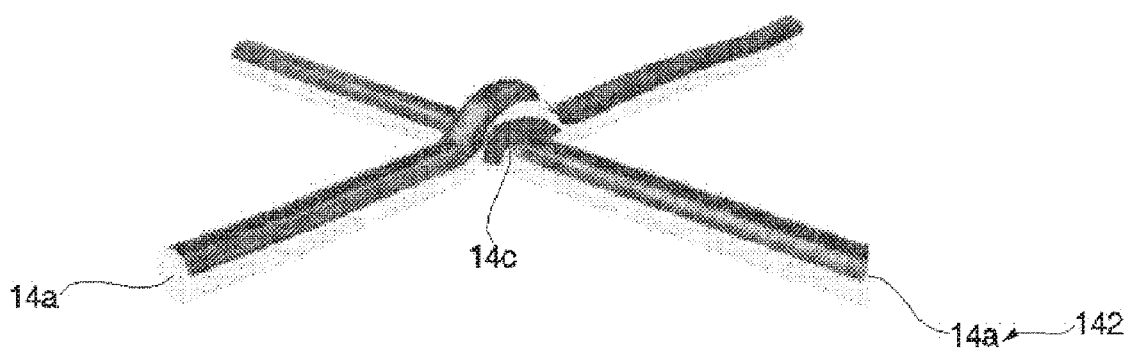
FIG. 4 is a perspective view schematically illustrating a first conductor of nanomaterials forming a network structure in a first sensor unit of a touch panel according to an embodiment of the disclosure.

FIG. 3 is a photograph of the first conductor 14a of the first sensor unit 142 of the touch panel according to the embodiment of the disclosure. FIG. 4 is a perspective view schematically illustrating the first conductor 14a of nanomaterials forming a network structure in the first sensor unit 142 of the touch panel according to the embodiment of the disclosure.

With reference to FIGS. 3 and 4, the plurality of first conductors 14a formed of nanowires is distributed in the first sensor unit 142 and is electrically connected by contacting each other at contact points 14c.

Referring again to FIG. 2, the first sensor unit 142 including the first conductors 14a of nanomaterials forming a network structure may be configured such that the first conductors 14a of nanomaterials are positioned inside a layer of a uniform thickness, or a void space is formed between the first conductors 14a of nanomaterials. In fact, the first sensor unit 142 is formed by coating a mixture mixing the first conductors 14a of nanomaterials with a very small amount of solvent, a binder, and the like. Hence, the first sensor unit 142 includes a residual portion 140 formed by remaining a solvent, a binder, and the like. The residual portion 140 includes a resin and has a relatively small first thickness T1. The first conductor 14a is extended to the outside of the residual portion 140. Hence, the network structure formed by the first conductors 14a may have a relatively large second thickness T2. Hereinafter, a thickness of the first sensor unit 142 does not mean the first thickness T1 (i.e., the thickness of the residual portion 140), and is based on the second thickness T2 which is a total thickness of a formation layer of the first conductor 14a protruding from the residual portion 140 together with the residual portion 140.

As described above, the first sensor unit 142 according to the embodiment of the disclosure includes the first conductors 14a of nanomaterials forming the network structure, thereby reducing the material cost and improving various characteristics. The first sensor unit 142 will be described in detail later.

The first wiring portions 144 are positioned in the non-effective area NA. The first wiring portions 144 may be extended and connected to the first flexible printed circuit board 19. In the embodiment of the disclosure, the first wiring portion 144 may include a different structure, a different material, etc. from the first sensor unit 142. This will be described in detail later.

The first wiring portion 144 may be positioned on the first sensor unit 142 at a portion where the first sensor unit 142 is exposed by removing the overcoat layer 16, and may contact the first sensor unit 142. The overcoat layer 16 having a thin thickness at a portion where the first wiring portion 144 is to be positioned may be easily removed in a process for patterning the first electrode 14. Alternatively, the overcoat layer 16 having a small thickness may be naturally removed in a process for coating a metal paste (for example, Ag paste) for forming the first wiring portion 144 and then firing the metal paste. However, embodiments are not limited thereto. For example, the overcoat layer 16 may be removed in another patterning process. The first wiring portion 144 may be positioned on the same plane as the first sensor unit 142, and thus the side of the first wiring portion 144 may contact the side of the first sensor unit 142. Alternatively, the first wiring portion 144 may be positioned on the first sensor unit 142 with the overcoat layer 16 interposed therebetween, and thus the first wiring portion 144 and the first sensor unit 142 may be electrically connected. Other configurations may be used.

The first wiring portion 144 may be connected to the first flexible printed circuit board 19 for the external connection. The first flexible printed circuit board 19 may include a base member and a wiring portion on the base member. The wiring portion of the first flexible printed circuit board 19 contacts the first wiring portion 144, and thus the first wiring portion 144 and the first flexible printed circuit board 19 may be electrically connected. However, embodiments are not limited thereto. For example, a conductive adhesive member (not shown) such as an anisotropic conductive adhesive (ACA), an anisotropic conductive paste (ACP), and an anisotropic conductive film (ACF) may be positioned between the wiring portion of the first flexible printed circuit board 19 and the first wiring portion 144 and thus may electrically connect the wiring portion of the first flexible printed circuit board 19 to the first wiring portion 144.

The figures illustrated that the first wiring portions 144 are positioned at both ends of the first sensor unit 142 and have a double routing structure, by way of example. The double routing structure reduces a resistance of the first sensor unit 142 and prevents a loss resulting from the resistance because the first sensor unit 142 is relatively elongated. However, embodiments are not limited thereto, and various structures may be used. For example, the first wiring portions 144 may be positioned at only one end of the first sensor unit 142 and have a single routing structure.

The figures illustrated that the first wiring portions 144 are connected to the outside through the two non-effective areas NA positioned on both sides of the effective area AA. However, embodiments are not limited thereto, and various structures may be used. For example, the first wiring portions 144 may be connected to the outside through one non-effective area NA positioned on one side of the effective area AA. Alternatively, the first wiring portions 144 may be extended to one of upper and lower sides of the effective area AA and may be connected to the outside at the extended side.

The overcoat layer 16 covering the base film 10 and the first sensor unit 142 physically and chemically protects the first sensor unit 142 at one surface of the base film 10. More specifically, the overcoat layer 16 entirely surrounds and covers the outer surface of the first conductor 14a extended to the outside of the residual portion 140, thereby preventing the first conductor 14a from being damaged or oxidized. More specifically, the overcoat layer 16 can prevent the first conductor 14a exposed from the residual portion 140 from being bent (i.e., physically damaged) by an external force, etc. Further, the first conductor 14a may be oxidized and deteriorated in electrical conductivity when exposed to an external atmosphere for a long time. Therefore, the overcoat layer 16 may be formed to cover the first conductor 14a, so as to prevent a reduction in the electrical conductivity. The embodiment of the disclosure forms the overcoat layer 16 capable of improving the physical stability of the first conductor 14a and preventing the oxidization of the first conductor 14a, because the first sensor unit 142 includes the first conductor 14a of nanomaterials forming the network structure. For example, a portion of the overcoat layer 16 may be impregnated into a space between the first conductors 14a and may fill the space between the first conductors 14a, and another portion of the overcoat layer 16 may be formed on the first conductor 14a. Unlike the embodiment of the disclosure, when the first conductor 14a does not protrude from the residual portion 140 and is positioned inside the residual portion 140, the overcoat layer 16 can prevent the first conductor 14a from being oxidized by the atmosphere, etc. penetrating into the residual portion 140. To this end, the overcoat layer 16 may be formed to directly contact the first sensor unit 142 or the first conductor 14a.

The overcoat layer 16 may be formed to entirely cover the first sensor unit 142 on the base film 10. In embodiments disclosed herein, the term of "entirely formed" may include not only completely and fully forming any element but also not forming inevitably a portion of any element.

The overcoat layer 16 may be formed of a resin. For example, the overcoat layer 16 may be formed of an acrylic resin. However, embodiments are not limited thereto, and other materials may be used for the overcoat layer 16. Further, the overcoat layer 16 may be formed to entirely cover the first sensor unit 142 using various coating methods.

A thickness of the overcoat layer 16 may be less than a thickness of the first hard coat layer 12 or the second hard coat layer 22. For example, the thickness of the overcoat layer 16 may be 5 nm to 50 nm. When the thickness of the overcoat layer 16 is less than 5 nm, an effect of the overcoat layer 16 capable of preventing the oxidation of the first conductor 14a may not be sufficient. When the thickness of the overcoat layer 16 exceeds 50 nm, the material cost of the overcoat layer 16 may increase. However, embodiments are not limited thereto, and the thickness of the overcoat layer 16 may have various values.

The figures and the embodiment of the disclosure illustrated that the residual portion 140 of the first sensor unit 142 and the overcoat layer 16 are formed at different layers, by way of example. However, embodiments are not limited thereto. In another embodiment, the first conductor 14a may be formed inside the overcoat layer 16 of a single layer by coating an ink obtained by mixing formation materials of the first conductor 14a of the first sensor unit 142, the residual portion 140, and the overcoat layer 16. Other configurations may be used.

The first hard coat layer 12 between the base film 10 and the first electrode 14 is described below. As described above, in the embodiment of the disclosure, because the first conductor 14a of the first sensor unit 142 is formed of the nanomaterial having the network structure, the conductive film 110 or a structure for forming the conductive film 110 may be easily damaged by an external force during performing the coating. Namely, even when a small external force is applied to the conductive film 110 according to the embodiment of the disclosure, contact characteristics between the nanomaterials (for example, nanowires) forming the network structure may be affected. Therefore, the electrical conductivity of the first sensor unit 142 may change. Hence, the embodiment of the disclosure forms the first had coat layer 12 having a relatively high hardness (i.e., having a hardness greater than the first electrode 14 and the overcoat layer 16) between the base film 10 and the first electrode 14 (in particular, the first sensor unit 142), thereby increasing an entire hardness of the conductive film 110. As a result, even when the external force is applied to the conductive film 110, contact characteristic of the first conductors 14a inside the first sensor unit 142 can be maintained in a high state.

The upper surface of the base film 10 is irregularly formed and has a relatively large surface roughness. The irregular surface of the base film 10 may increase diffuse reflection. In this instance, when the first conductor 14a of the network structure is applied as in the embodiment of the disclosure, the occurrence of diffuse reflection may be intensified by the network structure, etc. Hence, haze (or turbidity) may increase, and a transmittance may be reduced. Further, when the first sensor unit 142 is formed on the irregular surface of the above-described base film 10, it is difficult to form the first sensor unit 142 of nanomaterials having the network structure with a uniform thickness. Hence, an uncoated portion may be generated, and a variation in a sheet resistance of the first sensor unit 142 may increase.

In the embodiment of the disclosure, the first hard coat layer 12 is entirely coated on the base film 10 in consideration of this to planarize the upper surface of the base film 10. Namely, an upper surface of the first hard coat layer 12 may have a surface roughness smaller than the upper surface of the base film 10 (or a lower surface of the first hard coat layer 12). When the surface of the base film 10 is planarized by the first hard coat layer 12 as described above, the haze and the diffuse reflection can be minimized and the transmittance can be maximized. Hence, optical characteristics of the conductive film 110 can be improved. Further, coating characteristic of the first electrode 14 (for example, the first sensor unit 142) can be improved. Thus, variations in various characteristics such as the sheet resistance and the optical characteristics of the first sensor unit 142 can be minimized.

The first hard coat layer 12 may include various materials capable of increasing the hardness and improving the coating characteristic of the first sensor unit 142. For example, the first hard coat layer 12 may include at least one of a urethane-based resin, a melamine-based resin, an alkyd-based resin, an epoxy-based resin, an acrylic-based resin, a polyester-based resin, a polyvinyl alcohol-based resin, a vinyl chloride-based resin, a vinylidene chloride-based resin, a polyarylate-based resin, a sulfone-based resin, an amide-based resin, an imide-based resin, a polyethersulfone-based resin, a polyetherimide-based resin, a polycarbonate-based resin, a silicone-based resin, a fluorine-based resin, a polyolefin-based resin, a styrene-based resin, a vinylpyrrolidone-based resin, a cellulose-based resin, and an acrylonitrile-based resin. In particular, in the embodiment of the disclosure, the first hard coat layer 12 may include the acrylic-based resin. However, embodiments are not limited thereto. Other materials may be used for the first hard coat layer 12.

The first hard coat layer 12 may have a pencil hardness of 1H to 5H. When the pencil hardness of the first hard coat layer 12 is less than 1H, the above-described effects may not be sufficiently obtained. Further, it may be difficult to manufacture the first hard coat layer 12 having the pencil hardness exceeding 5H. The first hard coat layer 12 may have a contact angle of 40 to 60° with water and have a surface tension of 20 dyne/cm to 50 dyne/cm. The contact angle and the surface tension of the first hard coat layer 12 are less than a contact angle and a surface tension of another layer (for example, the base film 10 or a primer layer (not shown) between the base film 10 and the first hard coat layer 12). Thus, when the first sensor unit 142 is formed on the first hard coat layer 12, the first sensor unit 142 can be easily formed.

The first hard coat layer 12 may have a thickness enough to planarize the surface of the conductive film 110 while increasing the hardness of the conductive film 110. To this end, the first hard coat layer 12 may have a thickness greater than thicknesses of the first sensor unit 142 and the overcoat layer 16. However, when the first hard coat layer 12 is excessively thick, the thickness of the conductive film 110 may unnecessarily increase. Therefore, the first hard coat layer 12 may have the thickness less than the thickness of the base film 10.

For example, the thickness of the first hard coat layer 12 may be 1 μm to 10 μm. When the thickness of the first hard coat layer 12 is less than 1 μm, it may be difficult to sufficiently expect the above-described effect of the first hard coat layer 12. When the thickness of the first hard coat layer 12 exceeds 10 μm, the material cost of the first hard coat layer 12 may increase and thinning of the first hard coat layer 12 may be difficult. The thickness of the first hard coat layer 12 may be 3 μm to 5 μm in consideration of the effect, the thinning, etc. of the first hard coat layer 12. However, embodiments are not limited thereto. Other thicknesses may be used for the first hard coat layer 12.

The second hard coat layer 22 may be further positioned on the other surface of the base film 10. The second hard coat layer 22 protects the conductive film 110 from a damage (e.g., scratches) that may occur during the process. In the embodiment of the disclosure, the first electrode 14 is formed on the second hard coat layer 22, and then the second electrode 24 is formed. In this instance, the second hard coat layer 22 can prevent the base film 10 from being damaged when the first electrode 14 is formed or patterned before the second electrode 24 is formed.

Various characteristics including material, thickness, etc, of the second hard coat layer 22 may be the same as or very similar to those of the first hard coat layer 12, and thus a detailed description thereof will be omitted. The conductive film 110 according to the embodiment of the disclosure may have a pencil hardness of 2H or more (for example, 2H to 10H) by including the first and second hard coat layers 12 and 22 together.

The second electrode 24 on the other surface of the base film 10 (more precisely, on the second hard coat layer 22) may include the second sensor unit 242 and the second wiring portions 244. The second sensor unit 242 may include second sensor portions 242a positioned inside the effective area AA and second connection portions 242b connecting the adjacent second sensor portions 242a. The second wiring portion 244 may be extended from the second sensor portion 242a or the second connection portion 242b positioned inside the effective area AA and may be positioned inside the non-effective area NA.

The second connection portion 242b connects the plurality of second sensor portions 242a in a second direction (a vertical direction or a y-axis direction in the drawings), and the second electrode 24 is extended in the second direction in the effective area AA. The description of the first sensor unit 142 may be applied to the second sensor unit 242, except an extension direction of the second sensor unit 242. The second wiring portion 244 may be positioned on the second hard coat layer 22 in the non-effective area NA. The second wiring portion 244 may be extended and connected to the second flexible printed circuit board 29.

The figures illustrated that the second wiring portions 244 have a single routing structure, by way of example. Hence, the second wiring portion 244 is formed in the non-effective area NA positioned on the lower side of the effective area AA. However, embodiments are not limited thereto, and various structures may be used. For example, the second wiring portion 244 may be positioned on at least one of the upper, lower, left, and right sides of the effective area AA.

Since the descriptions of the first wiring portions 144 and the first flexible printed circuit board 19 may be applied to the second wiring portions 244 and the second flexible printed circuit board 29, a detailed description thereof will be omitted.

The insulating layer 26 covering the second hard coat layer 22 and the second electrode 24 may be positioned on the other surface of the base film 10. The insulating layer 26 forms the outer surface of the touch panel 100 and protects the touch panel 100. The insulating layer 26 may be made of a material (for example, acrylic resin) having a pencil hardness of F or higher and may have a thickness (for example, 1 μm or more, more specifically 1 μm to 20 μm) greater than the overcoat layer 16. The insulating layer 26 may have a dielectric constant less than the overcoat layer 16. For example, the dielectric constant of the insulating layer 26 may be 1 to 3, and the dielectric constant of the overcoat layer 16 may be 3 to 4. Because the insulating layer 26 is positioned between the conductive film 110 and a display panel 212 (see FIG. 9), the insulating layer 26 having the low dielectric constant can prevent a noise of the display panel 212 from being transferred to the conductive film 110 sensing a touch operation. However, embodiments are not limited thereto. Other materials, other pencil hardnesses, other thicknesses, etc. may be used for the insulating layer 26.

The figures illustrated that the insulating layer 26 is positioned on the second electrode 24, by way of example. However, when the second electrode 24 is positioned at the cover substrate 130 and the first electrode 14 is positioned opposite the second electrode 24, the insulating layer 26 may be positioned on the first electrode 14 and the overcoat layer 16. However, the insulating layer 26 is not necessarily.

As described above, in the embodiment of the disclosure, the first sensor unit 142 of the first electrode 14 includes the first conductor 14a of nanomaterials forming the network structure and thus can improve various characteristics. However, it may be difficult to form the second electrode including the same conductor as the first electrode 14 on the other surface of the base film 10 on which the first electrode 14 including the first conductors 14a is formed. Further, the second electrode may increase the problem that may occur by the first conductors 14a. More specifically, the first sensor unit 142 including the first conductors 14a may have the low material cost and the excellent transmittance. However, the electrical connection characteristics of the first sensor unit 142 may be easily reduced by an external impact, etc., and the first sensor unit 142 may increase the diffuse reflection. When the second sensor unit 242 including other first conductors 14a is formed on the base film 10 on which the first sensor unit 142 including the first conductors 14a is formed, the electrical connection characteristics of the first sensor unit 142 may be reduced during the formation of the second sensor unit 242. Hence, a defective rate of the conductive film 110 may increase, and it may be difficult to actually use the conductive film 110. The reflection of the conductive film 110 may be frequently performed by the diffuse reflection of the first and second sensor units 142 and 242 including the first conductors 14a, and there may occur a problem that the first and second sensor units 142 and 242 are visible to the user's eyes.

In the embodiment of the disclosure, the second sensor unit 242 includes second conductors 24a having a structure, a shape, etc. different from the first conductors 14a in consideration of this. In addition, the first and second wiring portions 144 and 244 for the external connection have a structure, a shape, etc. different from the first sensor unit 142 and/or the second sensor unit 242 and thus can further improve the external connection characteristics. This is described in detail below.

(a) to (d) of FIG. 5 schematically illustrate the first sensor unit 142, the second sensor unit 242, the first wiring portion 144, and the second wiring portion 244 according to the embodiment of the disclosure, respectively.

Referring to (a) of FIG. 5, as described above, the first sensor unit 142 is entirely formed in an area corresponding to the first sensor unit 142, and the first conductor 14a is positioned inside each first sensor unit 142 and performs a contact while having a contact point 14c. As described above, because the first conductor 14a forms the network structure, the first conductor 14a is not entirely but partially formed in a formation portion of the first sensor unit 142.

Namely, the first sensor unit 142 does not include a separate opening or the like and is entirely formed in an area (an area designed to function as the first sensor unit 142, that is, an inner area of an outer edge of the first sensor unit 142) functioning as a sensor unit of the first electrode 14. For example, a ratio (i.e., a first area ratio) of the inner area of the outer edge of the first sensor unit 142 to a formation area of the first sensor unit 142 may be equal to or greater than 95% (for example, 99% to 100%). Namely, an aperture ratio of the first sensor unit 142 may be equal to or less than 5% (for example, 0% to 1%). The aperture ratio of the first sensor unit 142 may be formed by a process error, and the like.

On the other hand, because the first conductor 14a is positioned in the formation area of the first sensor unit 142 to form the network structure, the first conductor 14a is not entirely but partially formed in the formation area of the first sensor unit 142. For example, a filling density of the first conductor 14a in the formation area of the first sensor unit 142 may be 1% to 30%. In embodiments disclosed herein, the filling density may mean a density of a formation portion of the first conductor 14a in the formation portion of the first sensor unit 142 when viewed from the plane. Thus, the first conductor 14a may not be positioned in an area occupying 70% to 99% of the formation area of the first sensor unit 142. When the filling density of the first conductor 14a is less than 1%, a resistance of the first sensor unit 142 may increase. When the filling density of the first conductor portion 14a exceeds 30%, a transmittance of the first sensor unit 142 may be reduced. Due to the filling density, the first sensor unit 142 including the first conductor 14a may have high transparency.

For example, the number of contact points 14c of the first conductor 14a in the first sensor unit 142 may be 1,000 number/mm$^2$ or more (for example, 1,000 to 1,000,000 number/mm$^2$). When the first conductor 14a has 1,000 or more contact points 14c, the first sensor unit 142 may have a low resistance and excellent electrical characteristics.

However, embodiments are not limited thereto. Other first area ratios, other filling densities, other numbers of contact points may be used.

In this instance, the nanowires forming the first conductor 14a may have a relatively large aspect ratio having a long length and a relatively short width. For example, the width (i.e., a short axis) of the first conductor 14a may be 10 nm to 35 nm, and the length (i.e., a long axis) of the first conductor 14a may be 20 μm to 40 μm. The first conductor 14a can have the good aspect ratio (for example, 1:600 to 1:4000) within the above range and thus can smoothly form the network structure. Hence, the first conductor 14a can prevent the first sensor unit 142 from being recognized by the user.

The first sensor unit 142 may be formed by a wet coating method which is cheaper than a deposition method. Namely, an electrode layer may be formed by the wet coating method for applying a paste, an ink, a mixture, a solution or the like including the first conductor 14a made of the nanomaterials such as the nanowires and then may be patterned to form the first sensor unit 142. In this instance, a concentration of the first conductor 14a of the nanomaterials is very low (for example, 1% or less) in the solution, the mixture, or the paste, etc. used in the wet coating method. Thus, the cost required to form the first sensor unit 142 can be reduced, and the productivity can be improved.

When the first sensor unit 142 includes the first conductor 14a of nanomaterials, the first sensor unit 142 can transmit light and have a low resistance and excellent electrical characteristics. For example, because a particle surface of silver (Ag) nanowires has various crystal surfaces, isotropic growth can be easily induced. Hence, the Ag nanowires can be easily manufactured. The Ag nanowires have a resistance of about 10 Ω/sq to 400 Ω/sq and can implement a low resistance (for example, 10 Ω/sq to 150 Ω/sq). Hence, the first sensor unit 142 having various resistances can be formed. In particular, the first sensor unit 142 having electrical conductivity higher than that of indium tin oxide (ITO) having a resistance of about 200 Ω/sq to 400 Ω/sq can be formed. The Ag nanowires have a transmittance greater than that of indium tin oxide and may have a transmittance of 88% or more (for example, 88% to 92%). The first sensor unit 142 has flexible characteristics and thus can be applied to flexible display devices. In addition, the first sensor unit 142 is stable in terms of the supply and demand of material.

A thickness of the first sensor unit 142 may vary depending on the size of the touch panel 100, a required resistance, and the material of the first sensor unit 142. In this instance, when the first sensor unit 142 includes metal nanowires having the network structure, the thickness of the first sensor unit 142 may be minimized. For example, the first sensor unit 142 may have the thickness of 200 nm or less (for example, 5 nm to 15 nm). The first sensor unit 142 having a small thickness within the thickness range can be formed to have a desired resistance. Hence, a surface roughness of the first sensor unit 142 may also have a relatively small value (for example, 5 nm to 15 nm). However, embodiments are not limited thereto. Other thicknesses, other surface roughnesses, etc. may be used for the first sensor unit 142.

Because the first sensor unit 142 includes the first conductor 14a of nanomaterials forming the network structure, the first sensor unit 142 has a relatively small specular reflectance (8° reflectance) and a relatively large diffuse reflectance (8° reflectance). For example, the specular reflectance of the first sensor unit 142 with respect to light of a wavelength of 380 nm to 780 nm may be 3 to 15%, and the diffuse reflectance of the first sensor unit 142 with respect to light of a wavelength of 380 nm to 450 nm is 2 to 10%. However, embodiments are not limited thereto. Other specular reflectances, other diffuse reflectances, etc. may be used for the first sensor unit 142.

The second sensor unit 242 of the second electrode 24 includes a second conductor 24a different from the first conductor 14a. The second conductor 24a is not formed of the nanomaterials forming the network structure unlike the first conductor 14a, and the second sensor unit 242 may have a mesh structure including a plurality of electrode parts 240.

More specifically, referring to (b) of FIG. 5, the second sensor unit 242 is partly formed inside an outer edge of the second sensor unit 242, and the second conductor 24a is entirely positioned in a formation portion (i.e., inside the plurality of electrode parts 240) of each second sensor unit 242. The plurality of electrode parts 240 including the second conductor 24a may have a transmittance less than the first sensor unit 142 and may be opaque. The second sensor unit 242 including the plurality of electrode parts 240 of the mesh structure may be recognized transparently.

Namely, the plurality of electrode parts 240 intersecting each other is positioned in an area (an area designed to function as the second sensor unit 242, that is, an inner area of the outer edge of the second sensor unit 242) functioning as a sensor unit of the second electrode 24. An opening 240a is formed in an area in which the plurality of electrode parts 240 is not formed. Hence, a ratio (i.e., a second area ratio) of the inner area of the outer edge of the second sensor unit 242 to a formation area of the second sensor unit 242 (i.e., the plurality of electrode parts 240) is less than the first area ratio. On the other hand, the second conductor 24a may be entirely positioned in the formation area of the second sensor unit 242 (i.e., a formation area of the plurality of electrode parts 240). Hence, a filling density of the second conductor 24a inside the second sensor unit 242 may be greater than the filling density of the first conductor 14a inside the first sensor unit 142. The embodiment of the disclosure includes the second sensor unit 242 including the second conductor 24a having the filing density greater than the filing density of the first conductor 14a positioned inside the first sensor unit 142 and causes the second area ratio of the second sensor unit 242 to be less than the first area ratio of the first sensor unit 142. Hence, the embodiment of the disclosure can adjust a resistance of the second sensor unit 242 to be similar to a resistance of the first sensor unit 142 by reducing the formation area of the second sensor unit 242 and can reduce the material cost of the second sensor unit 242, thereby improving the transmittance.

For example, the second area ratio may be 0.01% to 5% (for example, 0.01% to 2%), and an aperture ratio of the second sensor unit 242 may be 95% to 99.99% (for example, 98% to 99.99%). The filling density of the second conductor 24a may be 95% or more (for example, 99% to 100%). The resistances of the first sensor unit 142 and the second sensor unit 242 can similarly adjusted due to the above values of the second area ratio and the filling density, and the material cost of the second sensor unit 242 can be reduced. However, embodiments are not limited thereto. Other second area ratios, other filling densities of the second conductor 24a may be used.

The figures illustrated that when the plurality of electrode parts 240 of the second sensor unit 242 is inclined in the horizontal direction and the vertical direction of the touch panel 100 and intersects with each other, the openings 240a have a rhombic shape. However, embodiments are not limited thereto. The shape of the plurality of electrode parts 240, the shape of the openings 240a, and the like may be variously changed. For example, the shape of the opening 240a may be a triangle, a rectangle, a parallelogram, a pentagon, an irregular shape, or the like. In particular, when the opening 240a has a pentagonal shape or an irregular shape, the second sensor unit 242 does not have a regular shape. Therefore, moiré phenomenon generated when the regular shape is repeated can be prevented.

The second sensor unit 242 may be formed by various methods. For example, an electrode layer may be formed by the wet coating method for applying a photosensitive material and a paste, an ink, a mixture, a solution (hereinafter, referred to as a paste), etc. including a second conductor 24a, and then the electrode layer may go through a photosensitive process, a development process, and an etching process and may be patterned and thermally processed to form the second sensor unit 242. Alternatively, a paste having a pattern may be applied and then may be dried and/or fired to form the second sensor unit 242. Hence, the second sensor unit 242 can be formed without applying an impact to the base film 10 on which the first sensor unit 142 including the first conductors 14a is formed.

The paste for forming the second sensor unit 242 may include a solvent, a photosensitive material, the second conductor 24a, and other additives. For example, the solvent may use a volatile alcohol-based material or an ester-based material and may be included in an amount of 5 to 40 parts by weight based on 100 parts by weight of the total amount. The photosensitive material may include a thermosetting resin and may be included in an amount of 5 to 20 parts by weight based on 100 parts by weight of the total amount. The second conductor 24a may include various metals, for example, silver. The second conductor 24a may be included in an amount of 45 to 90 parts by weight based on 100 parts by weight of the total amount. The above-mentioned contents are determined in order to form the second sensor unit 242 in a stable manner and to have a low resistance. However, embodiments are not limited thereto.

The second conductors 24a may be composed of a plurality of metal particles which are in contact with each other to completely fill the formation portion of the second sensor unit 242. The second conductor 24a may have various shapes, for example, a rough sphere, a flake shape, or the like, and may have a constant diameter or width. Thus, the second conductor 24a may have a smaller aspect ratio than the first conductor 14a. For example, a diameter (or a long width or a short width) of the second conductor 24a may be 100 nm to 300 nm and may be greater than a width of the first conductor 14a and less than a length of the first conductor 14a. The aspect ratio of the second conductor 24a may approximately one. However, embodiments are not limited thereto. Other shapes, other diameters, other aspect ratios may be used for the second conductor 24a.

When the second sensor unit 242 includes the second conductor 24a made of metal particles as described above, the second sensor unit 242 can have a very low resistance and excellent electrical characteristics. Thus, even when the second area ratio of the second sensor unit 242 is reduced as described above, the second sensor unit 242 can have the low resistance. For example, a sheet resistance of the second sensor unit 242 may be 1 Ω/sq to 50 Ω/sq. The second sensor unit 242 can have the sufficiently low resistance within the range without increasing a difference in the sheet resistance between the first sensor unit 142 and the second sensor unit 242. However, embodiments are not limited thereto. The resistance of the second sensor unit 242 may be variously changed.

A thickness of the second sensor unit 242 may vary depending on the size of the touch panel 100, a required resistance, and the material of the second sensor unit 242. In the embodiment, because the second sensor unit 242 is formed by applying the paste, the thickness of the second sensor unit 242 may be greater than that of the first sensor unit 142. For example, the second sensor unit 242 may have the thickness of 0.5 μm to 2 μm. When the second sensor unit 242 has the thickness within the above range, the second sensor unit 242 can have the desired resistance by a simple process and the material cost of the second sensor unit 242 can be reduced. Hence, a surface roughness of the second sensor unit 242 may have a larger value (for example, 0.5 μm to 2 μm) than that of the first sensor unit 142. However, embodiments are not limited thereto. Other thicknesses, other surface roughnesses, etc. may be used for the second sensor unit 242.

Because the second sensor unit 242 is made of a metal layer filled with the second conductor 24a, the second sensor unit 242 has a specular reflectance (8° reflectance) greater than the first sensor unit 142 and a diffuse reflectance (8° reflectance) less than the first sensor unit 142. For example, the specular reflectance of the second sensor unit 242 with respect to light of a wavelength of 380 nm to 780 nm may be 8 to 20%, and the diffuse reflectance of the second sensor unit 242 with respect to light of a wavelength of 380 nm to 450 nm is 0.5 to 5%. Because the diffuse reflectance of the second sensor unit 242 is less than the diffuse reflectance of the first sensor unit 142 as described above, an excessive increase in the diffuse reflectance resulting from the first sensor unit 142 or an increase in haze can be prevented. Because the second sensor unit 242 has the mesh structure having the small second area ratio, problems caused by an increase in the specular reflectance can be minimized. Thus, because the second sensor unit 242 including the metal particles can be prevented from being separately blackened, the structure, the manufacturing process, and the like can be simplified. However, embodiments are not limited thereto. Other specular reflectances, other diffuse reflectances, etc. may be used for the second sensor unit 242.

Because the second sensor unit 242 is made of the metal layer filled with the second conductor 24a, the second sensor unit 242 may have a transmittance less than that of the first sensor unit 142. For example, the transmittance of the second sensor unit 242 may be 87% to 91%. In the embodiment, because the second sensor unit 242 has the mesh structure having the small second area ratio, a reduction in the transmittance of the conductive film 110 resulting from the second sensor unit 242 can be minimized.

The first and second wiring portions 144 and 244 may have the material, the structure, etc. different from the first and second sensor units 142 and 242, respectively. More specifically, referring to (c) and (d) of FIG. 5, because metal particles 14b which are in contact with each other and are densely disposed are entirely positioned in the first wiring portion 144, the first wiring portion 144 may have a filling density greater than the first sensor unit 142 and an area ratio greater than the second area ratio of the second sensor unit 242. Similar to the first wiring portion 144, because metal particles 24b which are in contact with each other and are densely disposed are entirely positioned in the second wiring portion 244, the second wiring portion 244 may have a filling density greater than the first sensor unit 142 and an area ratio greater than the second area ratio of the second sensor unit 242. For example, the first and second wiring portions 144 and 244 each include the second conductor 24a included in the second sensor unit 242 and have the same or similar filling density. The first and second wiring portions 144 and 244 are entirely formed inside outer edges of the first and second sensor units 142 and 242 and may have the same or similar area ratio as the first area ratio of the first sensor unit 142. Thus, even when the first and second wiring portions 144 and 244 have a small width, the first and second wiring portions 144 and 244 having the above-described structure can have a sufficiently low resistance and have excellent electrical characteristics.

For example, the first and second wiring portions 144 and 244 may have the same or similar filling density (within a margin of error of less than 10%) as the second sensor unit 242 and have an area ratio (within a margin of error of less than 10%) similar to the first area ratio of the first sensor unit 142. Namely, the first and second wiring portions 144 and 244 may have the filling density of 95% or more (for example, 99% to 100%) and may have the area ratio of 0.01% to 5% (for example, 0.01% to 2%). However, embodiments are not limited thereto. Other filling densities and other area ratios may be used for the first and second wiring portions 144 and 244.

The first and second wiring portions 144 and 244 may be formed by various methods. For example, when the first and second wiring portions 144 and 244 include the same conductor as the second conductor 24a of the second sensor unit 242, the first and second wiring portions 144 and 244 may be formed together in a process for forming the second sensor unit 242. Namely, a paste including a photosensitive material and the second conductor 24a is applied on the entire other surface of the base film 10 and the non-effective area NA of one surface of the base film 10 using a coating method (for example, the wet coating method) to form an electrode layer. A photosensitive process, a development process, and an etching process may be performed on the electrode layer, and the first and second wiring portions 144 and 244 may be patterned together with the second sensor unit 242. Thereafter, the second sensor unit 242 and the first and second wiring portions 144 and 244 may be formed together through the thermal processing. Alternatively, a paste having a pattern may be applied and then may be dried and/or fired to form the second sensor unit 242 and the first and second wiring portions 144 and 244. Hence, the first and second wiring portions 144 and 244 can be formed by the simple process.

As another example, the first wiring portion 144 may be formed together with the first sensor unit 142. For example, an electrode layer including the first conductor 14a is formed in the effective area AA, and an electrode layer including the second metal particles 14b is formed in the non-effective area NA before or after the formation of the electrode layer. Thereafter, the first sensor unit 142 and the first wiring portion 144 may be formed for laser patterning. In this case, the electrode layer formed in the non-effective area NA and including the second metal particles 14b may be formed by printing a paste or the like. The paste may use not the photosensitive material but a thermosetting resin in the above-described paste for forming the second sensor unit 242. The second wiring portion 244 may be formed together with the second sensor unit 242 as described above.

However, embodiments are not limited thereto. The first and/or second wiring portions 144 and 244 may be formed by a different process from the second sensor unit 242. Further, the first and second wiring portions 144 and 244 may include various shapes and various conductive materials. For example, the embodiment of the disclosure described that the first and second sensor units 142 and 242 and the first and second wiring portions 144 and 244 have different structures, by way of example. However, the first sensor unit 142 and the first wiring portion 144 may be made of the same material to form an integral structure, and/or the second sensor unit 242 and the second wiring portion 244 may be made of the same material to form an integral structure. For example, the first wiring portion 144 may include the first conductor 14a of the same nanomaterials (for example, Ag nanomaterials) as the first sensor unit 142. Thus, the manufacturing process for forming the first sensor unit 142 and the first wiring portion 144 can be simplified. In this case, the first wiring portion 144 is not positioned on the first sensor unit 142. Namely, the first sensor unit 142 and the first wiring portion 144 may be formed on the same plane of the base film 10, and the overcoat layer 16 may be formed to cover both the first sensor unit 142 and the first wiring portion 144.

A method of manufacturing the conductive film 110 and the touch panel 100 including the conductive film 110 are as follows.

An ink or a paste for forming the first sensor unit 142 is applied on one surface of the base film 10 including the first and second hard coat layers 12 and 22 (more specifically, on the first hard coat layer 12) and then is patterned using a laser or a wet etching method to form the first sensor unit 142. Next, a photosensitive paste for forming the second sensor unit 242 is applied on the other surface of the base film 10 (more specifically, on the second hard coat layer 22) and is patterned to form the second sensor unit 242. The first wiring portion 144 may be formed before or after the formation of the first sensor unit 142 or in the process for forming the first sensor unit 142, and the second wiring portion 244 may be formed before or after the formation of the second sensor unit 242 or in the process for forming the second sensor unit 242. For example, the second sensor unit 242 and the first and second wiring portions 144 and 244 may be formed together. Hence, the conductive film 110 may be manufactured. As a result, the material cost can be reduced by forming the first and second sensor units 142 and 242 on one conductive film 110, and the manufacturing process can be simplified.

The touch panel 100 may be manufactured by attaching the first and second printed circuit boards 19 and 29 and the transparent adhesive layer 120 to the conductive film 110 and attaching the cover substrate 130 to the transparent adhesive layer 120. As a result, because one conductive film 110 and the cover substrate 130 are attached by one transparent adhesive layer 120, the material cost can be reduced and the manufacturing process can be simplified.

The figures illustrated that the first sensor unit 142 is positioned opposite the cover substrate 130 and the second sensor unit 242 is positioned opposite the cover substrate 130, by way of example. Hence, the second sensor unit 242 positioned at the rear side can serve as a kind of filter for preventing the diffuse reflection, thereby effectively preventing the problem caused by the diffuse reflection of the first sensor unit 142. In this case, it showed better visibility. However, embodiments are not limited thereto. The second sensor unit 242 may be positioned opposite the cover substrate 130, and the first sensor unit 142 may be positioned opposite the cover substrate 130. In this instance, because the first sensor unit 142 having the relatively high first area ratio is formed adjacent to the display panel 210 (see FIG. 9), a noise generated in the display panel 210 can be effectively blocked. Other configurations may be used.

In the embodiment of the disclosure, the second electrode 24 including the second sensor unit 242 may be an electrode Tx supplied with a voltage, and the first electrode 14 including the first sensor unit 142 may be an electrode Rx receiving a supplied voltage. Alternatively, the first electrode 14 including the first sensor unit 142 may be an electrode Tx supplied with a voltage, and the second electrode 24 including the second sensor unit 242 may be an electrode Rx receiving a supplied voltage. The figures illustrated that the first electrode 14, which is formed along the long axis and constitutes the electrode Tx supplied with the voltage, includes the first conductor 14a formed of metal nanomaterials forming the network structure, and the second electrode 24 includes the second conductor 14b formed of the metal particles, by way of example. However, embodiments are not limited thereto. For example, the electrode Tx, which is formed along the long axis and is supplied with the voltage, may be formed as the second electrode 24 having the relatively low sheet resistance to reduce a line resistance, and the electrode Rx, which is formed along the short axis and receives the supplied voltage, may be formed as the first electrode 14. The first and second electrodes 14 and 24 may be variously modified.

In the embodiment of the disclosure, the second electrode 24, the second hard coat layer 22, the base film 10, the first hard coat layer 12, the first electrode 14, and the overcoat layer 16 are in contact with each other, and thus the structure can be remarkably simplified. However, embodiments are not limited thereto. For example, a separate component may be positioned between the adjacent components.

The structure of the first electrode 14 including the first sensor unit 142 and the first wiring portion 144 and the structure of the second electrode 24 including the second sensor unit 242 and the second wiring portion 244 applicable to the touch panel according to the embodiment of the disclosure are described in more detail with reference to FIGS. 6 and 7. FIG. 6 is a photograph of a portion of a first electrode applicable to an embodiment of the disclosure. FIG. 7 is a photograph of a portion of a second electrode applicable to an embodiment of the disclosure.

(a) of FIG. 6 illustrates the first electrode 14 including the first sensor unit 142 and the first wiring portion 144. Referring to (b) of FIG. 6 which is an enlarged view of the first sensor unit 142, the plurality of first conductors 14a having a nanowire shape may be positioned having contact point between the first conductors 14a. The first conductor 14a may be positioned inside a portion of the first sensor unit 142, but the first conductor 14a may not be positioned inside a portion of the first sensor unit 142. Referring to (c) of FIG. 6 which is an enlarged view of the first wiring portion 144, the conductor made of the metal particles 14b may be entirely filled in the first wiring portion 144.

(a) of FIG. 7 illustrates the second electrode 24 including the second sensor unit 242 including the plurality of electrode parts 240 and the openings 240a and the second wiring portion 244 connected to the second sensor unit 242. Referring to (b) of FIG. 7 which is an enlarged view of the second sensor unit 242, the second conductor 24a made of metal particles may be entirely filled in a formation portion (i.e., inside the plurality of electrode parts 240) of the second sensor unit 242. Referring to (c) of FIG. 7 which is an enlarged view of the second wiring portion 244, the conductor made of the metal particles 24b may be entirely filled in the second wiring portion 244.

As described above, in the embodiment of the disclosure, the first electrode 14 including the first sensor unit 142 is formed on one surface of the base film 10, and the second electrode 24 including the second sensor unit 242 is formed on the other surface of the base film 10. Hence, the embodiment of the disclosure can reduce the number of base films 10 or the number of conductive films 110 as compared to the case where the first and second electrodes 14 and 24 are formed on different base films, and can omit the adhesive layer for attaching the base films 10 or the conductive films 110. As a result, the embodiment of the disclosure can minimize the thickness of the touch panel 100, reduce the manufacturing cost of the touch panel 100, and simplify the manufacturing process of the touch panel 100. In this instance, the first sensor unit 142 and the second sensor unit 242 have different structures, different shapes, and the like, thereby preventing problems caused when the first and second sensor units 142 and 242 have the same structure, the same shape, and the like, and improving characteristics of the touch panel 100.

For example, unlike the embodiment of the disclosure, when the first and second sensor units 142 and 242 include the second conductor 24a in the form of metal particles and are formed in the mesh structure having the second area ratio, it is difficult to efficiently prevent the noise generated in the display panel 210 when they are applied to the display device, etc. Hence, problems such as malfunction, coordinate distortion, and disconnection may occur. Further, the moiré phenomenon may occur due to the mesh structure, an appearance may be deteriorated, and the stability of the mass production may be reduced due to the thin linewidth. Hence, it may be difficult to apply the first and second sensor units 142 and 242 to the display device of high image quality. Because the blackening processing for performing the specular reflection due to the high specular reflectance has to be performed, the manufacturing cost may increase. Alternatively, unlike the embodiment of the disclosure, when the first and second sensor units 142 and 242 include the first conductor 14a of nanomaterial forming the network structure, milkiness phenomenon resulting from the diffuse reflection of the first conductor 14a may occur. Further, it may be difficult to implement a sufficiently low resistance.

On the other hand, the first sensor unit 142 and the second sensor unit 244 have different structures, different shapes, and the like, and thus can effectively prevent the above-described problems. For example, the moiré phenomenon of the second sensor unit 242 can be minimized by the diffuse reflection of the first sensor unit 142. In particular, the embodiment of the disclosure is configured such that the second area ratio of the second sensor unit 242 having a low resistance by including the second conductor 24a at a high filling density is less than the first area ratio of the first sensor unit 142 having a relatively high resistance by including the first conductor 14a at a low filling density, thereby effectively preventing the problems caused by the second sensor unit 242. Namely, the second sensor unit 242 has a relatively low transmittance and a relatively high specular reflectance when having the low resistance. However, a reduction in the transmittance and an increase in the specular reflectance of the second sensor unit 242 can be prevented by reducing the second area ratio of the second sensor unit 242.

Hereinafter, a touch panel according to another embodiment of the disclosure and a display device including the touch panel are described in detail. The same or similar descriptions as those described above will be omitted, and only different descriptions will be described in detail. The above-described embodiments, modifications applicable thereto, the following embodiments, and modifications applicable thereto can be variously combined with each other.

FIG. 8 is a cross-sectional view of a touch panel according to another embodiment of the disclosure.

Referring to FIG. 8, in a conductive film 110 according to another embodiment of the disclosure, a first sensor unit 142 of a first electrode 14 may include a transparent conductive material, for example, a transparent conductive oxide (TCO). For example, the first sensor unit 142 may include indium tin oxide (ITO). In this instance, because the first sensor unit 142 has a high filling density and a high hardness, an overcoat layer (indicated by a reference numeral "16" of FIG. 2) for covering the first sensor unit 142 is not provided. In this instance, a first hard coat layer 12 may be provided under the first sensor unit 142. When a flexible or curved touch panel 100 is applied and is in a bent state, the first hard coat layer 12 can prevent a damage to the first sensor unit 142. However, embodiments are not limited thereto.

In the embodiment of the disclosure, the first sensor unit 142 may have a resistance equal to or greater than the resistance of the first sensor unit 142 of the above-described embodiment including nanomaterial. The resistance of the first sensor unit 142 according to the present embodiment may be 10 to 270 Ω/sq. This is because a resistance of transparent conductive oxide is higher than a resistance of the nanomaterial. For example, the resistance of the first sensor unit 142 according to the present embodiment may be 100 to 270 Ω/sq. In order to reduce the resistance of the first sensor unit 142, a thickness of the first sensor unit 142 has to increase. However, because the first sensor unit 142 has brittle, it is difficult to apply the first sensor unit 142 to the flexible touch panel 100 when the thickness of the first sensor unit 142 increases. Namely, when the first sensor unit 142 has the resistance of 100 Ω/sq or more, the first sensor unit 142 may be applied to the flexible touch panel 100.

For example, the thickness of the first sensor unit 142 may be 200 nm or less (for example, 5 nm to 200 nm). When the thickness of the first sensor unit 142 is less than 5 nm, the resistance of the first sensor unit 142 may increase. When the thickness of the first sensor unit 142 exceeds 200 nm, it may be difficult to apply the first sensor unit 142 to the flexible touch panel 100. Hence, a surface roughness of the first sensor unit 142 has a value of about 5 nm to 200 nm.

However, embodiments are not limited thereto. Other resistances, other thicknesses, other surface roughnesses may be used for the first sensor unit 142.

The first sensor unit 142 may have a single-layered structure in which transparent conductive oxide corresponding to a first conductor is densely filled. Thus, the first sensor unit 142 may have the same or similar filling density as a second sensor unit 242 and have a high first area ratio. For example, the filling density of the first sensor unit 142 may be 95% or more (for example, 99% to 100%), and the first area ratio of the first sensor unit 142 may be 95% or more (for example, 99% to 100%). Because the first sensor unit 142 has the single-layered structure as described above, the first sensor unit 142 does not include a conductor of a specific shape.

Because the first sensor unit 142 is not made of a metal material, the first sensor unit 142 has a specular reflectance (8° reflectance) relatively less than the second sensor unit 242 and a diffuse reflectance (8° reflectance) relatively less than the second sensor unit 242. For example, the specular reflectance of the first sensor unit 142 with respect to light of a wavelength of 380 nm to 780 nm may be 8 to 11%, and the diffuse reflectance of the first sensor unit 142 with respect to light of a wavelength of 380 nm to 450 nm is 0 to 3%. However, embodiments are not limited thereto. Other specular reflectances, other diffuse reflectances, etc. may be used for the first sensor unit 142.

Differences in characteristics between the first sensor unit 142 and the second sensor unit 242, which do not show specific numerical values or are not described in the above description, are described in the previous embodiment. Therefore, a detailed description thereof will be omitted.

In this instance, the first sensor unit 142 having the resistance higher than the second sensor unit 242 may be formed at the first area ratio, and the second sensor unit 242 having a resistance less than the first sensor unit 142 may be formed at a second area ratio. Hence, the embodiment of the disclosure can improve characteristics of the touch panel 100 while maintaining excellent characteristics of the first and second sensor units 142 and 242.

FIG. 9 is a cross-sectional view of a display device according to an embodiment of the disclosure.

Referring to FIG. 9, a display device 200 according to an embodiment of the disclosure may include a display panel 210 and a touch panel 100 integrated with the display panel 210. The display panel 210 may include a display unit 212 on which an image is substantially displayed, a front substrate 214 positioned on a front surface of the display unit 212, and a rear substrate 216 positioned on a rear surface of the display unit 212. The display panel 210 may further include a backlight unit providing light to the display unit 212, a driving unit driving the display unit 212, and the like.

The display unit 212 may be a panel of various structures capable of displaying an image. For example, the display unit 212 may be a liquid crystal display panel. Since, the display unit 212 can have various structures, manners, and the like, embodiments are not limited thereto.

The front substrate 214 may include a transparent substrate 214*a* and a polarizing plate 214*b* attached to the transparent substrate 214*a* (more specifically, on an inner surface of the transparent substrate 214*a*). The polarizing plate 214*b* serves to polarize light so that a desired image can be displayed. The polarizing plate 214*b* may have various structures and manners capable of polarizing light. However, embodiments are not limited thereto. Instead of the polarizing plate 214*b*, various layers may be positioned on the front substrate 214.

The rear substrate 216 may include a transparent substrate 216*a* and a polarizing plate 216*b* attached to the transparent substrate 216*a* (more specifically, on an inner surface of the transparent substrate 216*a*). The polarizing plate 216*b* serves to polarize light so that a desired image can be displayed. The polarizing plate 216*b* may have various structures and manners capable of polarizing light. However, embodiments are not limited thereto. Instead of the polarizing plate 216*b*, various layers may be positioned on the rear substrate 216.

In the embodiment of the disclosure, the touch panel 100 is entirely positioned on a front surface of the display panel 210, and an adhesive layer 220 is positioned between the touch panel 100 and the display panel 210 and attaches the touch panel 100 to the display panel 210. First and second conductive films 10 and 20 and the adhesive layer 220 of the touch panel 100 are positioned on the front substrate 214 of the display panel 210, and thus the touch panel 100 and the display panel 210 may be integrated with each other in an on-cell structure. In this instance, both surfaces of the adhesive layer 220 may contact a rear surface of the touch panel 100 and the front surface of the display panel 210.

FIG. 10 is a cross-sectional view of a display device according to another embodiment of the disclosure.

Referring to FIG. 10, a display device 200 according to an embodiment of the disclosure may include a display panel 210 and a touch panel 100 integrated with the display panel 210. Since the description of the display panel 210 shown in FIG. 9 can be applied to the display panel 210 shown in FIG. 10, a description thereof will be omitted.

In the embodiment of the disclosure, a front substrate 214 may be positioned on a front surface of the touch panel 100, and a display unit 212 and a rear substrate 216 may be positioned on a rear surface of the touch panel 100. A first adhesive layer 222 may be positioned between the touch panel 100 and the front substrate 214 and may attach the touch panel 100 to the front substrate 214. A second adhesive layer 224 may be positioned between the touch panel 100 and the display unit 212 and may attach the touch panel 100 to the display unit 212. The touch panel 100 may be positioned inside the display panel 210 and may be integrated with the display panel 210 in an in-cell structure.

FIGS. 9 and 10 illustrate that the touch panel 100 has the structure illustrated in FIG. 2, by way of example. However, embodiments are not limited thereto, and the touch panel 100 may have various structures. Further, FIGS. 9 and 10 illustrate that the touch panel 100 is integrated with the display panel 210 using the adhesive layers (220 or 222 and 224), by way of example. However, embodiments are not limited thereto, and various methods may be used. For example, a spacer may be positioned between the touch panel 100 and the display panel 210 to fix the touch panel 100 and the display panel 210 in a state of forming an air gap between them.

FIG. 11 illustrates a touch sensor according to an embodiment of the disclosure and a display device including the touch sensor.

As shown in FIG. 11, a display device 300 according to an embodiment of the disclosure may include a touch sensor 310. The touch sensor 310 can acquire a touch operation of a user. The touch sensor 310 shown in FIG. 11 may perform substantially the same function as the conductive film 110 described with reference to FIGS. 1 and 2.

As shown in (a) of FIG. 11, the display device 300 may include a display panel 350, a touch sensor 310 on a front surface of the display panel 350, a backlight unit 370 on a rear surface of the display panel 350, and a glass 400 on a front surface of the touch sensor 310. The glass 400 may perform substantially the same function as the cover substrate 130 described with reference to FIGS. 1 and 2. FIG. 11 illustrates the glass 400 is formed the front surface of the touch sensor, by way of example. However, embodiments are not limited thereto, and plastic material may be used.

The display panel 350 may be a device that substantially displays an image. Namely, the display panel 350 may be a part that displays an image in response to a control signal and transmits information. The image displayed on the display panel 350 can be recognized by the user through the touch sensor 310 and the glass 400.

The backlight unit 370 may provide light toward the display panel 350. The backlight unit 370 may be classified into an edge type backlight unit or a direct type backlight unit depending on a position of a light source.

The backlight unit 370 may be omitted depending on types of the display panel 350. For example, the backlight unit 370 may be omitted when the display panel 350 is a self-emission panel like an organic light emitting diode (OLED) display panel.

The touch sensor 310 may be a device for sensing a touch operation of a user. The user can touch the display device 300 with his or her finger F or the like. The user's finger F may contact the glass 400 of the display device 300. When the user's finger F touches the glass 400, a capacitance may be changed. The touch sensor 310 can detect changes in the capacitance to sense whether the touch operation of the user is present or absent and/or to sense a touch position.

The touch sensor 310 may be attached to a rear surface of the glass 400. For example, the touch sensor 310 and the glass 400 may be integrated by an adhesive layer between the touch sensor 310 and the glass 400. The glass 400 and the touch sensor 310 integrated with the glass 400 may constitute a touch panel module 330.

As shown in (b) of FIG. 11, the touch sensor 310 may include an electrode TS. The electrode TS may be configured such that driving electrodes Tx (the second electrodes 24 of FIG. 1) and sensing electrodes Rx (the first electrodes 14 of FIG. 1) intersect each other in horizontal and vertical directions to form a lattice shape. A signal sensed by the electrode TS may be transmitted to a controller via an amplifier (AMP) and an analog-to digital converter (ADC).

FIG. 12 is a flow chart illustrating a method of manufacturing a touch sensor shown in FIG. 11.

As shown in FIG. 12, the touch sensor 310 according to the embodiment of the disclosure may be manufactured through a series of processes. A method of manufacturing the touch sensor 310 according to the embodiment of the disclosure has an effect of simplify a sensor patterning process. The method of manufacturing the touch sensor 310 according to the embodiment of the disclosure has an effect of omitting a separate process for forming a trace. In embodiments disclosed herein, the trace may perform substantially the same function as the first wiring portions 144 (see FIG. 1) and the second wiring portions 244 (see FIG. 1) described with reference to FIGS. 1 and 2. The method of manufacturing the touch sensor 310 according to the embodiment of the disclosure has an effect of reducing the consumption of material such as sensor material and adhesive layers.

The method of manufacturing the touch sensor 310 according to the embodiment of the disclosure may include a step S10 of preparing a material. The material may be Ag nanowire coated sheet (AWS). The method of manufacturing the touch sensor 310 according to the embodiment of the disclosure may form an electrode on one material. Thus, the embodiment of the disclosure can reduce the consumption of material, as compared to a related art using a plurality of materials.

A step S20 of forming a pattern on the material may be performed. The pattern may be at least a portion of at least one of a pattern of the driving electrode and a pattern of the sensing electrode. For example, the pattern may be all or a portion of the pattern of the driving electrode. The pattern that is a portion of the driving electrode and a portion of the sensing electrode may be a bridge pattern. Namely, the pattern may be configured such that a portion of the driving electrode and a portion of the sensing electrode are disconnected. The pattern may be formed by etching the material.

A step S30 of forming an insulating layer on the material on which the pattern is formed may be performed. The insulating layer may be positioned at intersections of the driving electrodes and the sensing electrodes. The insulating layer may be formed through a printing process. For example, the insulating layer may be printed only on the intersections of the driving electrodes and the sensing electrodes. The insulating layer can prevent a short circuit between the driving electrodes and the sensing electrodes intersecting each other.

A step S40 of applying a photosensitive paste may be performed. The photosensitive paste may be applied on the region where the pattern is formed. The photosensitive paste may be applied substantially to the entire area of the material. The photosensitive paste may include a silver (Ag) component.

A step S50 of forming a sensor pattern (including the first and second sensor units 142 and 242 of FIG. 1) and a trace may be performed. The sensor pattern and the trace may be simultaneously formed. Namely, the sensor pattern and the trace can be formed by exposing and developing the photosensitive paste.

The sensor pattern may be a pattern different from a sensor pattern that has been already formed on the material. For example, when the driving electrode is formed on the material, the sensing electrode may be produced in the step S50.

The trace may be a path for outputting a signal from the sensor pattern or for inputting a signal to the sensor pattern. One side of the trace may contact the sensor pattern, and the other side of the trace may contact a cable terminal.

The sensor pattern and the trace may be formed substantially simultaneously. Namely, the sensor pattern and the trace can be formed at one time by exposing and developing the photosensitive paste. Thus, the embodiment of the disclosure can simplify the process, as compared to a related art in which the sensor pattern and the trace are formed in different processes.

FIGS. 13 to 21 illustrate a method of manufacturing a touch sensor shown in FIG. 12.

Figure 13:
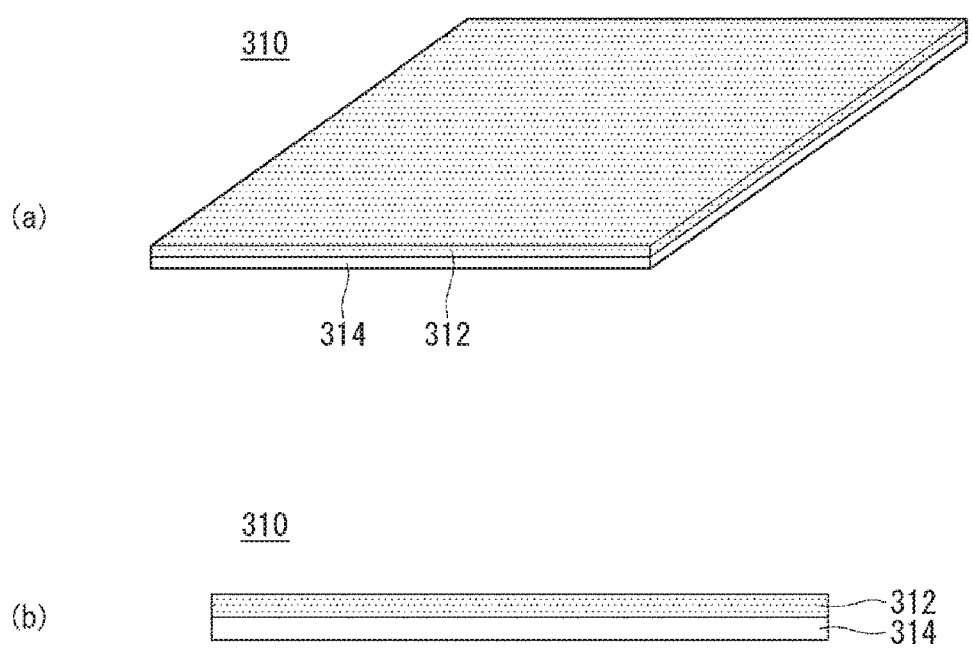

As shown in FIG. 13, the touch sensor 310 according to the embodiment of the disclosure may be formed on a material required to manufacture. The material may include a base film 314 and a silver nanowire layer 312 formed on the base film 314.

Figure 14:
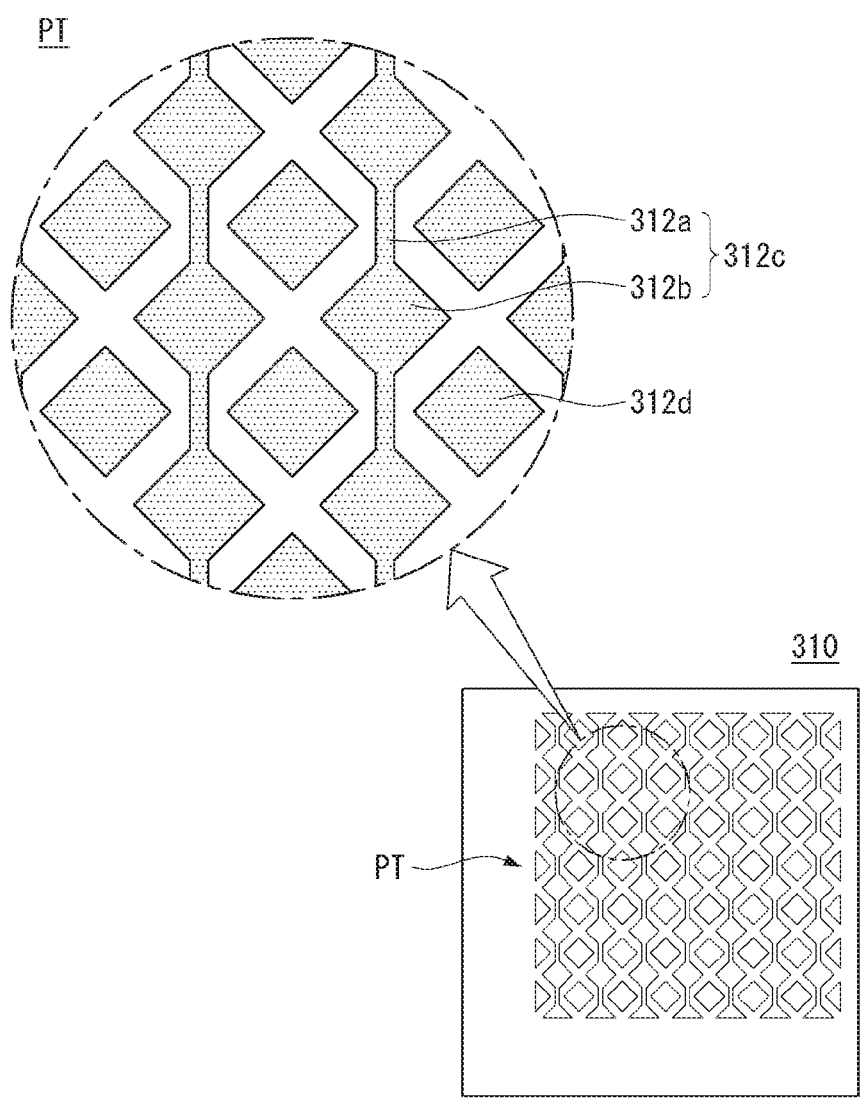

As shown in FIG. 14, when an etching process is performed on the material, a portion of the silver nanowire layer 312 may be removed to form a pattern PT. The pattern PT may include a first pattern 312c and a second pattern 312d.

The first and second patterns 312c and 312d may be the bases of the driving electrode and the sensing electrode, respectively. For example, when the first patterns 312c of a vertical direction are the driving electrode, the second patterns 312d arranged in a horizontal direction may be connected to form the sensing electrode.

The first pattern 312c may include a connection portion 312a and a first body 312b. The first body 312b may have as wide an area as possible, in order to improve a sensing performance.

The second pattern 312d may be a pattern separated from the first pattern 312c. The second pattern 312d may have as wide an area as possible, in order to improve a sensing performance.

Figure 15:
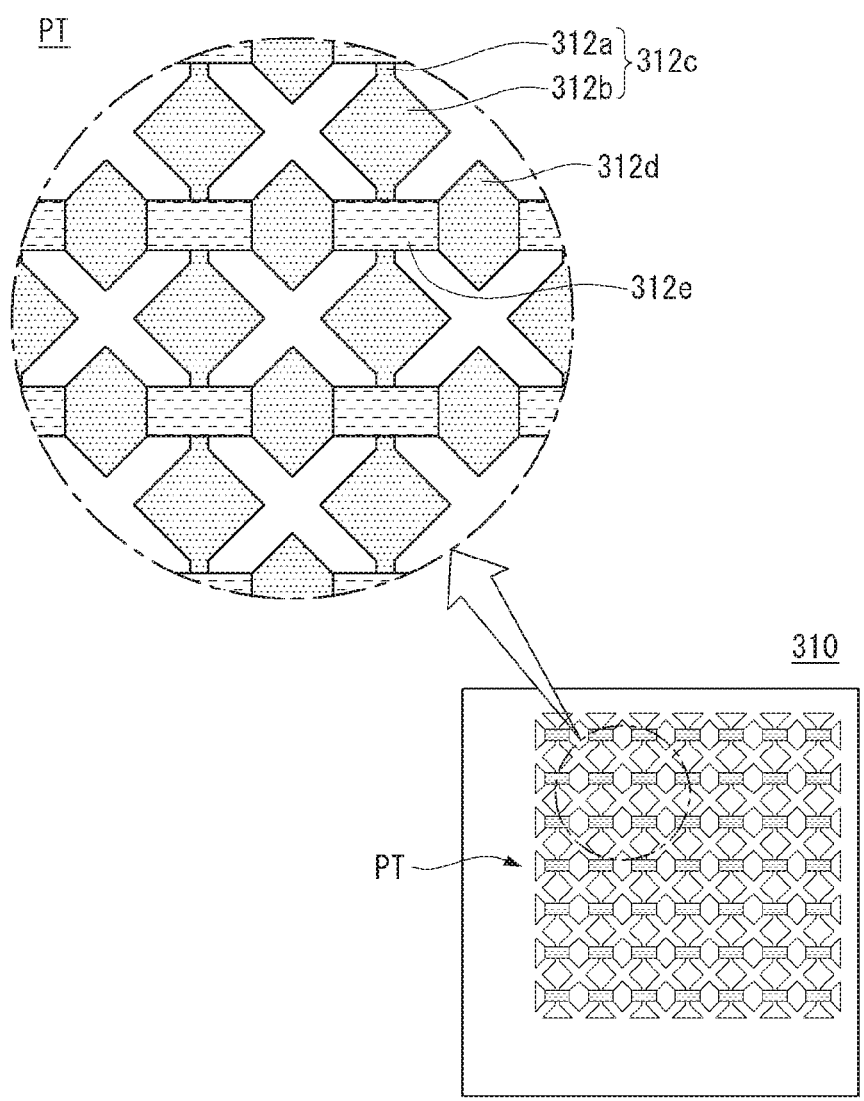

As shown in FIG. 15, an insulating layer 312e may be formed on the pattern PT.

The insulating layer 312e can prevent a short circuit between the first pattern 312c positioned under the insulating layer 312e and a bridge sensor pattern 312g (see FIG. 18) positioned on the insulating layer 312e. Namely, the insulating layer 312e may be a structure for insulation between the driving electrode and the sensing electrode.

The insulating layer 312e may be formed in a minimum area. For example, the insulating layer 312e may be configured such that the second patterns 312d are connected. In other words, the insulating layer 312e may be formed over the two second patterns 312d and the connection portion 312a of the first pattern 312c. Because the insulating layer 312e is formed in the minimum area, the consumption of material required to form the insulating layer 312e can be minimized.

Figure 16:
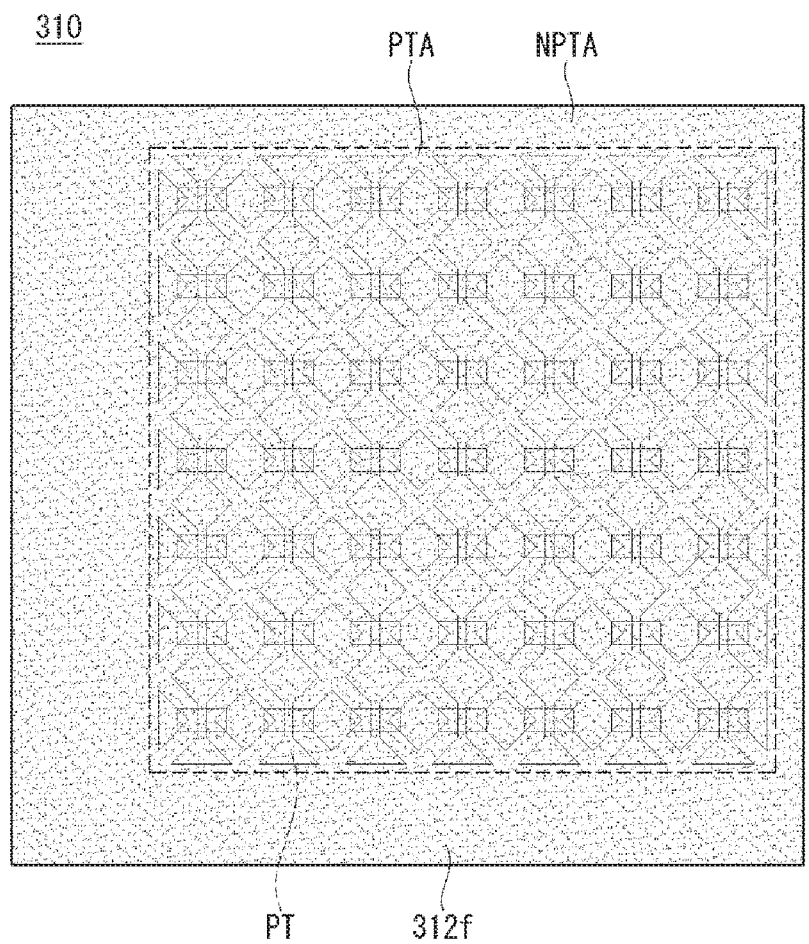

As shown in FIG. 16, a photosensitive paste 312f may be applied on the pattern PT on which the insulating layer 312e is formed. The photosensitive paste 312f may be applied to an area including a pattern area PTA, in which the pattern PT is formed, and a non-pattern area NPTA outside the pattern area PTA. The photosensitive paste 312f may go through a temporary hardening process.

The photosensitive paste 312f may be a silver ink. Namely, the photosensitive paste 312f may be formed by printing the silver ink. Configuration of the silver ink constituting the photosensitive paste 312f may be different from configuration of the silver nanowire layer 312 formed on the base film 314.

Figure 17:
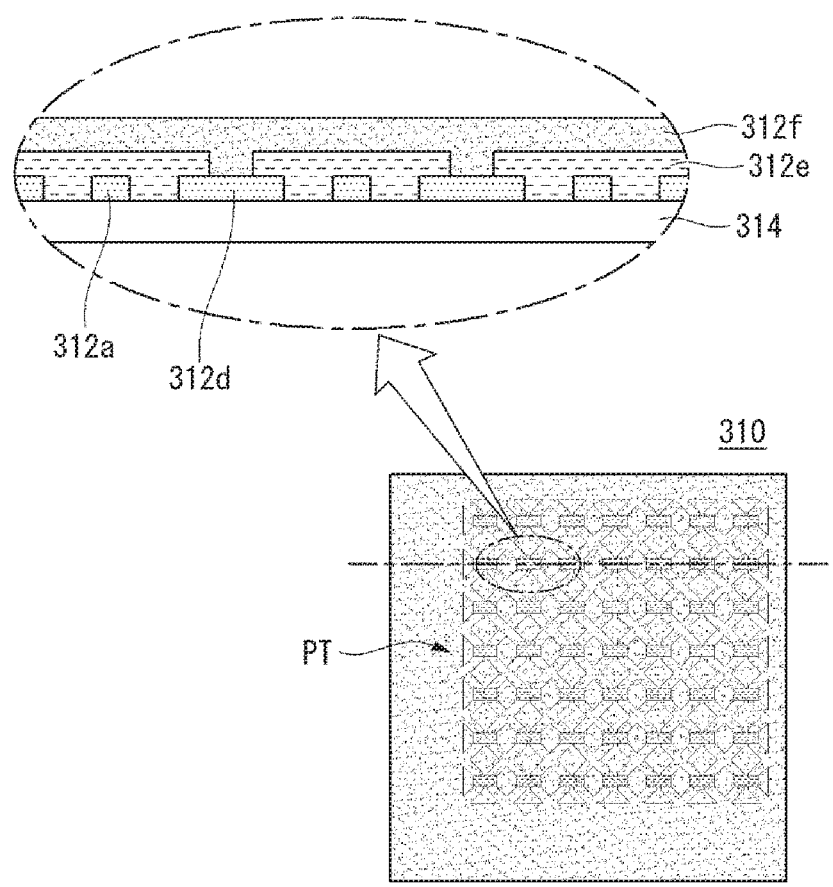

As shown in FIG. 17, in a cross section of the touch sensor 310 on which the application of the photosensitive paste 312f is completed, a pattern may be formed on the base film 314. The insulating layer 312e may be positioned on the two second patterns 312d around the connection portion 312a. The photosensitive paste 312f may be applied to an upper surface including the insulating layer 312e.

Figure 18:
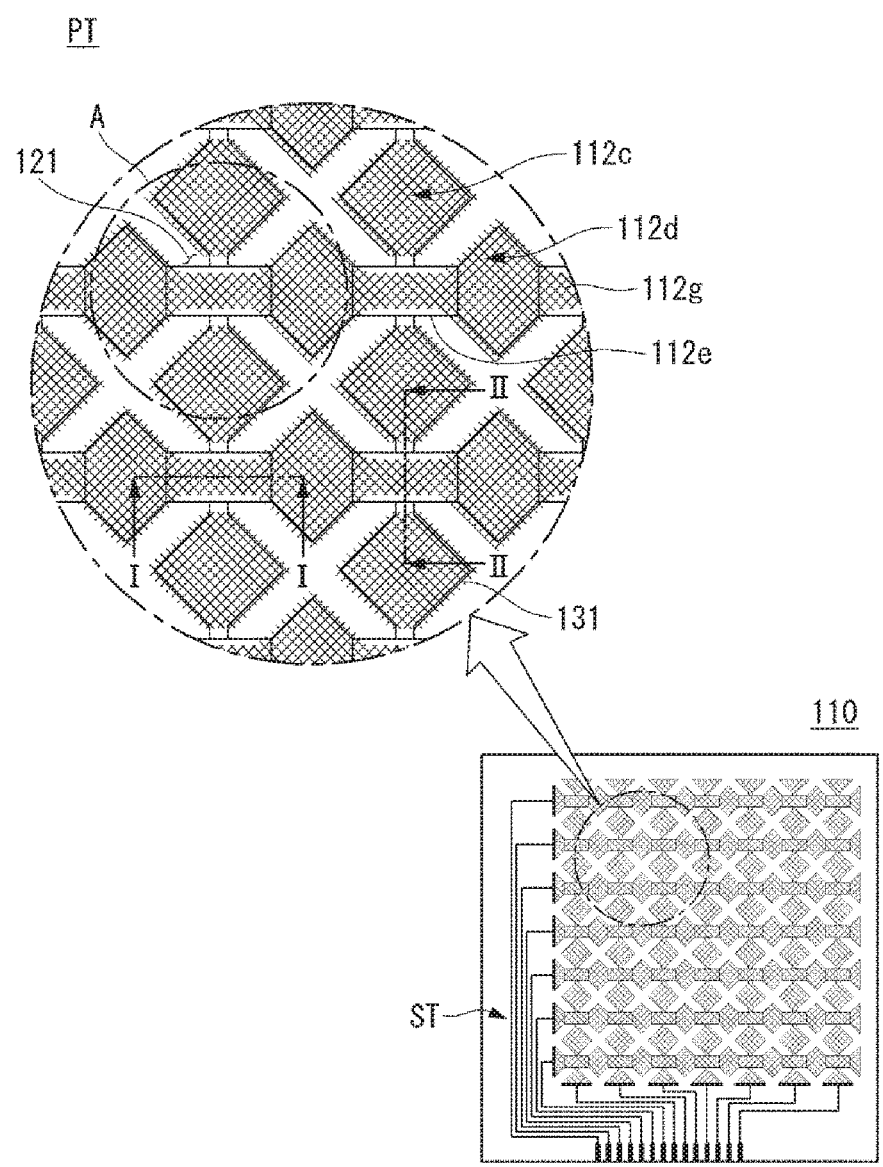

As shown in FIG. 18, when the exposure process and the development process are performed on the photosensitive paste 312f, a sensor pattern 331 of a specific shape may be formed. The sensor pattern 331 may be a mesh-shaped pattern. Namely, the sensor pattern 331 may be formed in the form of a mesh entangled in the vertical and horizontal directions.

The sensor pattern 331 may be formed on the first and second patterns 312c and 312d that have been already formed. Namely, the sensor pattern 331 is not formed in a blank area 121 where the first and second patterns 312c and 312d are not positioned. In other words, the sensor pattern 331 may overlap the first and second patterns 312c and 312d.

The sensor pattern 331 may include the bridge sensor pattern 312g. The bridge sensor pattern 312g may be the sensor pattern 331 formed on the insulating layer 312e. A region of the bridge sensor pattern 312g may be smaller than a region of the insulating layer 312e.

The first pattern 312c may include a formation area of the mesh-shaped sensor pattern 331 and an application area of the insulating layer 312e. This is different from the second pattern 312d, of which the entire portion is applied (or coated) with the mesh-shaped sensor pattern 331.

Figure 19:
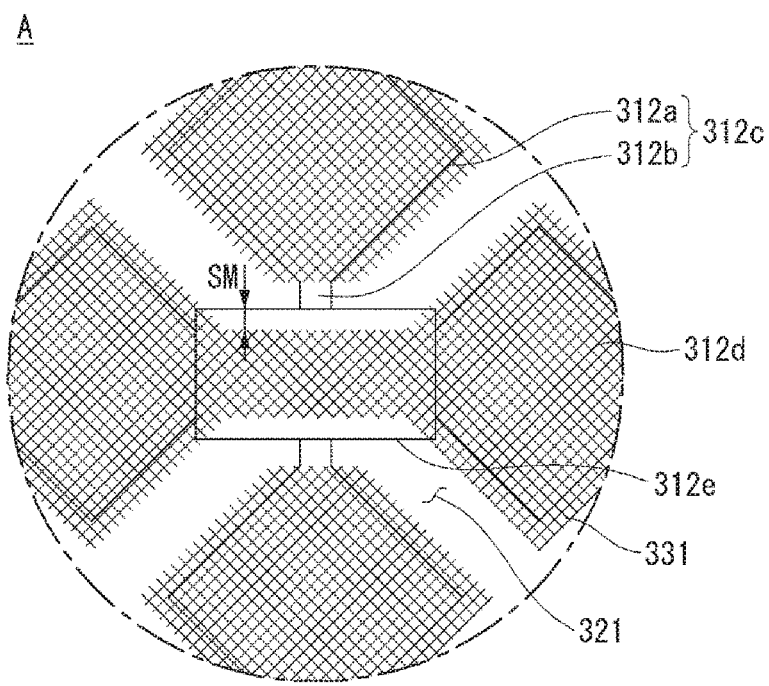

FIG. 19 is a partial enlarged view of the sensor pattern 331.

As shown in FIG. 19, the sensor pattern 331 may be formed in a lattice shape. Because the sensor pattern 331 is formed in the lattice shape, the signal can be transmitted through other signal lines even when some signal lines are damaged.

The bridge sensor pattern 312g may be the sensor pattern 331 for connecting the plurality of second patterns 312d. The bridge sensor pattern 312g may be the sensor pattern 331 corresponding to the insulating layer 312e. The bridge sensor pattern 312g may be formed smaller than the insulating layer 312e by a safety margin SM. Thus, a phenomenon that the bridge sensor pattern 312g is short-circuited with the first pattern 312c can be prevented in advance.

Figure 20:
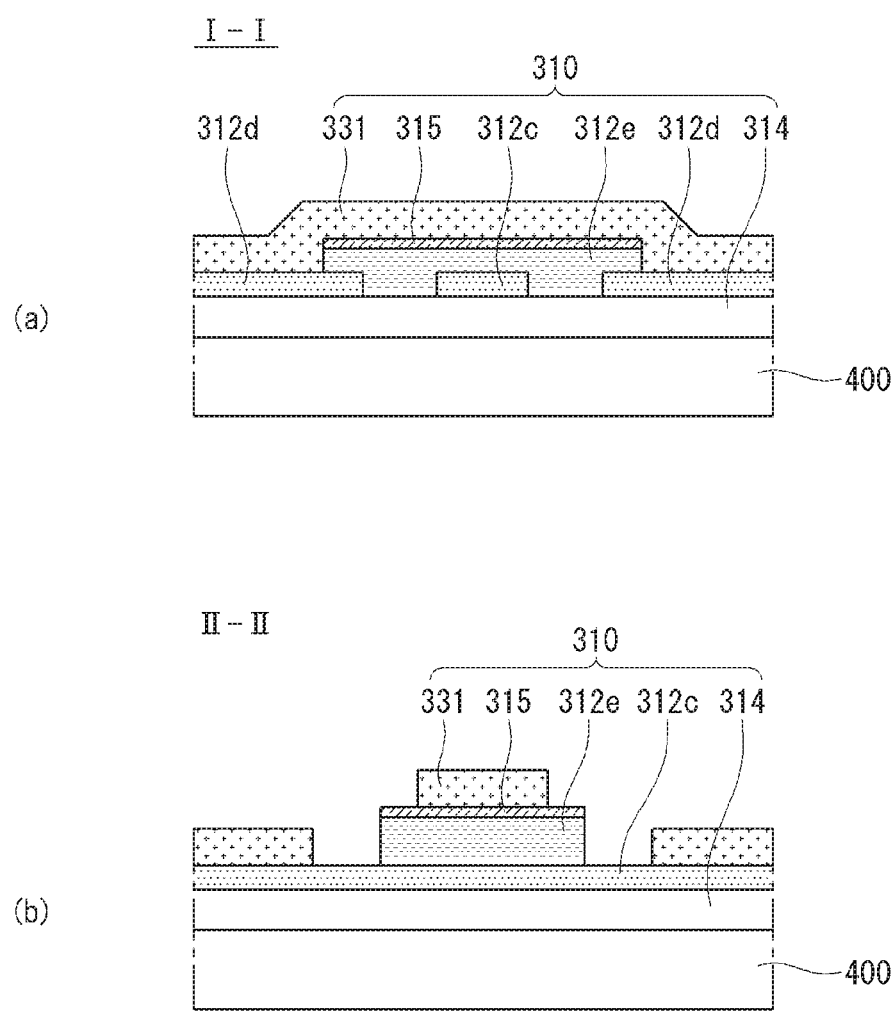

(a) of FIG. 20 is a cross-sectional view taken along line I-I' of FIG. 18.

The touch sensor 310 may be attached to the rear surface of the glass 400. An adhesive layer (for example, an OCA layer) may be positioned between the glass 400 and the base film 314 of the touch sensor 310.

The insulating layer 312e may be positioned on the plurality of second patterns 312d.

An overcoat layer 315 for protecting the insulating layer 312e may be formed on the insulating layer 312e.

The plurality of second patterns 312d may be connected by the sensor pattern 331. Thus, the plurality of second patterns 312d can be electrically connected without the electrical contact between the second patterns 312d and the first patterns 312c.

(b) of FIG. 20 is a cross-sectional view taken along line II-II' of FIG. 18.

The insulating layer 312e may be positioned on the first pattern 312c, and the overcoat layer 315 may be positioned on the insulating layer 312e.

The sensor pattern 331 may be formed on the overcoat layer 315. The sensor pattern 331 may be positioned in the region of the insulating layer 312e. Therefore, the sensor pattern 331 on the overcoat layer 315 forming the path of the first and second patterns 312c and 312d can be electrically insulated.

Figure 21:
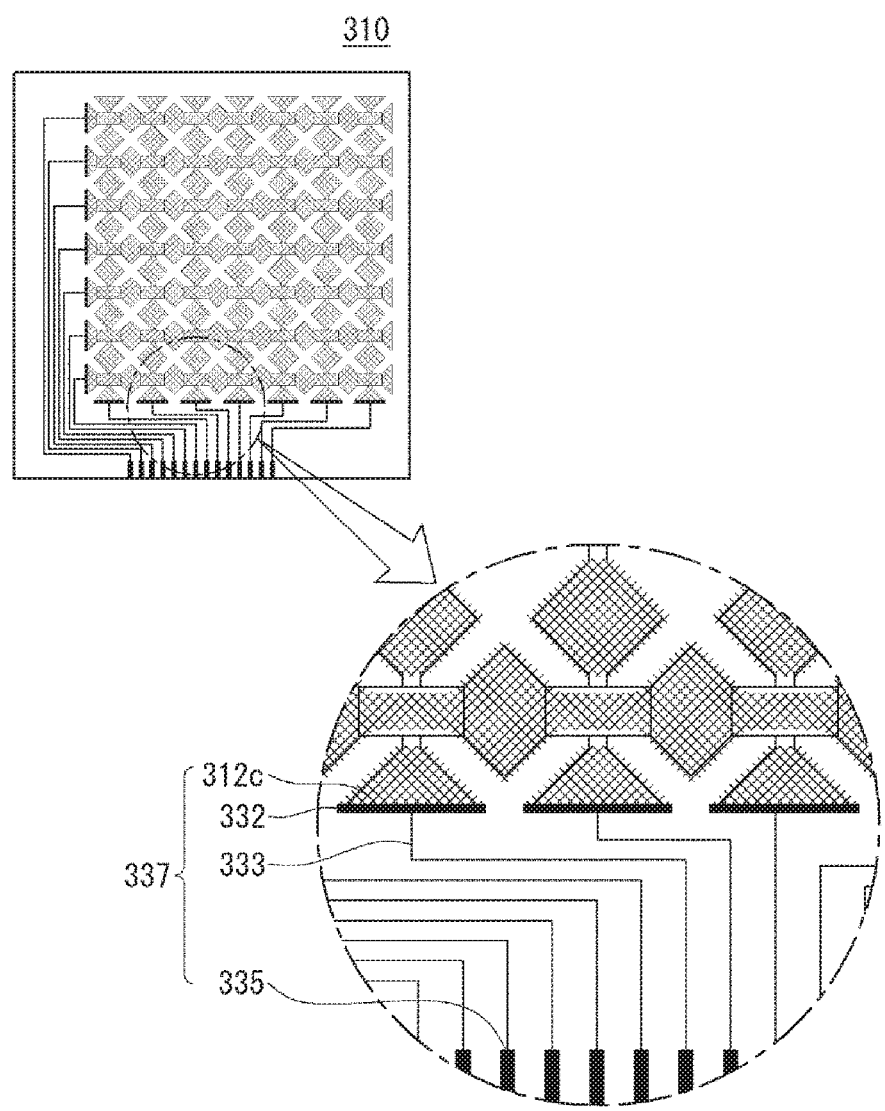

As shown in FIG. 21, a trace 337 may be formed at the same time as the formation of the sensor pattern 331.

The trace 337 may be a path for supplying a signal to the electrode or for transmitting a signal from the electrode. The trace 337 may be formed together with the sensor pattern 331 in the processes for exposing and developing the photosensitive paste 312f (see FIG. 6). Thus, the touch sensor 310 can be simply manufactured, as compared to the related art requiring a separate process for forming the trace 337.

The trace 337 may be made of the same material as the sensor pattern 331. Namely, the trace 337 and the sensor pattern 331 are made of the same material because they are formed together through the processing of the photosensitive paste 312f (see FIG. 6).

The trace 337 includes a first terminal 332 connected to the pattern, a line 333 connected to the first terminal 332, and a second terminal 335 provided at an end of the line 333. A cable connector may be connected to the second terminal 335.

FIGS. 22 to 24 illustrate a method of manufacturing a touch sensor according to another embodiment of the disclosure.

Hereinafter, a difference between the method of manufacturing the touch sensor described above and a method of manufacturing a touch sensor described with reference to FIGS. 22 to 24 is mainly described.

As shown in FIG. 22, a first pattern 312c may be formed. Namely, the first pattern 312c may be formed by etching the material. In this instance, unlike the above embodiment of the disclosure, a second pattern 312d (see FIG. 14) may not be formed. Namely, a formation portion of the second pattern 312d may remain as a blank 341.

As shown in FIG. 23, an insulating layer 312e may be applied on a touch sensor 310 on which the first pattern 312c is formed. The insulating layer 312e may be applied to a corresponding area including the first pattern 312c. The insulating layer 312e may be applied to the corresponding area except an end 312ce of the first pattern 312c. The end 312ce may be excluded from the application of the insulating layer 312e, so as to contact a first terminal 331 (see FIG. 24) of a trace 337 (see FIG. 24).

As shown in FIG. 24, the second pattern 312d intersecting the first pattern 312c may be formed. The second pattern 312d may be a sensor pattern 331 formed by exposing and developing a photosensitive paste 312f (see FIG. 16). The trace 337 may be formed simultaneously with the second pattern 312d.

When the method of manufacturing the touch sensor 310 according to another embodiment of the disclosure is used, a measurement, etc. for applying the insulating layer 312e to a specific location may not be necessary. Namely, because a precise control process for selectively applying the insulating layer 312e to a small specific area is not necessary, the method of manufacturing the touch sensor 310 can be performed more quickly. Further, in the method of manufacturing the touch sensor 310 according to another embodiment of the disclosure, the first pattern 312c and the second pattern 312d can be more completely insulated by applying the insulating layer 312e to the entire area.

FIGS. 25 and 26 illustrate a method of manufacturing a touch sensor according to yet another embodiment of the disclosure.

As shown in (a) of FIG. 25, a silver nanowire layer 312 may be applied.

As shown in (b) of FIG. 25, a first pattern 312c may be formed to form a first trace 337a. Namely, the first pattern 312c and the first trace 337a corresponding to the first pattern 312c may be formed together by performing an etching process on a silver nanowire layer 312 applied to the entire surface.

As shown in (a) of FIG. 26, an insulating layer 312e may be applied to a pattern area PTA including the first pattern 312c and a trace area PTT adjacent to the first trace 337a.

As shown in (b) of FIG. 26, a second pattern 312d may be formed by performing an exposure process and a development process using a photosensitive paste 312f (see FIG. 16) on an area corresponding to the insulating layer 312e. Further, a second trace 337b corresponding to the second pattern 312d may be formed at the same time as the formation of the second pattern 312d. The second trace 337b may be a signal transmission path of the touch sensor 310 together with the already formed first trace 337a.

FIG. 27 is a plan view of a touch panel according to another embodiment of the disclosure. FIG. 28 is a schematic cross-sectional view taken along line I-I of FIG. 27. FIG. 27 shows the touch panel focusing on first and second electrodes 54 and 64 for the sake of clarity and simplicity.

Referring to FIGS. 27 and 28, a touch panel 500 according to another embodiment of the disclosure may include an effective area AA and a non-effective area NA positioned outside the effective area AA. Since the effective area AA and the non-effective area NA were sufficiently described above, a description thereof will be omitted.

The touch panel 500 according to the embodiment of the disclosure includes a conductive film 510. A first sensor unit 542 (additionally, a first wiring portion 544) of a first electrode 54 is formed on one surface of the conductive film 510, and a second sensor unit 642 (additionally, a second wiring portion 644) of a second electrode 64 is formed on the other surface of the conductive film 510. In this instance, the embodiment of the disclosure can improve characteristics of the touch panel 500 while simplifying a structure of the touch panel 500 or the conductive film 510 by changing resistances of the first and second sensor units 542 and 642, formation areas of the first and second sensor units 542 and 642, filling densities of conductors 54a and 64a inside the first and second sensor units 542 and 642, and the like.

The touch panel 100 may further include a cover substrate 530 and a transparent adhesive layer 520 for attaching the cover substrate 530 to the conductive film 510. However, the cover substrate 530 and the transparent adhesive layer 520 are not necessarily and may be variously changed.

The cover substrate 530 can protect the touch panel 500 from an external impact and transmit light through the touch panel 500. The cover substrate 530 may be made of a material capable of transmitting light. For example, the cover substrate 530 may include glass, plastic, and the like. However, embodiments are not limited thereto, and other materials may be used for the cover substrate 530. Alternatively, the cover substrate 530 may be omitted.

The transparent adhesive layer 520 may be positioned between the cover substrate 530 and the conductive film 510 and may bring the cover substrate 530 into contact with the conductive film 510. The touch panel 500 can simplify a laminated structure of the cover substrate 530 and the conductive film 510 by using the transparent adhesive layer 520 of a single-layered structure. Hence, an entire thickness of the touch panel 500 can decrease.

The transparent adhesive layer 520 may be made of a material having adhesive characteristics capable of attaching layers positioned on both sides of the transparent adhesive layer 520 and transparency. Namely, the transparent adhesive layer 520 may include optically clear adhesive (OCA). The optically clear adhesive may include a material having an excellent adhesive strength and excellent in moisture resistance, heat-resistant foamability, processability, and the like so as to prevent deterioration of the first and/or second electrodes 54 and 64.

The conductive film 510 may include a base layer 51, the first electrode 54, the second electrode 64, and an insulating layer 66.

The base layer 51 may be a film, a sheet, or the like, which is made of a material having transparency and insulation while maintaining a mechanical strength of the conductive film 510. The base layer 51 may be made of substantially the same material as the base film 10 described above. Thus, a detailed description thereof will be omitted.

The first electrode 54 may be formed on one surface of the base layer 51. The first electrode 54 may include the first sensor unit 542 positioned in the effective area AA and the first wiring portion 544 electrically connected to the first sensor unit 542 in the non-effective area NA.

The first sensor unit 542 includes first sensor portions 542a and a first connection portion 542b connecting the first sensor portions 542a.

The first sensor portion 542a has an area greater than the first connection portion 542b and is a portion substantially determining whether or not the user touches the touch panel 500 with an input device such as a finger and a stylus pen. The first sensor portion 542a may have various shapes including a triangle, a polygon such as a quadrangle, a circle or an oval, etc. Namely, the first sensor portion 542a may be randomly formed in an irregular shape. The first sensor portions 542a of the irregular shape are disposed in the effective area AA together with the second sensor portions 642a of the second sensor unit 642, thereby efficiently sensing a touch operation.

The first connection portion 542b can connect the plurality of first sensor portions 542a in a first direction (a horizontal direction or an x-axis direction in the drawings). Hence, the first sensor unit 542 may be extended in the first direction in the effective area AA.

In the embodiment of the disclosure, the first sensor unit 542 may include a transparent conductive material having conductivity and transparency.

The first sensor unit 542 may include the first conductor 54a made of metal nanomaterials having spherical particles or polygonal solid particles. The first conductor 54a may include metal nano-spherical particles such as silver (Ag) nano-spherical particles, copper nano-spherical particles, and platinum nano-spherical particles. It is preferable that the first conductor 54a includes silver nano-spherical particles.

The first conductor 54a may be configured such that a plurality of conductors formed of spherical particles or flake particles are tangled with each other having contact points between them to form an irregular net structure, an irregular mesh structure, a line structure, and the like, and are electrically connected to each other through the contact points.

In the embodiment of the disclosure, the first sensor unit 542 includes the first conductors 54a of nanomaterials formed of the spherical particles, thereby reducing the material cost and improving various characteristics.

The first wiring portions 544 may be positioned in the non-effective area NA. The first wiring portions 544 may be extended and connected to a first flexible printed circuit board 59. The first wiring portion 544 may include a different structure, a different material, etc. from the first sensor unit 542. This will be described in detail later.

The first wiring portion 544 may be positioned on the same plane as the first sensor unit 542, and thus the side of the first wiring portion 544 may contact the side of the first sensor unit 542. Hence, the first wiring portion 544 and the first sensor unit 542 may be electrically connected.

The first wiring portion 544 may contact the first flexible printed circuit board 59 and thus may be connected to the outside. The first flexible printed circuit board 59 may include a base member and a wiring portion on the base member. The first wiring portion 544 contacts the wiring portion of the first flexible printed circuit board 59, and thus the first wiring portion 544 and the first flexible printed circuit board 59 may be electrically connected.

However, embodiments are not limited thereto. For example, a conductive adhesive member (not shown) such as an anisotropic conductive adhesive (ACA), an anisotropic conductive paste (ACP), and an anisotropic conductive film (ACF) may be positioned between the wiring portion of the first flexible printed circuit board 59 and the first wiring portion 544 and thus may electrically connect the wiring portion of the first flexible printed circuit board 59 to the first wiring portion 544.

FIG. 27 illustrates that the first wiring portions 544 are positioned at both ends of the first sensor unit 542 and have a double routing structure, by way of example. The double routing structure reduces a resistance of the first sensor unit 542 and prevents a loss resulting from the resistance because the first sensor unit 542 is relatively elongated. However, embodiments are not limited thereto, and various structures may be used. For example, the first wiring portions 544 may be positioned at only one end of the first sensor unit 542 and have a single routing structure.

The embodiment of the disclosure described that the first wiring portions 544 are connected to the outside through the two non-effective areas NA positioned on both sides of the effective area AA. However, embodiments are not limited thereto, and various structures may be used. For example, the first wiring portions 544 may be connected to the outside through one non-effective area NA positioned on one side of the effective area AA. Alternatively, the first wiring portions 544 may be extended to one of upper and lower sides of the effective area AA and may be connected to the outside at the extended side.

The second electrode 64 may be formed on the other surface of the base layer 51. The second electrode 64 may include the second sensor unit 642 positioned in the effective area AA and the second wiring portion 644 electrically connected to the second sensor unit 642 in the non-effective area NA.

The second sensor unit 642 may include second sensor portions 642a and a second connection portion 642b connecting the second sensor portions 642a. The second sensor portion 642a may have various shapes including a triangle, a polygon such as a quadrangle, a circle or an oval, etc. The second sensor portions 642a are disposed in the effective area AA together with the first sensor portions 542a of the first sensor unit 542, thereby efficiently sensing a touch operation.

As described above, the second sensor unit 642 may include the second sensor portions 642a and the second connection portion 642b connecting the second sensor portions 642a.

The second sensor portion 642a has a width greater than the second connection portion 642b and is a portion substantially determining whether or not the user touches the touch panel 500 with an input device such as a finger and a stylus pen, together with the first sensor portion 542a. The second sensor portion 642a may have various shapes including a triangle, a polygon such as a quadrangle, a circle or an oval, etc. The second sensor portions 642a occupy a wide area of the effective area AA together with the first sensor portions 542a of the first sensor unit 542, thereby efficiently sensing a touch operation.

In the embodiment of the disclosure, the second sensor unit 642 may include a transparent conductive material having conductivity and transparency. The second sensor unit 642 may include the second conductor 64a made of metal nanomaterials having a network structure. The second conductor 64a may include metal nanowires such as silver (Ag) nanowires, copper nanowires, and platinum nanowires. In embodiments of the disclosure, the network structure may be defined as a structure in which adjacent conductors of nanomaterials such as nanowires are tangled with each other having contact points between them to form an irregular net structure, an irregular mesh structure, and the like, and are electrically connected to each other through the contact points.

The second connection portion 642b can connect the plurality of second sensor portions 642a in a second direction (a vertical direction or a y-axis direction in the drawings). Hence, the second sensor unit 642 may be extended in the second direction in the effective area AA.

The description of the first sensor unit 542 may be applied to the second sensor unit 642, except an extension direction of the second sensor unit 642. The second wiring portion 644 may be positioned in the non-effective area NA. The second wiring portion 644 may be extended and connected to a second flexible printed circuit board 29.

FIG. 27 illustrates that the second wiring portions 644 have a single routing structure, by way of example. Hence, the second wiring portion 644 may be formed in the non-effective area NA positioned on the lower side of the effective area AA. However, embodiments are not limited thereto, and various structures may be used. For example, the second wiring portion 644 may be positioned on at least one of the upper, lower, left, and right sides of the effective area AA.

Since the descriptions of the first wiring portions 544 and the first flexible printed circuit board 59 may be applied to the second wiring portions 644 and the second flexible printed circuit board 69, a detailed description thereof will be omitted.

The insulating layer 66 may be formed on the other surface of the base layer 51 to cover the second electrode 64. The insulating layer 66 may form an outer surface of the base layer 51 and protect the conductive film 510. The insulating layer 66 may have a low dielectric constant. Because the insulating layer 66 is positioned between the conductive film 510 and a display panel, the insulating layer 66 having the low dielectric constant can prevent a noise of the display panel from being transferred to the conductive film 510 sensing a touch operation. However, embodiments are not limited thereto. Other materials, other hardnesses, other thicknesses, etc. may be used for the insulating layer 66.

FIG. 28 illustrates that the insulating layer 66 is positioned on the second electrode 64, by way of example. However, embodiments are not limited thereto. For example, when the second electrode 64 is positioned at the cover substrate 530 and the first electrode 54 is positioned opposite the second electrode 64, the insulating layer 66 may be formed to cover the first electrode 54.

The conductive film 510 may further include a first hard coat layer (not shown) and an overcoat layer (not shown) between the base layer 51 and the first electrode 54, and a second hard coating layer (not shown) between the base layer 51 and the second electrode 64. A detailed description thereof has been already given above, and thus will be omitted.

FIG. 29 is another example of a schematic cross-sectional view taken along line I-I of FIG. 27.

Referring to FIG. 29, a touch panel 500 according to another embodiment of the disclosure includes a conductive film 510. A first sensor unit 542 (additionally, a first wiring portion 544) of a first electrode 54 is formed on one surface of the conductive film 510, and a second sensor unit 642 (additionally, a second wiring portion 644) of a second electrode 64 is formed on the other surface of the conductive film 510. In this instance, the embodiment of the disclosure can improve characteristics of the touch panel 500 while simplifying a structure of the touch panel 500 or the conductive film 510 by changing resistances of the first and second sensor units 542 and 642, formation areas of the first and second sensor units 542 and 642, filling densities of conductors 54a and 64a inside the first and second sensor units 542 and 642, and the like.

The touch panel 500 according to another embodiment of the disclosure may include a cover substrate 530, the conductive film 510, and a transparent adhesive layer 520. The conductive film 510 may include a base layer 51, the first electrode 54, the second electrode 64, and an insulating layer 66. Descriptions overlapping with those described in FIGS. 27 and 28 will be omitted in FIG. 29. In FIG. 29, the second electrode 64 will be mainly described.

The second electrode 64 may be formed on the other surface of the base layer 51. Referring to FIG. 29, the second electrode 64 may include the second sensor unit 642 positioned in an effective area AA and the second wiring portion 644 electrically connected to the second sensor unit 642 in a non-effective area NA.

The second sensor unit 642 may include second sensor portions 642a and a second connection portion 642b connecting the second sensor portions 642a. The second sensor portion 642a may have various shapes including a triangle, a polygon such as a quadrangle, a circle or an oval, etc. The second sensor portions 642a are disposed in the effective area AA together with first sensor portions 542a of the first sensor unit 542, thereby efficiently sensing a touch operation.

As described above, the second sensor unit 642 may include the second sensor portions 642a and the second connection portion 642b connecting the second sensor portions 642a.

The second sensor portion 642a has a width greater than the second connection portion 642b and is a portion substantially determining whether or not the user touches the touch panel 500 with an input device such as a finger and a stylus pen, together with the first sensor portion 542a. The second sensor portion 642a may have various shapes including a triangle, a polygon such as a quadrangle, a circle or an oval, etc. The second sensor portions 642a occupy a wide area of the effective area AA together with the first sensor portions 542a of the first sensor unit 542, thereby efficiently sensing a touch operation.

In the embodiment of the disclosure, the second sensor unit 642 may include a transparent conductive material having conductivity and transparency.

The second sensor unit 642 may include the second conductor 64a made of metal nanomaterials having spherical particles or polygonal solid particles. The second conductor 64a may include metal nano-spherical particles such as silver (Ag) nano-spherical particles, copper nano-spherical particles, and platinum nano-spherical particles. It is preferable that the second conductor 64a includes silver nano-spherical particles.

The second conductor 64a may be configured such that a plurality of conductors formed of spherical particles are tangled with each other having contact points between them to form an irregular net structure, an irregular mesh structure, a line structure, and the like, and are electrically connected to each other through the contact points.

In another embodiment of the disclosure, the second sensor unit 642 includes the second conductors 64a of nanomaterials formed of the spherical particles, thereby reducing the material cost and improving various characteristics.

FIG. 30 illustrates various examples of a conductive film according to an embodiment of the disclosure.

Referring to FIG. 30, a conductive film may be disposed on one surface of a base film, and the base film may be included in the conductive film.

As shown in (a) of FIG. 30, a conductive film 510 may be disposed on one surface of a base film 511. The conductive film 510 may include a base layer 51, a first electrode 54, a second electrode 64, and an insulating layer 66. Since a detailed description of the conductive film 510 has been already described above, the description thereof will be omitted.

The base film 511 may be a film, a sheet, or the like, which is made of a material having transparency and insulation while maintaining a mechanical strength of the conductive film 510. The base film 511 may include at least one of polyethylene, polypropylene, polyethylene terephthalate, polyethylene-2,6-naphthalate, polypropylene terephthalate, polyimide, polyamide-imide, polyether sulfone, polyether ether ketone, polycarbonate, polyarylate, cellulose propionate, polyvinyl chloride, polyvinylidene chloride, polyvinyl alcohol, polyether imide, polyphenylene sulfide, polyphenylene oxide, polystyrene, and the like. However, embodiments are not limited thereto, and other materials may be used for the base film 511.

As shown in (b) of FIG. 30, the base film 511 may be positioned inside the conductive film 510. The conductive film 510 may include the base film 511, the first electrode 54, the second electrode 64, and the insulating layer 66.

The base film 511 may be a film, a sheet, or the like, which is made of a material having transparency and insulation while maintaining a mechanical strength of the conductive film 510.

The first electrode 54 may be formed on one surface of the base film 511. The first electrode 54 may include a first sensor unit 542 (see FIG. 27) positioned in an effective area AA (see FIG. 27) and a first wiring portion 544 (see FIG. 27) electrically connected to the first sensor unit 542 in a non-effective area NA (see FIG. 27).

The second electrode 64 may be formed on the other surface of the base film 511. The second electrode 64 may include a second sensor unit 642 (see FIG. 27) positioned in the effective area AA and a second wiring portion 644 (see FIG. 27) electrically connected to the second sensor unit 642 in the non-effective area NA.

The insulating layer 66 may be formed on the other surface of the base film 511 to cover the second electrode 64. The insulating layer 66 may form an outer surface of the base film 511 and protect the conductive film 510. The insulating layer 66 may have a low dielectric constant. Because the insulating layer 66 is positioned between the conductive film 510 and a display panel, the insulating layer 66 having the low dielectric constant can prevent a noise of the display panel from being transferred to the conductive film 510 sensing a touch operation.

As described above, the conductive film 510 according to the embodiment of the disclosure may be disposed at various positions in consideration of the product, use of the product, environmental conditions in which the product is placed, and the like.

FIG. 31 illustrates a moiré shape varying depending on a shape of a first electrode and a shape of a second electrode in accordance with an embodiment of the disclosure.

As shown in (a1) of FIG. 31, a pitch of a shape of a first electrode 54 and a pitch of a shape of a second electrode 64 may be 240 μm to 360 μm, and a bias angle may be 20° to 40°. An air gap (or a separation area) of a predetermined thickness may be provided between a display panel 500 and a touch screen panel TSP. In this instance, both the shape of the first electrode 54 and the shape of the second electrode 64 have a regular pattern. Namely, both a shape of a first sensor portion 542a and a shape of a second sensor portion 642a may have a regular pattern. For example, the shape of the first sensor portion 542a and the shape of the second sensor portion 642a may be inclined in a horizontal direction and a vertical direction of the touch panel 500 and may intersect with each other to form a rhombic shape. Alternatively, the shape of the first sensor portion 542a and the shape of the second sensor portion 642a may be regularly formed in a triangle, a rectangle, a parallelogram, and a pentagon.

As described above, when the shape of the first sensor portion 542a and the shape of the second sensor portion 642a repeat the regular pattern, moiré phenomenon may be generated as shown in (a2) of FIG. 31. Namely, the moiré phenomenon may occur when a regular shape is repeated. The moiré phenomenon shown in (a2) of FIG. 31 was marked as good in a sensory evaluation which was confirmed by the eyes of the general user, but was marked as bad in an image quality evaluation tool.

As shown in (b1) of FIG. 31, a pitch of a shape of the first electrode 54 and a pitch of a shape of the second electrode 64 may be random pitches of 50 μm to 350 μm. An air gap (or a separation area) of a predetermined thickness may be provided between the display panel 500 and the touch screen panel TSP. In this instance, one of the shape of the first electrode 54 and the shape of the second electrode 64 has substantially an irregular pattern. Namely, at least one of a shape of the first sensor portion 542a and a shape of the second sensor portion 642a may have an irregular pattern. For example, the shape of the first sensor portion 542a or the shape of the second sensor portion 642a may be randomly formed in a triangle, a rectangle, a parallelogram, a pentagon, and an irregular shape. In particular, when the shape of the first electrode 54 or the shape of the second electrode 64 has the pentagon or the irregular shape, a first sensor unit 542 or a second sensor unit 642 has an irregular shape. Therefore, as shown in (b2) of FIG. 31, the moiré phenomenon generated when the regular shape is repeated can be prevented in advance. Hence, the pattern shown in (b2) of FIG. 31 was marked as good in the sensory evaluation which was confirmed by the eyes of the general user, and was marked as good in the image quality evaluation tool because the moiré phenomenon is not generated.

FIG. 32 illustrates a first conductor according to an embodiment of the disclosure. FIG. 33 illustrates that a plurality of first conductors according to an embodiment of the disclosure contacts one another. FIG. 34 illustrates a linewidth formed by first conductors according to an embodiment of the disclosure.

Referring to FIG. 32, the first conductor 54a may include spherical particles, flake particles, and the like. The spherical particles and the flake particles may have a predetermined diameter or a predetermined width. The first conductor 54a may include metal nano-spherical particles such as silver nano-spherical particles, copper nano-spherical particles, and platinum nano-spherical particles. It is preferable that the first conductor 54a includes silver nano-spherical particles.

The silver nano-spherical particle may have a diameter of 100 μm to 300 μm. The first sensor unit 542 can implement a fine linewidth and at the same time reduce a specific resistance because the spherical particle of the first conductor 54a has a diameter of 100 μm to 300 μm.

Because the spherical particle of the first conductor 54a has the diameter of 100 μm to 300 μm as described above, relatively more silver nano-spherical particles can be disposed in contact with each other in the same area of the first conductor 54a. The number of contact points 54a1 of the first conductor 54a of the first sensor unit 542 may be 100,000 to 1,000,000 number/mm$^2$. When the number of contact points 54a1 of the first conductor 54a is 100,000 to 1,000,000 number/mm$^2$, the first sensor unit 542 can have the low resistance and excellent electrical characteristics.

As shown in FIG. 33, because the adjacent silver nano-spherical particles of the first conductor 54a can have more contact points, a contact area of the first conductor 54a can increase. When a contact area between the adjacent first conductors 54a increases, an electric current via the silver nano-spherical particles can stably flow. Hence, a specific resistance of the first conductor 54a of the first sensor unit 542 can be reduced to 5 μΩcm to 250 μΩcm.

The first sensor unit 542 can reduce the specific resistance of the first conductor 54a to 5 μΩcm to 250 μΩcm and thus can decrease a silver content of a photosensitive silver paste. Namely, the first sensor unit 542 can increase the contact area between the silver nano-spherical particles of the first conductor 54a and reduce the specific resistance of the first conductor 54a. Hence, the first sensor unit 542 can decrease the silver content of the photosensitive silver paste.

When the specific resistance of the first conductor 54a exceeds 250 μΩcm, the current of the first sensor unit 542 cannot stably flow because a resistance per the same area increases. Thus, the first sensor unit 542 cannot decrease the silver content of the photosensitive silver paste. Further, it is preferable that the specific resistance of the first conductor 54a is zero (0 μΩcm), but it is practically impossible. Hence, it is preferable that the first sensor unit 542 adjusts the specific resistance of the first conductor 54a to 5 μΩcm to 250 μΩcm.

A related art sensor unit adjusted a silver content of a photosensitive silver paste to 80 wt % to 90 wt %. On the other hand, the first sensor unit 542 according to the embodiment of the disclosure can further reduce the silver content than the related art silver content (i.e., 80 wt % to 90 wt %) because the specific resistance of the first conductor 54a is relatively reduced as the size of the silver nano-spherical particles of the first conductor 54a decreases and the contact area of the first conductor 54a increases. Hence, the first sensor unit 542 according to the embodiment of the disclosure can adjust the silver content of the photosensitive silver paste to 65 wt % to 75 wt %.

The first sensor unit 542 can relatively increase a binder content of the photosensitive silver paste by reducing the silver content of the photosensitive silver paste as described above. Hence, binding characteristics of the first sensor unit 542 can be improved, and flexible characteristics can be obtained.

As shown in FIG. 34, because the diameter of the first conductor 54a can be set to 100 μm to 300 μm, a linewidth of the first sensor unit 542 can decrease. The fine linewidth of the first sensor unit 542 can be implemented by decreasing the diameter of the silver nano-spherical particle.

(a) of FIG. 34 illustrates a linewidth of the first sensor unit 542 when the diameter of the first conductor 54a is 300 μm or more. When the diameter of the silver nano-spherical particle of the first conductor 54a is 300 μm or more as shown in (a) of FIG. 34, it is very difficult to implement the fine linewidth of the first sensor unit 542. Although the fine linewidth of the first sensor unit 542 is implemented when the diameter of the first conductor 54a is 300 μm or more, the number of contact points between the adjacent silver nano-spherical particles decreases. Thus, the contact area decreases. Hence, the specific resistance of the first conductor 54a may increase. There is a limit to a reduction in the silver content of the photosensitive silver paste when the specific resistance of the first conductor 54a increases.

(b) of FIG. 34 illustrates a linewidth of the first sensor unit 542 when the diameter of the first conductor 54a is 100 μm to 300 μm. When the diameter of the silver nano-spherical particle of the first conductor 54a is 100 μm to 300 μm as shown in (b) of FIG. 34, it is easy to implement the fine linewidth of the first sensor unit 542. When the fine linewidth of the first sensor unit 542 is implemented, the number of contact points between the adjacent silver nano-spherical particles can be maintained at a predetermined number or more. Thus, the contact area does not decrease. Hence, the specific resistance of the first conductor 54a can be reduced. When the specific resistance of the first conductor 54a is reduced, electrical conductivity of the first sensor unit 542 can be improved, and the silver content of the photosensitive silver paste can decrease.

FIG. 35 illustrates that light is reflected depending on a particle size of a first conductor according to an embodiment of the disclosure. FIG. 36 illustrates a reflectance and a color depending on blackening processing according to an embodiment of the disclosure. FIG. 37 illustrates a surface roughness after forming an APS pattern in accordance with an embodiment of the disclosure.

Referring to FIG. 35, light is reflected depending on a particle size of a first conductor. More specifically, (a) of FIG. 35 illustrates that light having a wavelength of about 540 nm to 560 nm is reflected when the diameter of the first conductor 54a is 100 μm or less; (b) of FIG. 35 illustrates that light having a wavelength of about 540 nm to 560 nm is reflected when the diameter of the first conductor 54a is 100 μm to 300 μm; and (c) of FIG. 35 illustrates that light having a wavelength of about 540 nm to 560 nm is reflected when the diameter of the first conductor 54a is 300 μm or more.

As shown in (a) of FIG. 35, when the diameter of the first conductor 54a is 100 µm or less, an upper surface of the first sensor unit 542 may be substantially flat because the silver nano-spherical particles have the very small size. Light having the wavelength of about 540 nm to 560 nm may generate more specular reflection than diffuse reflection on the upper surface of the first sensor unit 542. Hence, because blackening processing of the first sensor unit 542 has to be separately performed, the structure, the manufacturing process, and the like cannot be simplified.

As shown in (b) of FIG. 35, when the diameter of the first conductor 54a is 100 µm to 300 µm, the upper surface of the first sensor unit 542 may be formed in an uneven and rugged shape. Namely, the upper surface of the first sensor unit 542 may have a surface roughness of a predetermined range.

Specular reflection and diffuse reflection of light having the wavelength of about 540 nm to 560 nm may be generated on the upper surface of the first sensor unit 542. In this instance, the diffuse reflection may occur at a lower rate than the specular reflection. The blackening processing of the first sensor unit 542 including the first conductor 54a having the diameter of 100 µm to 300 µm can be prevented from being separately performed, and thus the structure, the manufacturing process, and the like can be simplified. In embodiments disclosed herein, the predetermined range of the surface roughness indicates that a rate between the diffuse reflection and the specular reflection with respect to the light having the wavelength of about 540 nm to 560 nm is 15% to 40%.

As shown in (c) of FIG. 35, when the diameter of the first conductor 54a is 300 µm or more, the upper surface of the first sensor unit 542 may be formed in an uneven and rugged shape because the size of the silver nano-spherical particles increases. Namely, the upper surface of the first sensor unit 542 may have a surface roughness beyond the predetermined range. Hence, the specular reflection and the diffuse reflection of light having the wavelength of about 540 nm to 560 nm may be generated on the upper surface of the first sensor unit 542 at substantially the same rate. As described above, the rate of the diffuse reflection excessively increases, and thus haze may increase.

Referring to FIG. 36, a reflectance and a color are shown depending on blackening processing according to an embodiment of the disclosure.

In embodiments disclosed herein, light may have a wavelength of about 540 nm to 560 nm. A diameter of silver nano-spherical particles of the first conductor 54a may be 100 µm to 300 µm. Change in a reflectance indicates a rate of change in light reflected during the blackening processing.

In (a) of FIG. 36, a reflectance is about 43% to 45%, and a specific resistance is 59 to 61 Ω·cm. In embodiments disclosed herein, the specific resistance is a measure of how hard the material confronts the flow of current, and means the inverse of the conductivity. In (b) of FIG. 36, a reflectance is about 26% to 29%, and a specific resistance is 74 to 76 Ω·cm. In (c) of FIG. 36, a reflectance is about 21% to 23%, and a specific resistance is 94 to 96 Ω·cm. In (d) of FIG. 36, a reflectance is about 14% to 16%, and a specific resistance is 249 to 251 Ω·cm.

(a) and (b) of FIG. 37 illustrate equations and graphs expressing the surface roughness of the upper surface of the first sensor unit 542.

(a) of FIG. 37 illustrates an arithmetic average roughness of the upper surface of the first sensor unit 542. In (a) of FIG. 37, an amplitude parameter may be used to calculate the average of height direction coordinates. The arithmetic average of an absolute value of Z (x) at a reference length can be calculated. In (a) of FIG. 37, "Ra" is the arithmetic average roughness, and "ℓ" is a sampling length. An arithmetic mean deviation of a basic profile may be expressed as "Pa", and an arithmetic mean deviation of a wave profile may be expressed as "Wa".

(b) of FIG. 37 illustrates a total height of a surface roughness of the upper surface of the first sensor unit 542. A total height Rt of a roughness profile can be calculated by a sum of a maximum value Zp of a peak height of a profile curve and a maximum value Zv of a valley depth in an evaluation length instead of a reference length. In (b) of FIG. 37, "Rt" is the total height of the roughness profile, "Zp" is the maximum value of the peak height of the profile curve, and "Zv" is the maximum value of the valley depth. In this instance, a relationship of RtRz (i.e., a maximum height of the roughness profile) can be implemented by all of profile curves. A total height of the basic profile may be expressed as "Pt", and a total height of the wave profile may be expressed as "Wt".

In embodiments of the disclosure, it is preferable that the arithmetic average roughness Ra is 0.9 µm to 1.4 µm, and the total height Rt of the roughness profile is 0.6 µm to 1.8 µm.

When the arithmetic average roughness Ra is 0.9 µm or less or the total height Rt of the roughness profile is 0.6 µm or less, light reflected from the upper surface of the first sensor unit 542 may generate more specular reflection than diffuse reflection. Hence, because blackening processing of the first sensor unit 542 has to be separately performed, the structure, the manufacturing process, and the like cannot be simplified.

When the arithmetic average roughness Ra is 1.4 µm or more or the total height Rt of the roughness profile is 1.8 µm or more, diffuse reflection of light reflected from the upper surface of the first sensor unit 542 may increase, and thus haze may increase.

FIG. 38 illustrates a base layer according to an embodiment of the disclosure.

Referring to (a) and (b) of FIG. 38, a touch panel according to the embodiment of the disclosure may include a cover substrate 530 and a conductive film 510. A transparent adhesive layer 520 (see FIG. 28) may be provided between the cover substrate 530 and the conductive film 510 and may attach the cover substrate 530 to the conductive film 510.

The cover substrate 530 can protect the touch panel from an external impact and transmit light through the touch panel. The cover substrate 530 may be made of a material capable of transmitting light. For example, the cover substrate 530 may include glass, plastic, and the like. However, embodiments are not limited thereto, and other materials may be used for the cover substrate 530. Alternatively, the cover substrate 530 may be omitted.

The conductive film 510 may include a base layer 51, a first electrode 54, and a second electrode 64.

The base layer 51 may include a film, a sheet, or the like, which is made of a material having transparency and insulation while maintaining a mechanical strength of the conductive film 510. The base layer 51 may be formed of a highly transparent insulating layer. The first electrode 54 may be formed on one surface of the base layer 51, and the second electrode 64 may be formed on the other surface of the base layer 51.

The first electrode 54 according to the embodiment of the disclosure may be formed of silver nano-spherical particles having a diameter of 100 µm to 300 µm, and an upper surface of the first electrode 54 may have a surface roughness of a predetermined range. The surface roughness of the upper surface of the first electrode 54n can be improved. When the surface roughness of the upper surface of the first electrode 54n is improved as described above, a thickness of the base layer 51 may relatively increase. The first electrode 54 is formed of the silver nano-spherical particles and can implement a fine linewidth. The thickness of the base layer 51 may increase by a reduction in the linewidth of the first electrode 54.

As the thickness of the base layer 51 increases, a distance between the first electrode 54 and the second electrode 64 may increase. However, a volume and a relative dielectric constant of the base layer 51 may increase by an increase in the thickness of the base layer 51. Because the volume and the relative dielectric constant of the base layer 51 simultaneously increase even if the thickness of the base layer 51 increases, a capacitance can be greatly changed. This is because the capacitance can be obtained by multiplying a reference capacitance obtained in vacuum or air by the relative dielectric constant. Thus, the embodiment of the disclosure can detect more sensitively a touch operation by increasing change in capacitance even when there is a fine touch operation using a finger, a stylus pen, or the like. Namely, when the finger or a conductive object (e.g., the stylus pen) contacts the first electrode 54, a parasitic capacitance is additionally connected to the capacitance to change a value of the capacitance. Thus, because a sensor touched by the finger and a sensor not touched by the finger have different capacitances, the user can determined whether or not the touch operation is performed.

In particular, a resolution of the capacitance can be improved, and a noise between the first electrode 54 and the second electrode 64 can be checked easily. Hence, the embodiment of the disclosure can be easily applied to a smart pen, a touch pen or the like, which is mainly used by professionals or a heavy users requiring a sensitive touch operation.

As the thickness of the base layer 51 increases, the capacitance can be improved. However, as the thickness of the base layer 51 increases, visibility may be reduced. Hence, it is preferable that the thickness of the base layer 51 according to the embodiment of the disclosure is 7 μm to 8 μm. When the thickness of the base layer 51 is 7 μm to 8 μm, the resolution can be improved, and a sensitive touch operation can be sensed while securing the visibility.

FIG. 39 illustrates a first wiring portion and a second wiring portion according to an embodiment of the disclosure.

Referring to FIG. 39, the first electrode 54 according to the embodiment of the disclosure may include the first sensor unit 542 positioned in the effective area AA and the first wiring portion 544 electrically connected to the first sensor unit 542 in the non-effective area NA. The second electrode 64 according to the embodiment of the disclosure may include the second sensor unit 642 positioned in the effective area AA and the second wiring portion 644 electrically connected to the second sensor unit 642 in the non-effective area NA.

The first and second wiring portions 544 and 644 may include metal nanomaterials having spherical particles or polygonal solid particles. The first and second wiring portions 544 and 644 may include metal nano-spherical particles such as silver nano-spherical particles, copper nano-spherical particles, and platinum nano-spherical particles. It is preferable that the first and second wiring portions 544 and 644 include silver nano-spherical particles.

The first and second wiring portions 544 and 644 may be formed of silver nano-spherical particles having a diameter of 100 μm to 300 μm. When the diameter of the silver nano-spherical particles is 100 μm to 300 μm, the first and second wiring portions 544 and 644 can implement the fine linewidth, and at the same time can reduce the specific resistance. Hence, a width of the non-effective area NA can decrease.

The material of the first and second wiring portions 544 and 644 is limited to the silver nano-spherical particles. Other materials may be used. For example, the first and second wiring portions 544 and 644 may be formed of metal nanomaterials having a network structure. For example, the first and second wiring portions 544 and 644 may include metal nanowires such as silver nanowires, copper nanowires, and platinum nanowires.

The first and second wiring portions 544 and 644 implement the fine linewidth, and thus can easily implement a narrow bezel. Further, the first and second wiring portions 544 and 644 may be formed through the same process as the first and second sensor units 542 and 642. Thus, the embodiment of the disclosure can simplify the manufacturing process, as compared to the related art in which the first and second wiring portions 544 and 644 and the first and second sensor units 542 and 642 are individually formed through different processes.

FIG. 40 is a cross-sectional view illustrating configuration of an OLED display including a touch panel according to an embodiment of the disclosure. FIG. 41 illustrates an OLED display including a touch panel that flexibly operates in accordance with an embodiment of the disclosure.

Referring to FIG. 40, an OLED display according to an embodiment of the disclosure may include an organic light emitting diode (OLED), a protective layer, a touch panel TSP, and a cover substrate.

The OLED may be disposed on a thin film transistor substrate TFTA on which data lines, gate lines, and display elements such as thin film transistors are formed.

A planarization layer may be disposed between the OLED and the thin film transistor substrate TFTA to planarize an upper part of the thin film transistor substrate TFTA. The OLED may be disposed on the planarization layer.

The protective layer may include a first protective layer PAS1 and a second protective layer PAS2. The first protective layer PAS1 is disposed to cover the OLED and can prevent the penetration of oxygen or moisture from the outside. The second protective layer PAS2 is disposed on the first protective layer PAS1 and can prevent the penetration of oxygen or moisture from the outside.

The touch panel TSP may be disposed on the second protective layer PAS2. An encapsulation film may be disposed between the touch panel TSP and the second protective layer PAS2.

The cover substrate may be disposed on the touch panel TSP and may include a cover substrate 530 for protecting the touch panel TSP.

A polarizing plate POL may be disposed between the touch panel TSP and the cover substrate to pass light toward a predetermined direction.

As shown in FIG. 41, the OLED display according to the embodiment of the disclosure may maintain a flat shape in a first state. In a second state different from the first state, the OLED display may operate so that one side of the OLED display bends toward the other side of the OLED display. In embodiments disclosed herein, the first state refers to a state in which a screen is displayed through a display device, and the second state refers to a state in which the screen is not displayed through the display device.

The touch panel according to the embodiment of the disclosure may include a conductive film 510 including a first sensor unit 542 (see FIG. 27). The first sensor unit 542 can decrease a silver content of a photosensitive silver paste and increase a binder content by a decrease in the silver content. Hence, the first sensor unit 542 can have flexible characteristics.

The conductive film 510 according to the embodiment of the disclosure can be applied to flexible display devices such as the OLED display and can be stable in terms of the supply and demand of material.

When the conductive film 510 according to the embodiment of the disclosure includes the first sensor unit 542 including the first conductor 54a made of silver nano-spherical particles of nanomaterials, the first sensor unit 542 can transmit light and have a low resistance and excellent electrical characteristics. The silver nano-spherical particles have a resistance of about 5 Ω/sq to 250 Ω/sq and can easily implement a low resistance. In particular, the first sensor unit 542 may have electrical conductivity higher than that of indium tin oxide (ITO) having a resistance of about 200 Ω/sq to 400 Ω/sq. The silver nano-spherical particles may have a transmittance greater than that of indium tin oxide. Further, the first sensor unit 542 can decrease a silver content of a photosensitive silver paste and increase a binder content of the photosensitive silver paste by a decrease in the silver content. Hence, the first sensor unit 542 has flexible characteristics and thus can be applied to flexible display devices. In addition, the first sensor unit 542 can be stable in terms of the supply and demand of material.

Furthermore, the shapes of the first and second electrodes 54 and 64 according to the embodiment of the disclosure can be variously changed. For example, the shapes of the first and second electrodes 54 and 64 may have a triangle, a rectangle, a parallelogram, a pentagon, an irregular shape, or the like. In particular, when the shapes of the first and second electrodes 54 and 64 have a pentagonal shape or an irregular shape, the first and second sensor units 542 and 642 do not have a regular shape. Therefore, moiré phenomenon generated when the regular shape is repeated can be prevented.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A touch panel comprising:
   a base layer;
   a first electrode formed on a surface of the base layer, the first electrode including a first sensor unit, wherein the first sensor unit includes a first conductor; and
   a second electrode formed on another surface of the base layer, the second electrode including a second sensor unit, wherein the second sensor unit includes a second conductor;
   wherein a shape of the first conductor is different from a shape of the second conductor,
   wherein a resistance of the first sensor unit is greater than a resistance of the second sensor unit,
   wherein a first area ratio is greater than a second area ratio,
   wherein the first area ratio is a ratio of an area surrounded by an outer edge of the first sensor unit to an area on which the first sensor unit is formed, and
   wherein the second area ratio is a ratio of an area surrounded by an outer edge of the second sensor unit to an area on which the second sensor unit is formed,
   wherein a filling density of the first conductor in the first sensor unit is smaller than a filling density of the second conductor in the second sensor unit,
   wherein the first conductor includes a transparent conductive metal oxide, and the transparent conductive metal oxide includes a nano metal and has a plurality of spherical particles or a network structure.

2. The touch panel of claim 1, wherein the second conductor includes a transparent conductive metal oxide, and the transparent conductive metal oxide includes a nano metal and has a plurality of spherical particles or a network structure.

3. The touch panel of claim 1, wherein at least one of the first conductor or the second conductor has a width of 10 to 35 nm and a length of 20 to 40 μm.

4. The touch panel of claim 1, wherein at least one of the first conductor or the second conductor has a diameter of 100 to 300 nm.

5. The touch panel of claim 4, wherein as the diameter of the first conductor or the second conductor decreases, a contact area on which adjacent conductors among a plurality of conductors contact one another increases, and wherein the first conductor or the second conductor has the plurality of conductors.

6. The touch panel of claim 5, wherein as the contact area increases, electrical conductivity of the first electrode or the second electrode increases.

7. The touch panel of claim 5, wherein as the contact area increases, linewidth of the first electrode or the second electrode decreases.

8. The touch panel of claim 7, wherein as the linewidth of the first electrode or the linewidth of the second electrode decreases, a thickness of the base layer increases.

9. The touch panel of claim 1, wherein the first sensor unit is entirely formed inside the outer edge of the first sensor unit, and
   wherein the second sensor unit includes a plurality of electrode parts intersecting each other, and at least one opening is formed inside the outer edge of the second sensor unit.

10. The touch panel of claim 9, wherein an intersection between the plurality of electrode parts of the second sensor unit is 1 to 100,000 number/mm$^2$.

11. The touch panel of claim 1, wherein a thickness of the first sensor unit is 200 nm or less, and
    wherein a thickness of the second sensor unit is 0.5 to 2 μm.

12. The touch panel of claim 1, wherein a surface roughness of the first sensor unit is less than a surface roughness of the second sensor unit.

13. The touch panel of claim 1, wherein a specular reflectance of the first sensor unit is less than a specular reflectance of the second sensor unit.

14. The touch panel of claim 1, wherein a transmittance of the first sensor unit is 88 to 92%, and a transmittance of the second sensor unit is 87 to 91%.

15. The touch panel of claim 1, further comprising:

an overcoat layer covering the first electrode; and an insulating layer covering the second electrode, wherein a dielectric constant of the insulating layer is less than a dielectric constant of the overcoat layer.

16. The touch panel of claim 1, further comprising a plurality of traces connected to the first electrode and the second electrode, the plurality of traces providing a signal transmission path, wherein one of the first electrode or the second electrode and the plurality of traces are formed through a process, and wherein one of the first electrode or the second electrode includes a material same as a material of at least one of the plurality of traces.

17. The touch panel of claim 16, wherein the one of the first electrode or the second electrode formed through the process, is formed in a mesh shape.

18. The touch panel of claim 16, wherein the plurality of traces include a nano metal, and wherein the transparent conductive metal oxide includes a nano metal and includes a plurality of spherical particles or a network structure.

19. The touch panel of claim 18, wherein as a diameter of the spherical particle decreases, a contact area on which adjacent spherical particles contact one another increases.

20. The touch panel of claim 19, wherein as the contact area increases, a linewidth of the plurality of traces decreases.

21. A display device comprising:

a display panel; and a touch panel integrated with the display panel, wherein the touch panel includes:

a base film;

a first electrode formed on a surface of the base film, the first electrode including a first sensor unit, wherein the first sensor unit includes a first conductor; and a second electrode formed on another surface of the base film, the second electrode including a second sensor unit, wherein the second sensor unit includes a second conductor different from the first conductor, wherein at least one of the first sensor unit or the second sensor units unit has an irregular pattern, wherein a resistance of the first sensor unit is greater than a resistance of the second sensor unit, wherein a first area ratio is greater than a second area ratio, wherein the first area ratio is a ratio of an area surrounded by an outer edge of the first sensor unit to an area on which the first sensor is formed, and wherein the second area ratio is a ratio of an area surrounded by an outer edge of the second sensor unit to an area on which the second sensor is formed, wherein a filling density of the first conductor in the first sensor unit is smaller than a filling density of the second conductor in the second sensor unit, wherein the first conductor includes a transparent conductive metal oxide, and the transparent conductive metal oxide includes a nano metal and has a plurality of spherical particles or a network structure.

22. The display device of claim 21, wherein the touch panel is positioned in front of the display panel or inside the display panel.

23. The display device of claim 21, further comprising a plurality of traces connected to the first electrode and the second electrode, the plurality of traces providing a signal transmission path, wherein one of the first electrode or the second electrode and the plurality of traces are formed through a process.

* * * * *